(12) United States Patent
Miller

(10) Patent No.: US 11,954,355 B2
(45) Date of Patent: Apr. 9, 2024

(54) SYSTEM AND METHOD FOR BIDIRECTIONALLY BASED ELECTRICAL INFORMATION STORAGE, PROCESSING AND COMMUNICATION

(71) Applicant: Atlas Power Technologies Inc., Abbotsford (CA)

(72) Inventor: Mitchell Miller, Mission (CA)

(73) Assignee: Atlas Power Technologies Inc., Abbotsford (CA)

( * ) Notice: Subject to any disclaimer, the term of this patent is extended or adjusted under 35 U.S.C. 154(b) by 273 days.

(21) Appl. No.: 17/424,737

(22) PCT Filed: Jan. 17, 2020

(86) PCT No.: PCT/CA2020/050053
§ 371 (c)(1),
(2) Date: Jul. 21, 2021

(87) PCT Pub. No.: WO2020/150810
PCT Pub. Date: Jul. 30, 2020

(65) Prior Publication Data
US 2022/0075554 A1 Mar. 10, 2022

(30) Foreign Application Priority Data
Jan. 21, 2019 (CA) .................. CA 3030723

(51) Int. Cl.
*G06F 3/06* (2006.01)
*G11C 11/56* (2006.01)

(52) U.S. Cl.
CPC .......... *G06F 3/0655* (2013.01); *G06F 3/0604* (2013.01); *G06F 3/0679* (2013.01); *G11C 11/5642* (2013.01); *G11C 11/565* (2013.01)

(58) Field of Classification Search
CPC . G11C 11/5642; G11C 11/565; G06F 3/0655; G06F 3/0604; G06F 3/0679
(Continued)

(56) References Cited

U.S. PATENT DOCUMENTS 5,432,735 A 7/1995 Parks et al.
5,517,135 A * 5/1996 Young ............ H03K 19/018592
326/86
(Continued)

FOREIGN PATENT DOCUMENTS

JP H10-93040 4/1998
JP 2000-200492 7/2000

*Primary Examiner* — Ly D Pham
(74) *Attorney, Agent, or Firm* — Damien G. Loveland

(57) ABSTRACT

A system and method for bidirectionally based electrical information storage, processing and communication. Bidirectional memory (tristate) offers the capability to store and interpret multiple bits (Shannon's) of information per memory cell, for structures such as dynamic random-access memory (DRAM), and read-only memory (ROM), and communication circuits, for operation, rather than traditional memory able to store a single "bit" (Shannon) of information per cell. Where, instead of traditional memory cells capable of two possible states (binary digit) and a single defined bit (1 Shannon), bidirectional memory is capable of three states (tristate), where the third information representing state can be a specifically defined state capable of representing multiple bits (multiple Shannon's) for each individual cell, which may be defined to represent a specific sequence of bits (sequence of Shannon's). Additionally, the $3^{rd}$ information state of a tristate bidirectional memory cell may be expressed as in a state of constant variability (superposition), where the final determined state may be based on a probabilistic outcome, or probability controlled. The disclosed system and method allows for more complex systems for information storage, compression, processing, (Continued)

communication, and more secure encryption of stored or communicated information.

73 Claims, 11 Drawing Sheets

(58) Field of Classification Search
 USPC .......................................................... 365/149
 See application file for complete search history.

(56) References Cited

U.S. PATENT DOCUMENTS

| | | | |
|---|---|---|---|
| 5,610,855 A | | 3/1997 | Komuro |
| 5,844,424 A | * | 12/1998 | Krishnamurthy ............................ H03K 19/018585 326/86 |
| 5,859,794 A | | 1/1999 | Chan |
| 5,973,506 A | * | 10/1999 | Trimberger ........ H03K 19/1736 326/39 |
| 6,016,063 A | * | 1/2000 | Trimberger ........ H03K 19/1737 326/39 |
| 9,508,420 B1 | * | 11/2016 | Hunt-Schroeder ... G11C 11/419 |
| 2001/0052793 A1 | * | 12/2001 | Nakaya ............ H03K 19/17736 326/41 |
| 2010/0001818 A1 | * | 1/2010 | Hsieh ........................ H03J 3/20 334/78 |
| 2012/0032164 A1 | | 2/2012 | Ohnuki |
| 2012/0099367 A1 | * | 4/2012 | Azuma ................ G11C 13/003 365/148 |
| 2014/0098594 A1 | * | 4/2014 | Azuma ................ G11C 13/004 365/148 |
| 2017/0372781 A1 | * | 12/2017 | O'Toole ................ H10B 63/80 |
| 2018/0082733 A1 | | 3/2018 | Tanaka et al. |

* cited by examiner

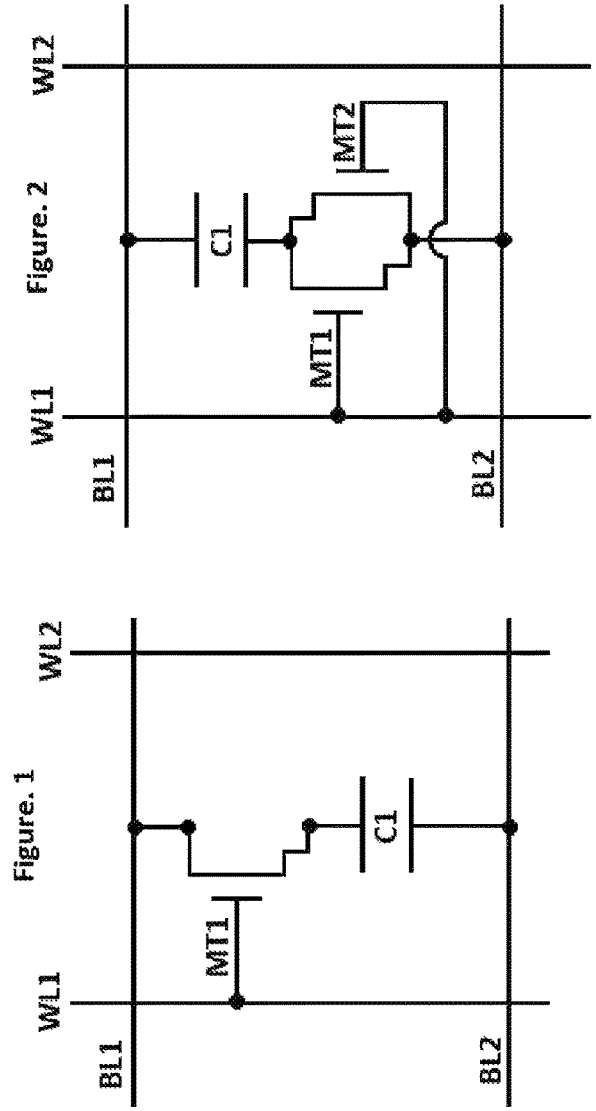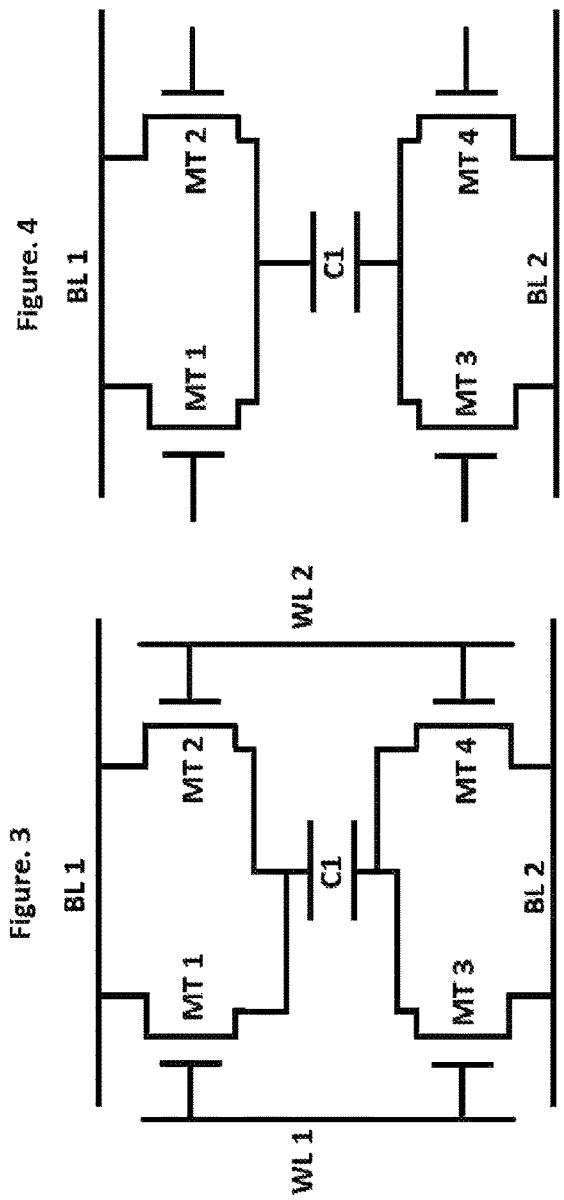

SYSTEM AND METHOD FOR BIDIRECTIONALLY BASED ELECTRICAL INFORMATION STORAGE, PROCESSING AND COMMUNICATION

TECHNICAL FIELD

The present disclosure is generally related to semiconductor memory storage, and more particularly, is related to dual polarity memory systems and methods for storing, retrieving, and processing tristate interpretable information.

BACKGROUND

The foundation for information processing, and modern computing, has been our ability to observe, store, and alter, information. In electronic systems, the systems that store this information are called memory. Memory refers to the ability of physical systems to generate electronic signals, principally analog, that may be routed, controlled, altered, and stored, to allow for later use, and recall. The general concept of memory, and the language of electronic computation, and communication is binary, meaning a language utilizing ones and zeros based on the charge state, and or switch position of a physical memory system.

Information is stored on physical systems, then processed from memory for use with additional systems. The design of our information processing systems is unidirectional, meaning current travels in a single linear path. This design includes the way in which we use and store information on physical memory systems, that being charging memory cells in a single forward bias, and or turning a switch on or off when operating in the binary framework. The premise of storing information is by utilizing transistors, and or transistor capacitors pairs, to store information in either a 1, signifying a charge or active state, or a 0, signifying a no charge or inactive state. This single state change is the foundation for most computer operations, and is referred to as bits of information, binary being the name of the language that creates a designable framework for computers to interpret specific bit patterns into words, statements, and logical functions, as well as operations and programs.

The success of this design, and operating language framework has allowed the massive adoption and success of computing, as well as information processing. This has led to continuous high dollar value investments, which has allowed for the continued advancement and complexity of these systems, resulting in the ability to fit more electronic components into smaller and smaller systems, reducing size, which has followed the widely accepted Moore's law.

There have existed competing methods of information processing, specifically ternary and quaternary, that never saw the commercial success of binary. Though these competing systems offered many benefits, the simple use and operation of binary allowed the massive adoption of this information processing framework and resulted in the competing technologies becoming lost to the history books, and obscurity.

SUMMARY

Technical Problem

The technical problem is the limitation imposed by the defined two-state bit position constraint, and single bit (Shannon) storage operation, for a single memory cell, and in turn a computer's computing abilities while operating traditional memory systems, specifically for this disclosure DRAM "dynamic random-access memory".

In order to operate a DRAMs structure as well as its functionality there is a standard "framework" that is required including: sense amplifiers, repeaters, logic for refreshing the contents of the DRAM, as well as bit-line and word-line selectors, block selectors and additional systems, some of which are included in the description to further describe the invention, while others have been omitted for simplicity.

Computation is based on traditional information processing and memory storage, a rigid framework of single bit information encoding, that resides in one of two value states i.e. $2N^{th}$ bits. The challenge presented, is due to the fact that information is stored within memory systems as one of two values, the first value being a 0 or off state, the second being a 1 signifying a charge present, and as an on state. This results that memory storage, and computation, is based on memory cells with a single bit (single Shannon) of actual information being stored per cell. This binary framework results in, when attempting to solve technical problems, for instance when exponentials are presented, a rapid growth of variables required for computation, and therefore memory storage spaces required to complete the operation. This exponential growth of required memory currently surpasses the abilities of our state-of-the-art memory systems, and processing capabilities. The compounding nature of exponentials causes our current technology, specifically our ability to compute these large sums, to very quickly reach our limitations, leaving many questions unanswerable, and operations unable to complete.

Additionally, the application of memory in physical systems has required that the information that is stored can only be expressed in one of two possible states, and where it must always be in one of these two states at any given time. That being either on or off, representing either a 0 or a 1, signifying one piece of retrievable information.

This is the constructed framework of our current memory systems, that lays out this mandatory information encoding requirement, meaning that in every memory system, one of these states must be active. That a single piece of the physical memory must at all times retain one of these two states of information, and at the same time can only hold this one piece of information. This includes even when the system is off (no power), and when no power is present the system would hold all states at 0, specifically with dynamic, or short-term memory.

The challenge with having to have one of these two states always representing one single piece of information is that it takes multiple single pieces (bits) of information to actually form a usable statement, and or meaningful and usable information. With the initial 8 bits (8 memory cells) forming a single character known as a "word". Being held to this single piece of information per bit 0/1 on/off, means that the ability to form complex variables requires large quantities of physical memory systems, each holding a single piece of information. This causes challenges when solving complex problems, when a determination is required that encompasses a sequence of numbers longer than what can be stored as bits on physical memory. Even though we can build systems with trillions of these bits, we still utilize a framework that makes many problems unsolvable.

Additionally, when investigating alternative information processing and memory systems, specifically ternary, the challenges associated with utilizing this information processing method have not been overcome, and as such have not led this processing framework to be able to form a viable commercial presence to date. To understand ternary computation, it is important to understand that this type of information processing is an entirely separate method of interpreting and storing information.

Ternary is a language based on a base multiplication and factorial of 3, 3 Nm bits. Meaning as opposed to binary where information is stored in one of two states (0, 1), ternary is stored in one of three states, which may additionally be represented in a few different methods. For instance, one method is unbalanced, and the three states are represented as (1, 2, 3) which may also be (0, 1, 2). The next method is balanced, and the three states are represented as (1, 0, −1) or (10, 00,01) which may also be seen as only polarity symbols (+, 0, −). Though a working and operable computer was developed by the Soviet Union in 1958 called "Setun", the commercial sales of the system where discontinued and information specifically related to its construction and operation are not readily available and may remain classified.

Setun was a ternary based computer that utilized a rotating drum for memory storage, this drum could be operated in a similar manner to the disclosed system and method, that being bidirectional based memory charging. The operation of the device was more limited, due to the operation and physical size of the drum, used as the dynamical random-access memory, but did allow the storage of more information for each memory cell. This bidirectional memory design demonstrated at the time that construction of computers based on the Setun design was cheaper than the binary construction design, and additionally more robust. This design allowed for the information instruction, and operating language known as ternary, or the ternary operator.

It is unclear as the reason that ternary was not adopted, and binary became the predominant operating language. My belief is that at the time the basic simplicity of binary allowed a much larger percentage of developers to learn and understand binary's basic premise, and operation. This resulted in a fundamental clash of operating system language, design, and construction parameters, between binary and ternary computers both for software as well as hardware. And because generally simpler systems, that more people understand, will cause a more rapid growth and advancement of the system and technology, binary being easier to understand caused developers to gravitate to its use and development. As such the obvious winner has been the binary system, and the Setun and resulting ternary operator system has fallen, and become information stored in the history books.

There are benefits and drawbacks when using ternary as an information processing framework, one is the exponential growth of different possible information state arrangements, due to three possible information states per memory cell. This three-state system allows a larger amount of combinations of these three states, more combinations of symbols, for the same amount of memory cells that a binary system uses. Conversely you can also represent the same amount of combinations that 8 memory cells in a binary architecture (2 states per cell), in as little as six memory cells with a ternary representation (3 states per cell). The basis for binary is the 256 possible arrangements of 0's and 1's for each 8 memory cells, where each different arrangement specifies a specific character called a "word", where the first 256 arrangements can be viewed as a legend with the standard being the ASCII Table.

Ternary on the other hand utilizes three pieces of information "states" as referenced above for interpretation and allows in the first 6 memory cells a total of 729 different configurations, or different patterns, or $3N^{th}$ bits. And since the patterns include an additional character the two languages are fundamentally different, they can be translated like two different dialects, but the individual patterns are not universally interchangeable. The Setun for instance utilized a magnetic drum with different polarizations to accomplish storing and retrieving each of these three states from memory. The challenge with trying to incorporate the ternary framework to benefit binary systems is that these are two separate languages for information interpreting, and processing systems, and as such they are structurally different.

The only way to communicate the information from one framework to the other is by converting "translating" the information back and forth i.e. from binary to ternary and then from ternary to binary as one scheme attempted to do referenced in U.S. Pat. No. 5,432,735.

The main misunderstanding with regards to the ternary system is that more information is stored per physical memory information cell, called a trit. This is not in practice how this system works, a single memory cell only holds a single piece of information, one bit (one Shannon). Where the system gains its advantage is by using the combinations of the three possible information states, this allows a legend of all of the same binary words represented in six memory cells instead of eight. In order to benefit from the ternary framework, you must utilize the ternary character legend for information processing.

The disadvantage this presents is that the information processing of these two systems are fundamentally different, where you can interpret back and forth between the two "languages" for lack of a better analogy, but they are fundamentally non-integratable, without utilizing the ternary language framework, and hardware operational systems, you do not gain the benefit of $3N^{th}$ bits of information. This is because both existing traditional binary, and ternary, memory cells only store a single piece "bit" (Shannon) of information, though representing either two information states in binary, or three information states in ternary.

Solution to Technical Problem

The solution to the technical problem is utilizing a bidirectional based memory system, that may be additionally constructed and interconnected 3-dimensionally. This allows for a wider range of computation based on a more flexible information processing framework, and in-turn store more that a single piece "bit" of information per component "cell" of a memory system. Bidirectional memory offers the capability to store more information per cell, and per component, rather than two possible states, and a single bit of information per physical memory cell. This benefit is additionally realizable in the binary framework and language when not assuming it must exclusively bound to a ternary computer, or ternary language framework.

There are multiple benefits to the disclosed system and method, and these include; the ability within a binary and or ternary framework to store more information per physical memory system. The ability to set a distinct meaning for each additional information statement. The ability to access multiple pieces of information per system (cell). The ability to allow each piece of memory to be expressed as a state of constant variability (superposition). The ability to form more complex systems for information storage, compression, and processing. The ability when solving computational problems to eliminate more possible outcomes for each piece of information attained from a single memory system (cell), or plurality.

The ability to store more information per memory system (cell) is a major improvement over traditional system. When holding this larger quantity of information, you can utilize a greatly reduced amount of physical memory to preform computations and store information, including for the operation of computer systems, and information processors, when compared to traditional memory systems.

SUMMARY OF THE INVENTION

The actions of computers are built from electrical signals, which work to form information stored as bits/bytes, as these bits and bytes are expanded, they form sequences that can be used to form statements, problems, and preform actions. The binary framework and language builds upon the ability of memory to store a single bit of information in one of two possible states, a zero or a one.

But though this language has been applied to act based on single bits of stored information it can also be applied to vast groupings of these systems, and in connection with the speed of processing, that may operate in the gigahertz, allows complex operations to be preformed. This is by executing statements sequentially, resulting from the ability to assemble, and compute, many otherwise simple tasks, in high speed succession to allow for more complex mathematical operations.

When utilizing the binary language for information processing a basic character statement "word" can be developed from one byte of information. One byte is a grouping of eight bits, and since each bit has to be maintained in a zero, or one state allows for the possibility of 256 different zero/one combinations. This is accomplished through the exponential growth of possible combinations for each bit added to a memory system, i.e. bit 1 with 2 possible values, bit 2 with 2 possible values, bit 1 multiplied by bit 2 equals 4 possible values. If you add a $3^{rd}$ bit, then you multiply your first 2 bits possible values, giving you your 4 possible values, multiplied by two more possible sequential values ($3^{rd}$ bit) to get a total of 8 possible values. This exponential growth continues, so that with eight sequential bits you have attained 256 possible value combinations.

The challenge with this framework is that even though you have an exponential growth of possible values, the information stored per memory cell is still only a single bit of information. It would be unmanageable to continue utilizing this exponential growth of possible pattern configurations, the additional bit adding to a memory cell sequence twice the amount of possible patterns could theoretically continue until all possible representations describing "words" are exhausted. This would make using this system erroneously complex and therefore practically unusable. Instead the benefit of the exponential growth of pattern configurations is only used in the first 8 bits to form 256 different characters "words" (regionally this may vary generally up to a maximum of 12 bits) to form a legend. These individual words are then placed sequentially to form actual readable and interpretable words, statements, tasks, and so on, this design requires long sequences of memory to form statements, for instance to say "exponential" in binary would require 11 bytes and 88 bits of information as shown "01100101 01111000 01110000 01101111 01101110 01100101 01101110 01110100 01101001 01100001 01101100". Though there does exist many complex factorial frameworks (information trees) to allow clever compression and a reduction in memory, this operation and storage is the general premise, and for this disclosure will suffice.

This framework is the largest drawback for information processing and computing, and where a problem has an exponential growth, and or exceeds the amount of physical memory addresses (cells) available in the system, renders the problem unsolvable. This exponential growth problem is one of the main problems that has led to the excitement and investment in quantum computers because of their unique abilities. Quantum computers have been designed to operate on a different memory framework than traditional computers, where in quantum computers information is stored as a qubit instead of being called a bit. Generally, quantum computers involve utilizing the spin of an element, for instance the spin of an electron. In some of these computers they utilize a cooling chamber to cool down the element to near absolute zero, causing an almost suspended, very inactive state of usually conductive elements, generally attempting to attain superconductivity. Then by assuming that the elements natural elemental spin is a spin down, representing a 0, then if a magnetic field is applied, where energy is used to cause an alternation of spin to spin up, representing a 1, you can begin the process of utilizing these devices to store information, and for mathematical computation. The advantage sought by the developers of quantum computers is to be able to utilize the spin states between spin up, and spin down, to preform computation. The multitude of different spin states between spin up, and spin down, allows the interpretation that the qubit could be in either, or any possible variation, of the states simultaneously, this is referred to as superposition, this definition is then interpreted to represent that there only exists a probability ratio of the current spin state, until measured.

This superposition concept is a great achievement in computer processing, it allows a duality of states, and an exponential growth in possible values. And though it allows the interpretation of any number of spins, i.e. $2*2N^{th}$ bits, I would argue that in information processing it is actually only representative of three possible states, a trit, being 0-1 or 1/0, meaning that the computational growth, of quantum computing, is a compounding exponential of three possible information states $3N^{th}$ bits.

In addition to superposition, quantum computers can utilize a process, and therefor property of qubits, to cause a phenomenon called entanglement. Entanglement is the process of co-synching (synchronizing) the exact spins of qubits. This synchronization allows the separation and observation that two entangled qubits to share the same state, and therefore hold the same information, and is a novel characteristic. This question of receiving an actual benefit is particularly relevant due to the logistical, and operational, challenges in maintaining a qubits entangled spin, and the transferring of this information is still governed by the speed of light limitation, where it could be argued the information is known, though not observed, before the entangled qubits are separated.

Additionally, another limitation of the operation of quantum computers is the operational noise, an apparent design flaw caused by the actual operation of these devices, attributed to the different operational systems, and the spin of the qubit. Wherein it has been proposed that limitations to the quantity of qubits will be inherent due to a growth in operational noise, and therefore limit the size and ability of these devices.

The explanation of quantum computers, referenced within this disclosure, is to provide insight, and context, to a few of the benefits of the disclosed system and method. The use of bidirectionally operable memory allows for some similar attributes to that of quantum computers, including additional operational abilities over traditional computing systems that will be discussed. To explain the operational similarities between quantum computers and bidirectional memory we must first begin with their similarities of operation, when in context of the traditional bit and binary computer language, and information processing framework.

Bidirectional memory, as the name describes is memory that can operate bidirectionally, meaning that the physical system, analog memory cell, allows the current flow, and stored charge operation, to be accomplished in either the forward/positive bias, or the reverse/negative bias. This ability to alternate the charging bias, is accomplished with a system of components to allow a change in the direction of current traveling through a storage device. One embodiment of a single un-interconnected memory cell being 1 transistor and 1 capacitor, wherein leads of the transistors are connected to each of the leads of the capacitor, and by activating the transistor and by changing the voltage states on opposing sides of the capacitor determines the current flow through the capacitor.

Capacitors store a charge in the form of an electrostatic field, and though many capacitors are designed to be polarized this feature is not a requirement. Additionally, due to the extremely low voltages of typical memory systems the likelihood of damage or failure even when charging a polarized capacitor inversely is relatively low, and may be designed to reduce this risk further, though non-polarized capacitors are preferred.

Due to this property of capacitors, able to be charged in either a forward bias, reverse bias, or maintain no charge, allows this memory cell to contain more information than in a traditional framework, a ternary, or trit, of 3 pieces of information, and or states, $3N^{th}$ bits. Traditional information storage as previously discussed, allows a single memory cell to be in one of two possible states, and hold a single piece (a bit) of information $2N^{th}$ bits. Quantum computers allow a memory cell (qubit) to operate one of three possible states while still holding only a single bit of information $3N^{th}$ qubits. Though one embodiment of the disclosed system and method could be utilized in a quantum computer and framework, without going into the debate of whether the superposition state is representative of a single or infinite amount of states. Bidirectional memory also has 3 identified possible states, but due to the framework of its operation it can store and have retrievable information greater than a single bit of information per physical memory cell.

Information processing is built upon this concept, and ability to differentiate uniquely identifiable states, that can be used to assign values and symbols, and therefore allow logical computation to occur. In memory systems this has traditionally been a simple on-off state of a memory cell, representing a 1/0, this information is then retrieved and stored by additional systems within the device.

If we choose to look at how information is processed within the binary framework, we will see that there exists two interpretations, and roles, the binary framework preforms within a computational architecture. These roles are separate, though their operations appear to encompass the same overall binary framework. This provides a level of camouflage making it more difficult to separate these roles into clearly separate, abstract operational concepts. The roles I am speaking of are informational processing, and mathematical computational operations, one being word-based information processing, and the other being mathematical computation. Though these may seem to be the same types of operations within the overall activities of a device they are actually very separate actions, even though one operation can cause an action required by the other. For instance, language operations are used to instruct mathematical computation, and the results of the computation can be displayed in understandable language.

This may seem confusing, and counter intuitive, especially considering in order to use text each character or "word" must be constructed of 0's & 1's. The reality though is that text is just a specific pattern of zero's and one's in the binary framework, it is simply a picture formed by eight digits.

When you instruct a computer to preform a mathematical computation say "add 2 and 2" the computer relays the information briefly into memory, which for this operation may just be the cache. Then instructs the arithmetic logic unit to preform the function and store the information back in memory and display the results "answer=4". Though this operation seems like a single seamless operation the process is actually broken up into many individual actions, and though the text initiates the operation and gives task and instructions, the text does not preform the actual mathematical operation. Instead it is translated into the binary number structure, and then parts of the binary structure preform the function, for instance incrementing the binary digits.

To provide a clear distinction and understanding of the separate roles that language, and mathematics, play within a computer it is important to understand that language is only the interpretation instrument we use to communicate with computers, and the mathematical operations are preformed based on binary calculations. The binary language is in turn, a representation of both mathematics and symbolism used for language-based interpretation. This dual role is the same operational system the computer uses internally, which is based on the simple process of on/off, charged or not charged analog memory cells. Where each cell's information is represented as a 0 or 1 based on this analog signal and is therefore only an interpretation. The operation, in essence, is just a complicated scratch board, and how we decide to display and interpret these analog signals, as visual and processable information is at our discretion.

This flexibility is why ternary has multiple options and structures for interpreting the 3 states ($3N^{th}$ bits) of each analog memory cell, based on three analog states, positive polarity, negative polarity, and no charge.

If, as in the disclosed system and method, we choose to exploit this property of altering the way in which we visualize and recognize the analog signals we receive, and store, within our memory structures, we can manipulate this information to be used in new innovative ways.

For instance, in the disclosed system and method I am introducing a bidirectional dynamic random-access memory cell structure, this allows charging the cell in positive polarity, negative polarity, or have no charge present. This type of memory has been traditionally called ternary, and therefore without converting between ternary and binary, it did not present benefits within the binary framework, and as a result has not been exploited within the binary language, and framework. The reason for this is that because ternary and binary are separate languages, they interpret the analog signals into different graphical symbols and representations, as well as there is different internal hardware required for operation.

The disclosed system and method allows an additional separately identifiable signal, a negative polarity signal, to be used within the binary framework, as well as in some embodiments utilized within the ternary framework.

This is accomplished by choosing the representative symbol(s) we choose this additional analog signal to represent.

Then integrating the additional hardware required to move the information into and out of each memory cell, so that the CPU "central processing unit" and subsystems can interpret, differentiate, and process this different information state.

An additional benefit of the disclosed system and method is that even though we can modify the way the information is moved in and out of memory, this does not require the conversion, interpretation, or understanding of the ternary language, or framework, by either the computer or the user.

This is accomplished by selecting what the negative analog signal in a binary framework is called, and what it represents. For simplicity, I have created a term for the signal which I have called it "knot 1" with the symbol "↥".

The reason for this additional symbol, and name, is to allow a clear understanding, and differentiation, of how the symbol is understood, and operates, within the binary framework. This was to clearly, and visually depart its operation from common misunderstandings, interpretations, as well as a relation to the ternary language and framework, which may have proved onerous and ongoing if ternary symbolism was used, for instance, the negative sign (–), or negative 1(–1).

Within the binary framework the ↥ symbol is designed to indicate the negative charge on a capacitor, for differentiation between memory storage states. The information that this symbol represents is up to the user, and allows customization based on specific preferences. For instance, for computation the knot 1 symbol could represent both a 0 & 1 when stored on a physical memory cell. Which as discussed earlier in the disclosure, could be manipulated it such a was as to display either a 0 or 1 or a 0/1 combination when recalled from memory, based on the specific control hardware installed, and specified by the user or manufacturer. This could be greatly beneficial for larger computations for instance with the use of superposition, such as in quantum computers, where the state of memory could represent both the 1 & 0 at the same time. This would give the added benefit of being able to modify the outcome of the final displayed result of 1 or 0, based on the percentage likelihood of the specific result being chosen. This could be controlled by changing the voltage trigger point on a comparator, where the more likely state is chosen, to allow the result to more accurately reflect the most likely predicted outcome and is clearly described in the following figure descriptions.

Additionally, the knot ↥ symbol could also represent any potential combination of 0's and 1's, the design of the integrated computer hardware grows in complexity as the quantity (amount of information) of digits the knot ↥ symbol represents.

The process to store, and then read, from memory could be accomplished in a variety of ways, for instance, the most beneficial combination for maximizing the amount of information each memory cell stores is a factor of both the most likely characters that are used, as well as the amount of information (bits) that each cell can contain and then retrieve, thereby reducing the amount of physical memory cells needed to contain the information, i.e. store "words" in memory.

For instance, the preferred representation, though not limiting the scope of additional representations and embodiments, of the knot ↥ symbol is "011" the reason for this selection is that "011" appears numerus times throughout the alphabet in the binary standard ASC II, and specifically in the lower-case portion. As lower-case letters are the highest used section of the alphabet when constructing readable words, in the binary legend for computer interaction and communication. The choice to select 3 digits to be represented by knot ↥ is because of two reasons, one is by using 1 memory cell to contain three actual bits of information you eliminate the need for two other individual memory cells. The second is that this pattern allows the contraction of information into storage to occupy the least amount of physical memory cells. It was chosen over more likely representations of (((01, 10, 00, 11)), 000,101, 110, 111), 0001, 0010, 0100, 0110, 0111, 1000, 1001, 1010, 1011, 1100, 1101, 1110, 1111, and so on) for this ability to contract the size of information stored on, and within physical memory cells, though any of these possibilities or various other may be used alternatively and are referenced herein as possible embodiments.

Where the knot ↥ symbol represents "011", it is stored as a negative polarization on the capacitor costing 1 memory cell, but when read from memory, through for instance a window comparator and multiple gates, could use these hardware systems to inject this stored information into a register or another short-term memory system as separate bits of 0, 1, and 1.

The hardware could be designed as for instance as a universal gate where the specific action resulting from reading a negative polarization causes a propagation of the numbers 1–1–0 (from right to left), in the register, by using inverting and non-inverting gates. The construction of the physical systems of the computer in this embodiment must be designed to output these specific bits each time a negative voltage is read. With the proper hardware design individual customization such as this could allow a choice between a multitude of combinations for the representation of the knot "↥" symbol. Additionally, the fundamental backbone of information processing and communication is the ability to communicate and then store information. Being able to communication the information contained as this third information state allows a wide range of applications for lossless compression, transmission, and communication, that is underpinned by the ability to physically store the information in a separate uniquely definable state once received.

Additionally, another embodiment may digitally manipulate the information that the knot ↥ symbol represents, for instance, like virtual memory where the physical address of memory does not necessarily correspond to the virtual address thereby maximizing the potential of the memory resource. This same operation could allow for the representation of the knot ↥ symbol to change throughout multiple different sections of memory storage during writing and reading operations.

This digital "ledger" could be designed to maximize memory contraction, the reduction in required memory space, due to the largest amount of specific bit combinations within each section of code and or information, to be assigned as the information stored on the capacitor, as the negative analog voltage, which is stored, and interpreted as the knot ↥ symbol.

Another embodiment could allow for the knot ↥ to represent a specific, large, and or small block, of binary digits, where the block is represented in a sequence as the knot ↥ symbol, but the actual information is stored in physical memory, able to be referenced, and triggered, when the knot ↥ is read. This may allow for a large reduction in memory space required for a specific code due to the fact that the knot ↥ symbol could take the place of the block of binary digits any number of times throughout the entire code. This could operate similar to virtual memory, where a ledger contains the information recalled with a virtual memory query, where a bit combination ledger could contain a specific number of commonly used bits, or words, or statements, where when the knot ↥ symbol is detected the information stored on the ledger is recalled and executed into the computation. This may be greatly beneficial to reduce the physical amount of memory systems require today for instance for cloud infrastructure, and server banks used by companies such as Google and Drop Box. Where being able to further compress their stored information directly results in savings through reducing hardware requirements as well as operational energy and physical space.

An additional embodiment could be designed as a program able to execute information into memory once received that allowed for multiple layers of compression following a specific sequence for decoding. For instance, a program could execute a code that specified that every time a negative charge was observed the "knot ƚ symbol", to write into memory an additional set of characters, for instance 0, 1, 1, which may include another knot ƚ symbol, written into memory as 0, 1, 1, ƚ. The program could be instructed to run the entire code sequence identifying each knot ƚ symbol and writing into memory the previously described sequence. Then when finished the entire code, which in some embodiments may only be sections of the code, start the process all over again, where each time the knot ƚ symbol was identified to write into memory the same or a different sequence of binary digits. This could allow exponential compression of information, where a program could run in the background similar to DRAM refresh circuits, basically writing into memory and expanding the code run cycle after run cycle, that could be a singular or plurality of decompressing run cycles, where specific values of the knot t symbol could be determined for each run cycle or, for the amount of loops. Where the decoding in some embodiments may require that the sender provider the receiver with the program, instructions, and or a key for defining and interpreting the knot ƚ symbol, which may be used for digital decoding or physically decoding memory cells through logic circuits and gate arrays.

Additionally, communication and information transferring could utilize the disclosed system and method by reducing the amount of sequences data being transmitted requires. For example, tristate data being transmitted can compress the underlying binary coding of information in three separately identifiable states, where as mentioned above the third state signified by the negative polarization on a bidirectional memory cell. This could be greatly beneficial in that reducing transmission size and duration relieves congestion and frees up bandwidth reducing the costs for internet, telephone, television and other communication network providers and operators. This embodiment could be implemented in a straight forward manner with existing infrastructure, for instance a non-limiting example of a "modem" otherwise known as a modulator-demodulator. Where currently the predominant methods of communicating information in physical systems include traditional conduction lines, for instance widely used "twisted pair" copper lines, and additionally more recent fiberoptic cabling. With respect to introducing a third information character in communication this could be accomplished within the existing framework of frequency modulation, where we currently decode messages based on their amplitude and frequency, over a given time period. The additional of an additional higher frequency state, or conversely in some communication protocol a higher amplitude state, within this same given time period would allow for a clear separation of the three states, that could be utilized immediately through decoding, or stored directly into bidirectional memory cells for later decoding, where this same principle applies to wireless communication "Wi-Fi". With respect to fiber optics a number of methods for defining this third information state are possible including but not limited to light intensity, frequency, color, shift, or phase just being a few notable examples.

In hardware systems many devices may be used to transfer information to and from memory allowing a reversable system to store multiple bits of information represented as the knot ƚ symbol.

For instance, a large majority of information stored today is stored on hard drives which are rotating mechanical discs that store information based on the magnetization of a magnetizable material on the disc's surface are contained within the disc. The information is written to the disk individual sections on what are known as tracts, that orient around the disc generally as rings. In order to store information on the disc a current is passed through the magnetizable material that orients the domains of the magnetizable material to align parallel to the current flow, generally signifying ON state, or 1, or additionally perpendicular to the current flow signifying an OFF state, or 0. More recent advancements for disk drive storage density by the discovery of giant magnetoresistance and tunnelling magnetoresistance have allowed a vastly larger amount of storage data for physical size of these devices. In essence disk drives utilize the magnetizable properties of these devices to pass an electric current through the drive to manipulate the magnetic fields of a magnetizable material. As described earlier the "Setun" used a rotating mechanical drum to store information, where they stored information in three states. The drums that the "Setun" used are the foundation for disk drives, meaning that disk drives have the same ability to store information by orienting the domains of a magnetizable material to allow both positive polarity and negative polarity, or no charge present states of magnetization. As this ability to store information as three states on these drives has been demonstrated, by means of the original rotating drum, it should be noted that one embodiment of the device may utilizes disk drives, or solid-state drives, as the storage medium to facilitate the beneficial operation of the disclosed system and method. Additionally, these properties of giant magnetoresistance and tunnelling magnetoresistance maybe utilized within a tri-state bidirectional magnetizable storage medium to further aid in the detection and then analysis of the current state of the magnetization. For instance, as a non-limiting example by measuring the electrical resistance for current travelling either direction through the domains of the magnetizable material, and or measuring the displacement current caused within a conductor dependent upon the polarity, the northern or southern direction of the magnetization, which could be thought of as a magnet with dual poles. In some embodiments that utilize this displacement current for polarization detection a simple scheme of rectification, for instance with rectifying diodes or materials would allow for the analysis of current direction and therefore allow a simple integration into the disclose system and methods logic circuitry for operation.

For instance, a latch (sense amplifier) may be used to retrieve the state of each memory cell and set the latch (holding the state), wherein the latch reinforces either a flowing current or a non-flowing current, or negative polarity current. This latch may then be accessed by a register, or gate, to further allow the retrieval, and processing of this memory into the computational processing hardware of the device, for instance the logarithmic logic unit within the CPU (central processing unit), the control unit, and may be briefly stored in the CPU's cache.

The construction of a CPU allows processing based on an identified number of bits of information, for instance a 64-bit processor can accept and operate instructions that are 64 sequential bits, 8 octets in size. This size of computational information string, in conjunction with their speed of operation allows the ability to process large amounts of information, though generally a number of the processor's bits are assigned to preform separate actions, for instance for memory addresses that are not used for direct information processing per se, and are used instead to access specific bits of information that undergo a computation.

The speed of operation of a computer is dictated by a devices clock speed (internal clock) and usable processing bits, the clock is used to move onto the next instruction, action, sequence, during processing. The clock generates a physical set/reset current, which instructs the CPU to preform an action for the current information, for instance applying an incremental add operation which may utilize an adder or half adder circuit, and then initiate the next step in the instruction and or sequence. Clocking offers the ability to process information very quickly, for instance a gigahertz is a frequency of 1,000,000,000 alternations a second.

This processing design, sequential sequence processing, allows the current 64-bit processors (64-bits) 24 different values, and access $2^{64}$ exabytes of byte-addressable memory. This vast computational power results in the fact that our current memory storage systems cannot actually store quantities of informational large enough to fully exploit our processing capabilities. With the two most common representations of our processing capabilities based on a 64-bit processor being the range of 0 through 18,446,744,073,709, 551,615 ($2^{64}-1$) for representation as an unsigned binary number, and −9,223,372,036,854,775,808 through 9,223, 372,036,854,775,807 ($2^{63}-1$) for representation of a two's complement, where this is generally interpreted for memory address allocation.

The ability to more fully exploit our processing ability is one of the improvements the disclosed system and method addresses. With the ability to store more information per memory cell (bit), the exponential growth of possible variations of memory information that is able to be stored and recalled allows the processing capabilities of a system to be more fully exploited, as stated above a processor design of 64-bit allows a range on memory information growth from 0 through 18,446,744.073,709,551,615 ($2^{64}-1$), wherein a traditional terabyte of ram is represented by $2^{40}$ or 1,099, 511,627,776 bytes, −8,796,093,022,208 bits. The disclosed system and method of bidirectional memory with a similar quantity of components can be expressed as $3^{40}$ or 12,157, 665,459,056,928,801 bits, classically referred to as trits, when only considering memory storing information as trits with $3N^{th}$ bits of possible states.

This representation of information as trits versus bits is the main reason for the confusion regarding operation and understanding of the ternary operation and language, which make the ternary and binary frameworks incapable of combinational operation, other than conversion back and forth. Simply they are different processing languages, they use different symbolism to communicate the same information, and use slightly different hardware to preform computation.

Though as described previously, the disclosed bidirectional memory is able to store a trit of information, and or multiple bits, but this does not result in the limitation of being forced to utilize either the ternary operator language, or the design of a ternary computer, which is another benefit of the disclosed system and method.

The design of the bidirectional memory allows integration into existing binary designed frameworks wherein the "binary digit" meaning may be ignored, and the information stored as the knot k symbol, which may also be ignored (not used during some operations). Allowing all previous software and hardware designs, if operated correctly, to be fully functional without having to redesign their operation (backwards compatible).

This is a major benefit of the disclosed system and method as this means that all of the development and investment made in binary over the last 100 years can be utilized, and for the vast majority of programs and systems does not required redesign or redevelopment. Additionally, the operation of the disclosed system and method allows additional operational benefits that can be built on top of the existing binary framework.

For instance, the charge polarization of the bidirectional memory can be accomplished a number of ways which will be discussed. The preferred embodiment is by utilizing a comparable traditional address framework of DRAM (dynamic random-access memory), where the construction design may in some embodiments alter from the traditional DRAM layout, but the operation is very similar, and the main iteration is that in order to access a single memory cell, 2 bit lines and 1 word line must be activated for a single address, versus the traditional 1 bit line and 1 word line and 1 ground connection line per address. It should be noted that during operation on of the said two-bit lines of bidirectional memory may serve as the ground or lower potential, the obvious difference being the bit line that serves as ground may alternate between either bit line depending on charge polarization bias.

In some embodiments of the disclosed system and method you can utilize a plurality of latches (sense amplifiers), buffer spaces, and or gates, to READ and interpret information from a bidirectional memory cell. Meaning if two latches (sense amplifiers) READ a paged memory cell to determine if a charge is present, as demonstrated in a non-limiting way in the attached figures, and if there does exist a charge, then determining the polarization. The information can be read, managed, interpreted, as if the information originated from a single memory cell, or a plurality of memory cells.

Additionally, in an interconnected structure it is possible to store, and retrieve information from a plurality of sequential memory cells with a single action. Where dependent upon a variety of factors, including the design structure, memory cells could influence the information state of subsequent memory cells, during WRITE and READ operations, which is another benefit of the disclosed system and method.

This framework of the bidirectional memory creates an interconnected system of transistors and capacitors. Due to the ability to create complex electrical paths, for current to travel between transistors, allows the benefit to write multiple capacitors with the same information from a single action. This multi-writing ability may be greatly beneficial for information processing as you would be able to store large amounts of information, that may be stored in complex patters, for later retrieval, as well as increase computational speed.

Another benefit of the disclosed system and method is by understanding that you can set the additional $3^{rd}$ state of bidirectional memory as any information value, and or variable. This additional information storage position can communicate more information than just a single binary piece of information as discussed earlier, with a relatively straight forward operation you can cause the processing of information to recognize this $3^{rd}$ memory position (the reverse bias charge, or knot one knot ⌁ symbol) as a specifically definable information variable. This in many computations can allow for information processing in vastly less memory sequences. This ability to set a definable information statement, for every memory cell, allows the customization of information processing, allowing a relatively simple conversion, generally through constructing code (software systems) and or hardware systems (gates and sense amplifiers), that allows users to individually tailor their own processing needs, improving computational ability, processing speed, and operational characteristics of their devices.

Additionally, this ability to specifically assign the additional memory position to specific meanings will allow the customization of entire operating systems and programs, in that by assigning a specific meaning to these memory positions you can design the information computing process to operate customized to each specific information parameter that is required. For instance, this information state could be used to set specific information categories, and subsequent bit information could provide item information within the assigned category without the need for long instruction code for each step within the operation, which could be very advantageous for devices preforming specific regular instructions, which additionally could be modified at any point by changing the interpretation of the $3^{rd}$ information state.

This can be explained further assuming architecture rooted on binary sequencing. This allows the ability of the system to communicate with all existing architecture and created software, but also allows for a greater degree of computation, in that for each system you have now been able to formulate and communicate a sequence, and not just a single piece of information. This sequencing allows the ability to amplify accessible information through configurations.

By designing and constructing specific sequential gates and or switches, you can transfer information from a binary framework, comprising a plurality of bits, into a single bit definable as the knot one symbol "⌁", for instance utilizing AND, NAND, OR, NOR, EX-OR, EX-NOR, NOT gates, and transistors. Wherein based on the information communicated from a plurality of binary bits, in a specific sequence, a single bidirectional memory cell may store and hold this information for later access and use. Where information stored as a negative charge on a memory cell represents the said specific sequence, of the plurality of binary bits. The method for distinguishing and retrieving a specific sequence of binary bits stored as the negative charge, in a memory cell, is discussed in greater detail with reference to the figures and accompanying reference disclosures.

In one embodiment the framework of this $3^{rd}$ information state could be recognised and used as a constant variable, where in order to form and allow for complex computation, including exponentials, it can account for this by changing the state of a single or multiple memory system to reflect being a constant variable, or reside in a superposition state. The constant variable phrase being another way of describing and conceptualizing superposition, where the negative bias charge could represent any variable, allowing a recorded variable within the information and or instruction set itself, which could for instance represent a 1 and 0 simultaneously, within a well-known memory system offering a stable operation able to hold said charge for extended durations of time.

This operation could also be used, and would be incredibly valuable, when the value of computational information grows to a level outside of the physical abilities of the system. This would allow the system the ability to access more space presented by this "free" memory, meaning it could move the equation further down its sequencing, processing to account for the additional information by storing a section, block sequence, that may be factorized, of information as a variable that could in essence be forgotten by the system, allowing the system to solve the remaining/growing sequence. Then reformulate the information stored as constant variables and assign true values to solve the equation, in essence creating a floating set point. Where a constant variable in this operation cold be considered in a state of superposition, as referenced in the section discussing quantum computing, that being either a 1 or 0, or a 1 and 0, or any assigned or constrained value.

This operation can be expanded to allow a plurality of constant variables memory cells, that can sit in what could best be described as floating set points, low energy states, or multi-computational paths, to allow the system to process and solve through a section of the sequence, essentially breaking apart the sequence to solvable sections, and or multiple paths simultaneously. Once a logical conclusion is met with all determined sections, the "broken sequence" memory is reassigned to a logical sequence and recombined with constant variable memory cells to fully solve the equation. Though in certain circumstances a state of memory that is a permanent constant variable is possible and probable, depending on the length of computation.

To use superposition effectively you can use the probability of an outcome to help determine the result of a read function. That being by adjusting the resistors within a comparator(s) to move the window for a regular read output into the area of the negative voltage, or into the voltage range of the desired/more probable outcome, which may in additional embodiments utilize a digital potentiometer for controlling resistances of different components of the device.

For instance, the memory stores the information in a superposition state, which is the negative voltage state of the memory cell, representing both a 0 & 1 simultaneously, stored into memory as the knot ⌁ symbol. This information can then stay at this point while computation occurs, when enough information is gathered to determine the most probable state of this superimposed memory address, a window comparators resistors can be changed (resistances modified) to move/widen the specific voltage range, by moving the input voltage trigger point, based on the input voltage, and compared against a voltage reference, to initiate the output, based on the most likely prediction. Wherein by changing the point in which the comparator initiates a flip/flop action you can control the output state read from memory, therefore you gain the ability to influence the information read from a superimposed memory cell.

This allows results that reflect, and are more accurately based upon, the likelihood of the cell actually being in a specific 1 or 0 information state. This allows the result of computation to more accurately reflect the probability of its result, because information is based on the more likely state, as a percentage of its actual likelihood of being in that state, for each superimposed bit, and not as a result of a equal percentage and or random result or selection, such as is the case with many quantum gates based on an equal likelihood of being in either state.

Changing the resistance value, characteristics of comparator(s) can be accomplished a number of different ways. For instance, you may utilize transistors to operate as the resistors within the comparator and by modifying the voltage applied to the base/gate, with the use of certain transistors, you can control the output characteristics, therefor controlling the voltage divider within the comparator. Additionally, you could create a resistance array with transistor-resistor combinations and by activating a set number of transistors that control the current through different value resistors, you therefore could change the resistances across the voltage divider, where in many cases the resistor array could operate with as little as 2 different resistor-transistor sets. This in many embodiments is enough to pull the trigger point up or down, and therefore move the comparator into or out of an inverting output state, which is then communicated for computations.

Additionally, the additional states of each memory cell could be used to identify, and or be identified as an exponent, and or factor, and or integer, and or polynomial. This would then allow for the limitation on physical memory processing to be eliminated, basically allowing a continuous flexing (expansion and contraction) of the sequence, for instance when a sequence is divisible and by utilizing a constant variable as a polynomial such as X, where X could be any number true to the divided state would allow for a substantial contraction in the size of the information sequence when the sequence is divisible by x.

BRIEF DESCRIPTION OF DRAWINGS

The invention will be described by reference to the detailed description of the preferred embodiment and to the drawings thereof in which:

FIG. 1 is a diagram showing a single cell of a preferred circuit configuration for the improved bidirectional DRAM (dynamic random-access memory).

FIG. 2 is a diagram showing a single cell of an alternate circuit configuration for the improved bidirectional DRAM (dynamic random-access memory).

FIG. 3 is a diagram showing a single cell of an alternate circuit configuration for the improved bidirectional DRAM (dynamic random-access memory).

FIG. 4 is a diagram showing a single cell of an alternate circuit configuration for the improved bidirectional DRAM (dynamic random-access memory).

DETAILED DESCRIPTION

Figure 5:
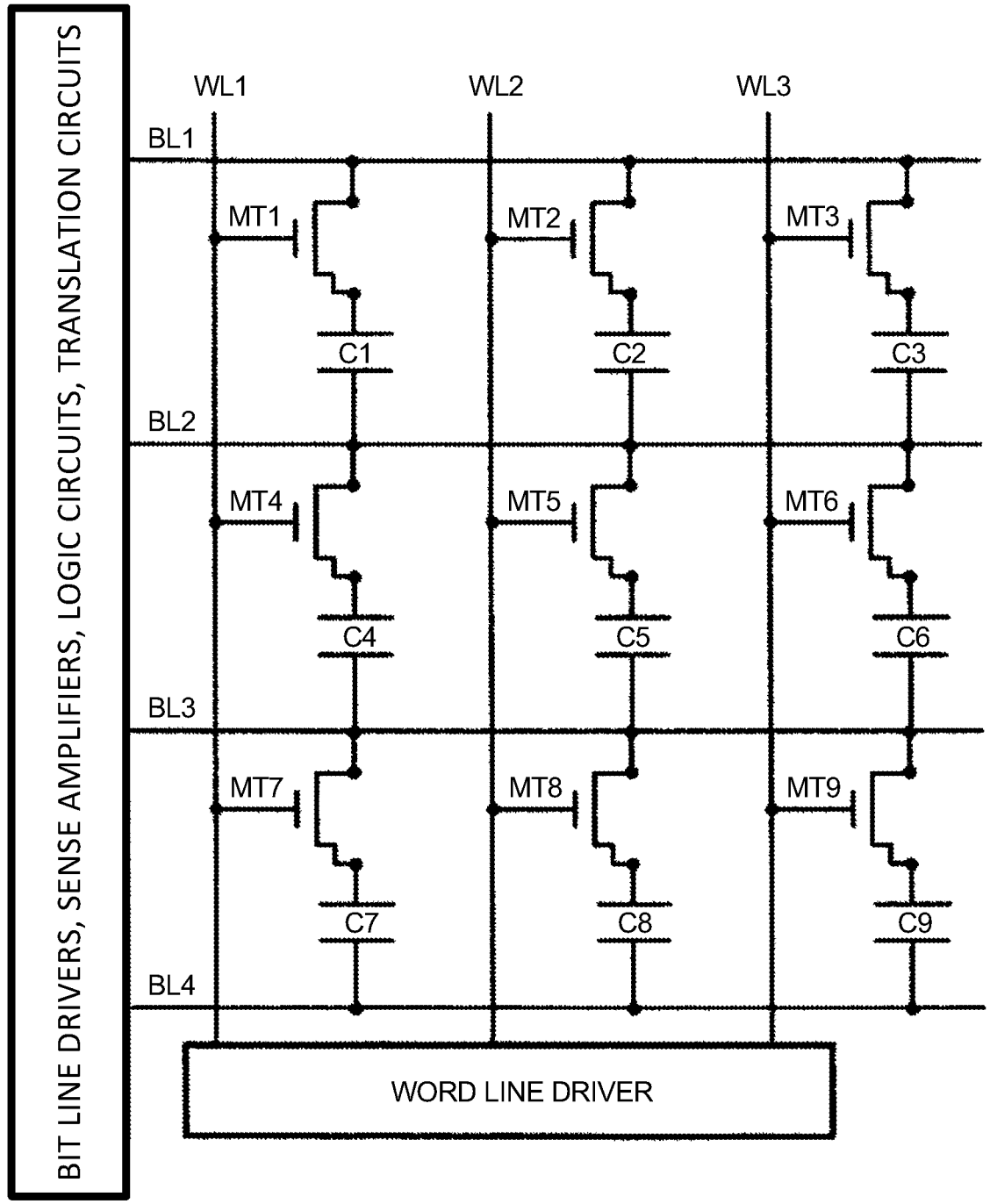
FIG. 5 is a diagram showing multiple bidirectional interconnected memory cells which may be considered a functional block diagram and is the preferred circuit configuration.

FIG. 1 is a diagram showing a single cell of a preferred circuit configuration for the improved bidirectional DRAM (dynamic random-access memory). The operation of the memory cell requires initially charging a capacitor C1 to store information, this is accomplished through a similar operation to traditional DRAM memory cells (not shown). The charging operation of the capacitor C1 can be accomplished in one of two polarizations, positive or negative, with the use of a memory transistor MT1, bit lines 1 and 2 BL1, BL2. Where bit lines 1 and 2 BL1, BL2 individual voltage states are dependent upon the desired charging bias of C1, and with use of word line 1 WL1, and with the adjacent pluralities of bidirectional memory cells (not shown) utilizing additional word lines for example word line 2 WL2.

The operation of the preferred embodiment allows for a similar framework to existing DRAM and SRAM (static random-access memory) memory systems, though with a differentiated circuit topology. Specifically, operational and circuit layout similarities include, as a general non-limiting comparison to circuits and their operation, organizational address layouts, bit line driver(s) general operational principles and capabilities, word line driver(s) operation, sense amplifier(s) (latches) general operation, the general interconnection with subsequent systems and processors, for example the central processing unit CPU. This includes similarities to individual cell address identification layout styles, charging (WRITING), READING (paging) and then maintaining regular recharging called REFRESHING in order to ensure and maintain the stored information, with the addition of an additional bit line BL2 for operation when compared to traditional DRAM. The additional bit line BL2 is utilized to allow the alternation of voltage potentials between bit lines BL1, BL2, in a bidirectional memory system, and reverse bias charging (WRITE operations) of capacitor C1. Wherein instead of a ground line (not shown) in traditional DRAM memory cells, a negative polarization may be applied to the capacitor C1 by charging bit line 2 BL2 with a higher voltage potential then bit line 1, where bit line 1 serves as the lower voltage potential or ground allowing charging current to flow through the capacitor C1 in a reverse bias. This reverse bias may also be used for subsequent REFRESH operations, and may additionally be used for READ operations, though bit line 2 BL2 may not be required for some additional embodiments for READ operations.

The operation of the bidirectional memory in FIG. 1 is the preferred embodiment of a single cell and organizational implementation utilizing a single transistor MT1, and FIG. 2 is an exemplary embodiment utilizing two transistors MT1, MT2 both with similar operation. The operation in this embodiment is carried out by first connecting bit line 1 BL1 to a positive voltage supply, and bit line 2 BL2 to a negative or lower voltage supply or state. Then by turning on transistor MT1 by turning on word line 1 WL1 as shown in FIG. 1, or by turning on transistors MT1/MT2 by turning on word line 1 WL1, as shown in FIG. 2, you can charge the capacitor C1 in a forward positive bias. Or by alternating the positive voltage supply to bit line 2 BL2 and the negative or lower voltage supply to bit line 1 BL1 you can charge the capacitor C1 in a reverse or negative bias. Operation may also include a no charge state by either not charging the capacitor C1 or removing the charge through a WRITE action with no charge present, or reverse/inverse charge present on bit lines 1 and or 2 BL1/BL2.

There are multiple different methods, and separate embodiments, for reading the information stored on the capacitor C1, some non-limiting examples will be discussed, and in greater detail in further figure descriptions.

The design of the bidirectional memory in this embodiment is also beneficial in that when designing larger arrays (discussed in greater detail in subsequent figures), the circuit design allows for simple straight forward design architecture. This is accomplished because the READ and WRITE operations are operated by alternating bit line 1 BL1 as the positive voltage supply, and bit line 2 BL2 as the negative or lower potential voltage, where additional embodiments may regularly alternate the bit line configuration and or polarization. This allows, through activating a single word line WL1, the WRITE operation of the capacitor C1 in either a forward positive polarity or reverse negative polarity. This allows a very straight forward operation with the main change to typical DRAM being the required additional bit line BL2, as well as memory address designations taking into consideration the additional reverse charging ability of each capacitor C1 and therefore additional address designation. By ensuring that address designations take into account the secondary charge state, a memory array (not shown) can be operated to exploit the benefits of bidirectional memory, which will be discussed in greater depth and detail in subsequent figures.

Additionally, multiple transistors may be used to perform the operation of bidirectional memory, a few nonlimiting examples are referenced herein FIG. 3 and FIG. 4. Where in FIG. 3 and FIG. 4, the use of four transistors MT1, MT2, MT3, MT4, as well as FIG. 3 the use of two-bit lines bit line 1 BL1 bit line 2 BL2, as well as word line 1 WL1 and word line 2 WL2. Where in FIG. 3 by utilizing either word line 1 WL2 or word line 2 WL2, you can alternate the charging of capacitor C1 where bit line 1 BL1 can remain as the positive, or higher voltage potential, and bit line 2 BL2 may remain as the lower voltage potential or ground, and where the alternation of bit line 1 BL1 and bit line 2's BL2 voltage potential in this embodiment may not be required. Though in some embodiment's dependent upon the design and size of a memory array, alternation of the voltage potentials between bit line 1 BL1 and bit line 2 BL2 may be beneficial and are therefore referenced herein.

Additionally, in FIG. 4 transistors MT1, MT2, MT3, MT4, may be driven directly from a drive directory, ledger, virtual memory system, or central processing unit, memory management unit, and or additional drive system. And where bit line 1 BL1 and bit line 2 BL2 maybe utilized to operate, and or to alternate, their polarizations during WRITE, READ, and or REFRESH operations.

In traditional DRAM memory configurations (not shown) the capacitor (not shown) has been used entirely as an information storage medium, through charge accumulation and storage. The energy stored on the said capacitor, controlled by a switch (not shown), has not be available to be utilized throughout the device, nor used to power systems in addition to its primary purpose of information storage. This said capacitor is also an energy storage asset, and in the disclosed system and method may operate as a duality for information and energy storage.

Additionally, the process of charging and refreshing DRAM is incredibly wasteful. Operated as a typical RC circuit where the voltage supplied to the memory is regulated and reduced in order to reduce losses. This charging process itself wastes 50% of the supplied energy, and the other 50% is used only for information storage, then generally discharged to ground and not utilized further. Due to the nature of information processing, and the need for high speed information storage and refreshing, alternate more efficient systems for charging the said capacitor such as switch-mode power supplies are not practical. The integration of this type of charging system would not be practical because the charging time required for improving the storage efficiency of the said capacitor would interfere with the high-speed operation of storing information on the said capacitor memory system, and therefore slow down the operation of the device(s).

This has led to the design and operation of these type of memory systems to focus on efficiency through lowering operational voltage, as well as making the capacitance, storage ability of the capacitor, low in order not to waste energy while charging, and while refreshing.

Depending on the particular application the operation can be controlled by the management system (not shown) to control charging the storage device(s), bidirectional memory cell(s) C1 in the circuit for predictable, or specific actions, and or to specific charge states/voltage(s). This may include multiple combinations of said capacitors C1 simultaneously, or sequentially in real time. This may include user interactions in live time, and or predetermined states.

In some embodiments as referenced herein a consistent continuous operation controlled directly from the management system (not shown) could provide the instruction for READ and or WRITE operations for the storage device(s) C1, to precisely meet the operational requirements and information states designated and may included a predetermined voltage range for a specific application, for instance memory writing and subsequent refreshing.

Additionally, this operation and configuration may be used in some embodiments to operate pluralities of bidirectional memory cells (capacitors) C1, and or bidirectional memory array(s). Wherein for instance one embodiment could utilize the management system (not shown) in an electronic device such as a smart phone, computer, tablet, wearables, servers, converters, inverters, computers, processors, electronic devices, that may consist of billions of individual or interconnected bidirectional memory cells.

The operation of a computational devices requires large amounts of memory in order to compute actions and functions of the device. By utilizing this system and method memory charging and discharging can be accomplished while simultaneously being utilized as an energy source, in addition to information storage, thereby reducing the energy cost while in operation. In this embodiment a management system (not shown) could be used to control a high plurality of bidirectional memory cells capacitor(s) C1, and charging systems (not shown) or "deflection converters" (not shown) that operate independently or conjunctly, wherein frequency, capacity, voltage operational range, current, and additional determinants may significantly vary between each system, which could utilize different points in time of a singular, or plurality of capacitor(s) C1 multiple bidirectional memory cells during operation.

In the case of electronics such as smart phones utilizing the disclosed system and method a significant reduction of power consumption, and memory component sizing can be gained, this includes a larger amount of information storage and improved computing ability. This is because capacitors C1 (memory cells) and additional applications of capacitors are use extensively throughout the device, for instance large memory arrays and numerous other operations and systems. Many of these systems utilize very inefficient RC (resistor-capacitor) circuits, where the disclosed system and method could greatly reduce wasted energy in these devices, and due to the additional information storage properties of bidirectional memory cells, a greater amount of information may be stored, and or the size of memory arrays may be reduced thereby reducing cost.

The system and method may utilize a plurality of memory cells, which may include an extremely high number of pluralities. For instance, in the case of a memory bank, a device may contain billions of transistors MT1 as an example, controlling billions of capacitors C1 as an example, for operations including charging, discharging, writing, reading and or refreshing commands, executable across numerous systems. In many embodiments of the disclosed system and method this inclusion of charging systems, such as deflection conversion, would be greatly beneficial and are referenced as possible embodiments.

FIGS. 3 and 4 are diagrams of embodiments of the device, bidirectional memory, utilized for electronic memory systems. These diagrams and designs of the device is to allow for a bidirectional charging, refreshing, retrieving, and information processing.

These circuit designs allow for the selection of four separate transistors for combinations in this example non-limiting examples MT1, MT3 which for this operation are WRITING (charging) the capacitor C1 in a positive bias, this bias includes for charging, refreshing, and or retrieving the information from the capacitor C1. This bias is because bit line 1 BL1 in this embodiment is connected to a positive voltage supply and bit line 2 BL2 is connected to a negative voltage supply, for this non-limiting example.

When selecting transistors MT2, MT4 which for a charging operation, a WRITE operation, are thus in a negative bias, for charging, refreshing, and or retrieving the information from the capacitor C1. This bias is because in this reverse orientation bit line 1 BL1 is connected to a negative voltage supply and bit line 2 BL2 is connected to a positive voltage supply and or voltage differential, used in this non-limiting example. Which could in additional embodiments utilize different combinational arrangements of these components, and or bit lines polarizations, to charge the capacitor C1, and or operate inversely to the described operational arrangement example. This may additionally include and or require bit lines 1 and 2 BL1, BL2 to regularly change orientation, and or operate as READ lines, that may also include the pre-charging of the bit lines BL1, BL2 before and or during a READ operation.

The device in any of the disclosed figures may be connected and controlled by any number of management systems (not shown) and techniques and may include a system controller(s) (not shown) and or microcontroller (not shown) and or central processing unit "CPU" (not shown). The device may be controlled manually, automatically, by a computer code or script, embedded system, or artificial intelligence, controlling commands of the device, connected to the circuit, and may use a plurality and multitude of different switching devices and or transistors in additional to or from MT1, MT2, MT3, MT4, and may include an interface(s), current and polarity control devices, and may comprise different switching device and or capacitor C1/electrostatic storage device arrangements. Wherein one preferred embodiment is in an improved dynamic random-access memory (DRAM) configuration, configured to allow the integration and beneficial operation of the device into computers, information processors, and electric devices. The circuit may utilize power available from a singular circuit or operate on a separate isolated power source(s) (not shown).

The input and output of each electrostatic storage device C1 and may be connected to separate output switches MT1, MT2, MT3, MT4 or a single switch, and or relay(s) (not shown) or not, and or transistor(s) MT1, MT2, MT3, MT4 or not, and may include multiple relay poles which could be any number of different types or styles for electronically controlled switching and or current control device(s), with all or some switches controlled by a CPU (not shown) or paired with an existing CPU (not shown), in a non-limiting example of an embedded, and or plug in system, and or slave system, device and or circuit.

The CPU (not shown) may be controlled by a management system (not shown), computer code or script, embedded system, or artificial intelligence, that tells the system controller (not shown), to send a signal to relay's (not shown) and or transistors MT1, MT2, MT3, MT4, and or switches, which may be connected to a power control device and or management system (not shown).

The device may be connected to a power converter circuit, and or system (not shown), charge booster/converter, and or multiplier and or buck converter, and or flyback converter, and or resonance converter, and or switch mode power supply, and or control circuit, which may or may not provide current to a load (not shown), and or another storage device (not shown) to create usable work, instead of directly grounding which is the typical operation of DRAM memory circuits.

In an additional embodiment the current after the converter (not shown) is looped back into the circuit, to create a feed back circuit and system, which may be connected after the converter circuit (not shown), and which may be connected into the power supply side of the storage device C1 that is gaining a charge, and may be converted to a higher voltage state to ensure current draw. The capacitor C1 may be connected in either a positive polarity, and or negative polarity configuration, this may also include additional pluralities of storage devices C1, power converters, and or inverters or both (not shown), and or current control devices (not shown).

In some embodiments a positive feedback into the positive power line before the capacitor C1 being charged, and is an exemplified embodiment, which may require a converter, where the voltage state of the converter (not shown) at, and or above, the power line voltage to ensure a continuous current draw.

Additionally some embodiments the device may utilize a management system (not shown) as a component of the device, which may control various functions, some of which may consist of one or more of the following non-limiting examples; the operation of all or some of the electronically operated components, the charging and or connecting and or disconnecting of individual or combinational arrangements of an electrostatic storage device(s) C1, with transistors MT1, MT2, MT3, MT4. This may include storage device contact, contact point(s), and or connection, power regulation means for regulating power; a memory section, a search starting means for starting a search; measurement data acquiring means, for acquiring magnetic field data and or electric power data, the magnetic field data being measured values of the energy sources and or magnetic field, and or capacitor/electrostatic storage device C1 data, and or bidirectional memory cell data, including but limited to; current charge state, polarization, bias, voltage level, address, location, orientation, refresh sequence and or rate.

The electric power data representing information associated with electric power that is outputted from the energy source, and or on or after the electrostatic storage device C1, and or storage device(s) C1 memory cells, structures, and or lattices. The power converter(s) (not shown) required operation, used by a management system (not shown), and or used to store energy on the electrostatic storage device C1, and or different circuit power lines, and or sources.

Functions may also include deriving means for deriving a relational equation that holds between the magnetic field data and electric power data to maintain target values including voltage and current output, and or bidirectional memory storage device C1 voltage potential state, and or feedback voltage state. Monitoring functions for abnormal state determining and may include means for determining whether or not an energy source, a storage device C1, or any switching device(s) MT1, MT2, MT3, MT4, energy transforming and or converting (not shown), and or managed circuits are in an abnormal state.

Searching functions, and a search procedure, selecting means for selecting, and in accordance with a result of determination. An abnormal state determining means, a procedure for managing abnormal energy source(s), magnetic field(s), accumulation devise(s), capacitor(s) and or bidirectional memory cell(s) C1 and or storage device(s), switching devise(s) MT1, MT2, MT3, MT4, management circuit(s), converter(s) and or inverter(s) (not shown).

In some embodiments, a management system (not shown) is needed to facilitate managing an electric current, then switching one or a combination of transistors MT1, MT2, MT3, MT4, and an electrostatic storage device and or bidirectional memory cell(s) C1 into a current stream, and or connecting power. Then storing the collected charges in an electrostatic storage device and or bidirectional memory cell(s) C1, while simultaneously converting and regulating output power, and or feeding the current back into the power supply, to flow into the electrostatic storage device and or bidirectional memory cell(s) C1, then switching collection device(s) C1 in circuit orientation, changing its current task and or operational state, and or disconnecting it from the circuit, with a switch, and or switches MT1, MT2, MT3, MT4. Then the storage device and or bidirectional memory cell(s) C1 may and or may not discharge collected charges, which may be a full, or partial discharge, it may additionally operate as a typical DRAM memory cell wherein operation requires periodic refreshing, wherein the information is stored and made available to the processor.

A current and or voltage measuring/holding devise(s) (not shown) may be used as part of the circuit, including non-limiting examples of operational amplifiers, comparators, latches (sense amplifiers), buffers, registers, decoders, coders, cash memory and or memory bus, switches MT1, MT2, MT3, MT4, accumulators and or electrical storage device(s), and or including the preferred capacitors and or bidirectional memory cell(s) C1. Some embodiments may utilize circuit controllers (not shown) for instance a non-limiting example utilizing pulse width modulation "PWM". In some embodiments a simplified management system (not shown) may be beneficial. In some embodiments utilizing no management system instead using current oscillators an or timers (not shown), clock(ing), comparators (not shown), op amps (not shown), decade counter (not shown), to control the switch (ing) of transistors MT1, MT2, MT3, MT4, and capacitor C1.

A management system (not shown) is preferred in the majority of embodiments to ensure optimal system performance, accuracy, bidirectional memory operation, and efficiency. In order for information to be communicated and interpreted for command allocation, memory address designation, storage, recall (paging) and information processing, including operational characteristics, and predetermined target value ranges. This also includes output characteristics, discharge relational information including combinational arrangement output power data, cluster and module combination data, looping circuit and or feedback value, and duty cycle optimization equations.

The management system (not shown) may also incorporate a learning effect, or artificial intelligence, interpretations can be interpreted by the central processing unit CPU (not shown), which can send instructions to the system controller (not shown), which can then send command signals to active switching transistors MT1, MT2, MT3, MT4, and control systems, and components, to control predetermined, or instructed operational target values of storage device(s) and or bidirectional memory cell(s) C1, recharging/refreshing characteristics, output characteristics, feedback characteristics, converter duty cycle/switching frequency, memory selection and or operation, word line selection and or operation, bit line selection and or operation circuit selection and or operation, system operations including various subsystems, and device(s) functions.

FIG. 5 is a diagram showing multiple bidirectional interconnected memory cells which may be considered a functional block diagram, where the circuits and components may be considered blocks of a system, for their general function, or for a device that may be used to confer the action of their specific block, as such blocks may be omitted, combined, or substituted within an operable configuration of the device to facilitate the operation within the intended scope of the disclosure, where diagram 5 is configured as the preferred circuit arrangement and embodiment. In this embodiment the use of multiple bidirectional interconnected memory cells allows the operation of capacitors C1, C2, C3, C4, C5, C6, C7, C8, C9 utilizing transistors MT1, MT2, MT3, MT4, MT5, MT6, MT7, MT8, MT9, creating an interconnected matrix, additionally operable with word lines WL1, WL2, WL3, and bit lines BL1, BL2, BL3, BL4.

In this non-limiting preferred example, the layout of the circuit is designed as a memory DRAM address schematic, operated as a plurality of interconnected memory cells, though operated independently, in an interconnected framework. This allows the operational characteristics to be precisely tailored to meet the requirements specific to each independent system. This is especially beneficial where voltages may operate at different potentials, meaning that the required operational voltage may vary, or be at a different state(s) then each separate independent system and or memory array. For instance, the bidirectional DRAM may operate at 2 volts when charging individual memory cells, and additionally for charging multiple memory cells, and or capacitors C1, C2, C3, C4, C5, C6, C7, C8, C9 simultaneously. When charging bidirectional memory cells in a series arrangement may require increasing this operational charging (WRITING) voltage, to for instance 6 volts if charging any three of said capacitors simultaneously, so each of said capacitors retains a 2-volt charge, where certain embodiments may require balancing circuitry when charging multiple capacitors and/or bidirectional memory cells simultaneously.

This operation of being able to charge multiple capacitors, for instance groupings of any of the capacitors C1, C2, C3, C4, C5, C6, C7, C8, C9 in a single operation, with the use of different transistor combinations selected from MT1, MT2, MT3, MT4, MT5, MT6, MT7, MT8, MT9, or plurality, in this embodiment by turning on any specific combination of said transistors is very beneficial, in that by utilizing this operation the speed of processing may be increased due to the fact multiple WRITE operations can be accomplished with a single WRITE operation, reducing refresh time allocation and therefore latency.

For instance, during the regular operation of a device the processor may allow for the processing of 7 bytes of information, utilizing a 64-bit processor, with 1 byte of reserved for command allocation. This means that 56 bits can be processed per cycle, though operated at a very high clock frequency for instance in the gigahertz, with current clock speed being limited at around 5 GHz. In this operation the physical memory may be used and combined with virtual memory to more fully exploit the memory system, so for the purpose of this operation the CPU doesn't necessarily recognize multiple physical addresses, instead it recognizes a single physical memory address(es) or plurality, though this may consist of any plurality of bidirectional memory cells in series.

This layer of obscurity allows, with the use of disclosed system and method of bidirectional memory, the ability to exploit virtual memory (as a non-limiting example) to encode multiple interconnected memory cells simultaneously. Where in the example of a processor processing 56 bits, for processing and specifying multiple addresses, and then WRITING or READING individual cells. Wherein if virtual addresses were designed to reflect any combination of the multiple interconnected capacitors C1, C2, C3, C4, C5, C6, C7, C8, C9, and or any plurality in a memory array, by specifying specific transistors from MT1, MT2, MT3, MT4, MT5, MT6, MT7, MT8, MT9, or any plurality in a memory array, to allow this in series charging configuration and adequate voltage was supplied, you could charge a group of capacitors C1, C2, C3, C4, C5, C6, C7, C8, C9 or plurality with a single write and or refresh action. Where this group of capacitors could later be accessed individually for READ operations, therefore preforming more actions over a defined period of time and speed up processing, which could additionally be exploited during allocated refresh operations.

This could be used in additional embodiments to increase the transfer and dissemination of information, where for instance information is shared between to computers (not shown). The first computer (not shown) provides an information set that includes a memory WRITING program. This program includes instructions to WRITE into memory the desired information utilizing in series sequential capacitors C1, C2, C3, C4, C5, C6, C7, C8, C9 or plurality, charging in the bidirectional memory framework, allowing the information to be stored into memory at expedited rates. Then as the processor READS the information from physical and or virtual addresses, it is unaware that multiple bits had been WRITTEN simultaneously to memory by means of an interconnected architecture. This operation could be used to WRITE a few sequential capacitors C1, C2, C3, C4, C5, C6, C7, C8, C9, or multiple plurality, with a single two transistor arrangement MT1, MT2, MT3, MT4, MT5, MT6, MT7, MT8, MT9 or plurality, utilizing in series and or cross coupled addresses.

The application and operation of many independently operating, interconnected bidirectional memory systems, and circuits, within a device(s) referenced as an exemplified 3-dimensional construction configuration, and or planar stacked construction which is the preferred embodiment of this disclosure. This method of integration and operation allows bidirectional memory technology to be utilized by many of the systems and operating circuits electronic devices contain. The ability to offer improved information storage to a device and by not negatively impacting the devices operation, is practically implementable, and very beneficial. Additionally, connected to word lines WL1, WL2, WL3 is a word line driver and/or driver circuit including line and column selectors, block selectors. And connected to bit lines BL1, BL2, BL3, BL4, includes different circuits including bit line driver's that allow the alternation of bit line polarities and voltage potentials, sense amplifiers, differentiators, logic circuits, translation circuits, definable translation circuits, constrained translation circuits, subsequent combinational definable translation circuits, and general processor and computer circuitry including line and column selectors, block selectors, buffers, memory cash, and central processing unit "CPU", where an embodiment of bidirectional memory includes an array of bidirectional memory cells that may be Write accessed to store data and Read accessed to retrieve the stored data.

For operation of a bidirectional memory array a bidirectional cell is selected during either a READ operation, or a WRITE operation, by selecting its bank, row, and column. The bank, row, and column that are chosen are determined by a binary code. For a non-limiting example, an address may comprise a 16-bit binary code for controlling the WRITE and READ operations. More particularly, the 16-bit binary may comprise two separate 8-bit binary codes one for selecting the row and the other for the column, which may further be coupled to a row decoder and a column decoder and host bus. In response to each 8-bit code, the row decoder may generate 2 outputs, which allows up to 256 different address patterns. As well, the column decoder may generate another 2 outputs, which allows a combined matrix of selectable memory cells from 256 rows and 256 columns.

Bidirectional memory cell addresses may be defined or assigned through a number of possible schemes, one possible nonlimiting example, that maintains the structure and consistency existing DRAM memory structures, is by sequentially identifying the memory cells both for the positive and negative charge state's as adjacent, and or individual addresses, and/or a sequential memory cell address identification scheme and configuration. Another nonlimiting example may include designating the memory cells within their traditional address framework, where identifying the negative charge on a bidirectional memory cell is designated as an inverse or negative address (−), therefore allowing exact address specification with existing addressed designation frameworks, and referencing the cell polarity by means of a polarity symbol which is the preferred embodiment of address designation as this may allow a simple straight forward operation to utilize a row and column decoder, while maintaining existing code addressable architectures. Though many possible address schemes are possible and do not depart from the scope and intention of the disclosed method are referenced and therefore claimed as possible characters and or features of embodiments herein.

This circuit lays out the basic design of a memory system and or array consisting of nine interconnected cells, which may additionally be constructed 3-dimensionally or in some embodiments a planar construction with each interconnected array comprising one or part of a plane, and additionally interconnected arrays being stacked, or layered sequentially, and with each array comprising any number of interconnected cells with any plurality of layers or stacks or arrays.

Additionally as with previous prior art schemes for DRAM the operation of reading the bidirectional memory cell is destructive and during a READ operation the capacitor may, and generally will, require a recharging operation, for simplicity this circuit arrangement has been omitted from the figures, with the reference that this operation in the disclosed system and method is accomplished with two bit lines, a non-limiting example being, bit line 1 BL1 and bit line 2 BL2, where polarization of each bit line BL1, BL2 is dependent upon the bias of the capacitor C1 recharging operation, as well as a word line a nonlimiting example being word line 1 WL1, activating a transistor and capacitor for instance a non-limiting example of transistor MT1 and capacitor C1.

Figure 6:
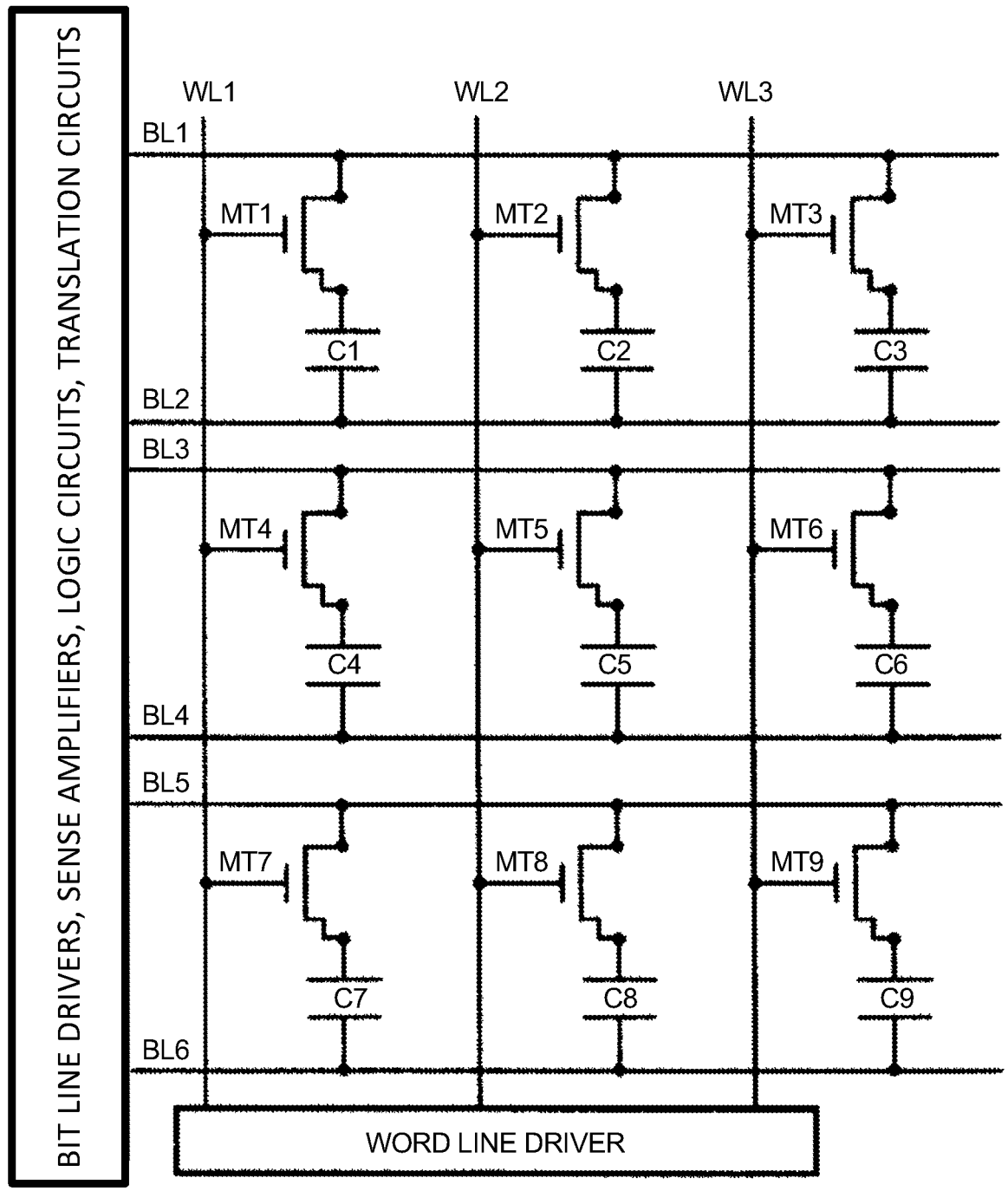
FIG. 6 is a diagram 6 is an embodiment of the device utilizing separate additional bit lines for bidirectional memory cells.

FIG. 6 is an embodiment of the device utilizing separate additional bit lines BL1, BL2, BL3, BL4, BL5, BL6, for bidirectional memory cells. Separate bit lines may be very beneficial in certain embodiments where parasitic capacitances may interfere with the operation of multiple bidirectional memory cells (capacitors) C1, C2, C3, C4, C5, C6, C7, C8, C9, or plurality, operating in parallel or sequentially wherein the use of separate bit lines between cells allows independence of the memory array's individual cells. Where for instance multiple processors are accessing memory cell information simultaneously, and where utilizing joint lines as referenced in FIG. 5 conflicts may occur, for instance utilizing combinations of transistors MT1, MT2, MT3, MT4, MT5, MT6, MT7, MT8, MT9, or plurality, for charging memory cells with inverse polarizations along the same bit lines, where this may cause the inability to operate specific verticals or horizontal memory rows or columns simultaneously, depending on the physical memory address accessed with word lines WL1, WL2, WL3. Therefore, in certain embodiments the segregation of individual bidirectional memory cells by incorporating additional bit lines BL4, BL5, BL6, or plurality, may be preferred.

It should also be noted that many embodiments may utilize a drive directory or directory, and may exist as virtual directories, meaning the specific directory is a ledger, and not a physical separate circuit, or system. This could be very advantageous for ease of use and operation if the ledger operates comparably to a virtual memory system, in that information is recorded, and stored, for later reference and use, thereby allowing a program to allocate physical storage, referenced from and recorded into a ledger(s), this reference to the operation of a virtual directory is included as an example and not meant to limit the scope of possible memory management operations, and virtual directories where embodiments and descriptions are for some of a number of possible implementations, operational systems and embodiments.

As well additional embodiments could also include complex READ and WRITE address designs, operating multiple transistors, that control multiple charging operations throughout an individual, or multiple arrays. This may be very beneficial to encode information at expedited rates, for instance writing multiple capacitors across multiple bidirectional memory cells simultaneously, thereby preforming a WRITE operation that would normally take many individual sequences, in a single, or reduced amount of WRITE operations.

Figure 7:
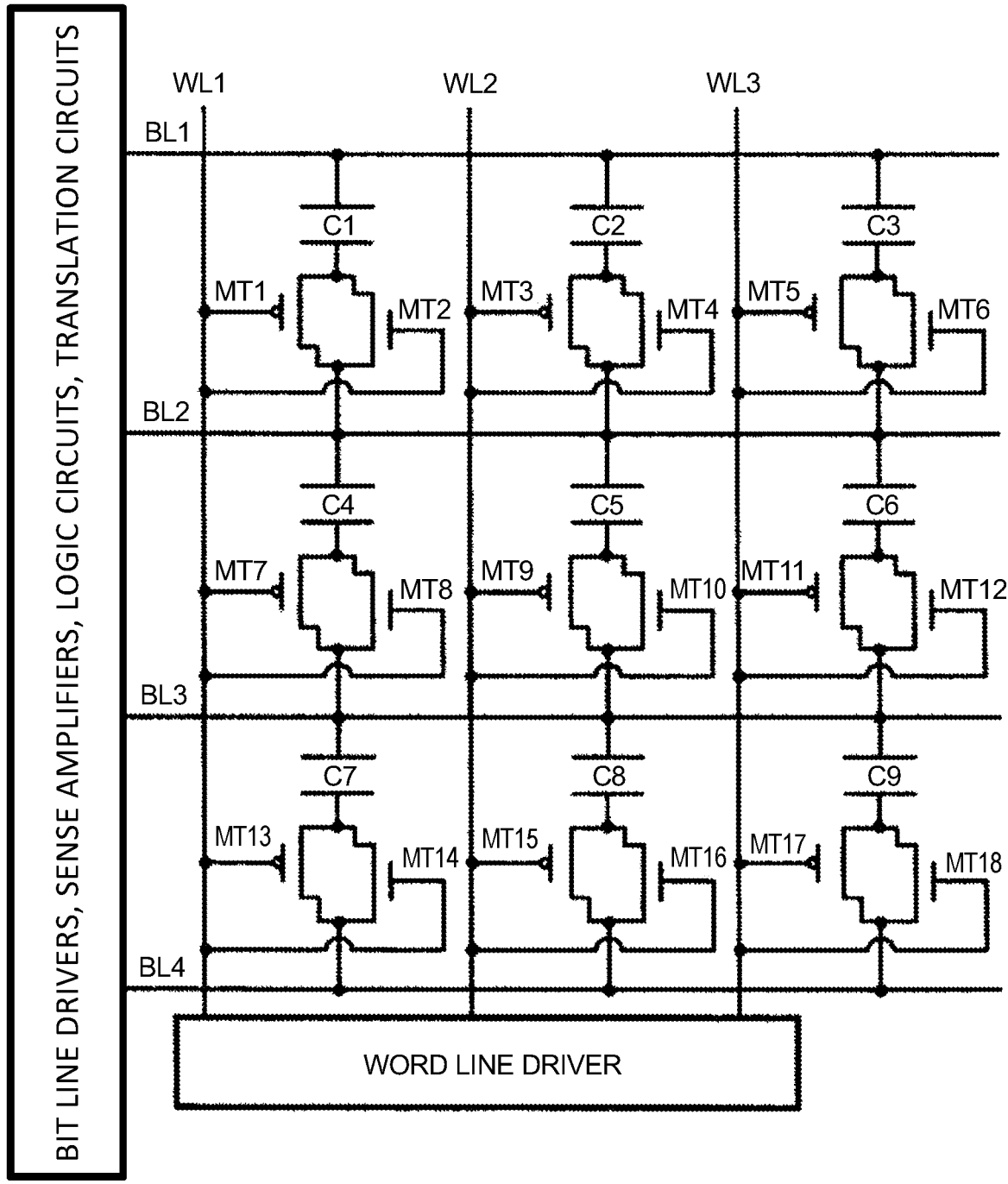
FIG. 7 is a diagram of an exemplified embodiment of the device wherein the operation of bidirectional memory is designed utilizing a combination of two transistors and one capacitor per memory cell.

FIG. 7 is an exemplified embodiment of the device wherein the operation of bidirectional memory is designed utilizing a combination of two transistors and one capacitor per memory cell operation, with an interconnected matrix of bidirectional memory cells. In this embodiment the use of two transistors per memory cell MT1, MT2, MT3, MT4, MT5, MT6, MT7, MT8, MT9, MT10, MT11, MT12, MT13, MT14, MT15, MT16, MT17, MT18, or plurality, is to allow a more complex charging (WRITE) operation of multiple bidirectional memory cells, capacitors C1, C2, C3, C4, C5, C6, C7, C8, C9, or plurality. This circuit design in certain embodiments may use transistors MT2, MT4, MT6, MT8, MT10, MT12, MT14, MT16, MT18, or a plurality of transistors as pull up transistors, and transistors MT1, MT3, MT5, MT7, MT9, MT11, MT13, MT15, MT17, or a plurality or plurality of transistors as pull down transistors, though said sets of transistors may be alternated or dual directional in additional embodiments, where they may be utilized to allow cross charging of capacitors in both series and parallel combinations. This is accomplished by defining the voltage potentials of bit lines BL1, BL2, BL3, BL4, or plurality, and selecting cells by charging word lines WL1, WL2, WL3 or plurality. As discussed in FIG. 5 this may be greatly beneficial to accomplish multiple WRITE operations in a single action, as well as allowing a faster transfer of information by providing memory write instructions where the process of writing information to memory requires less sequential operations.

Figure 8:
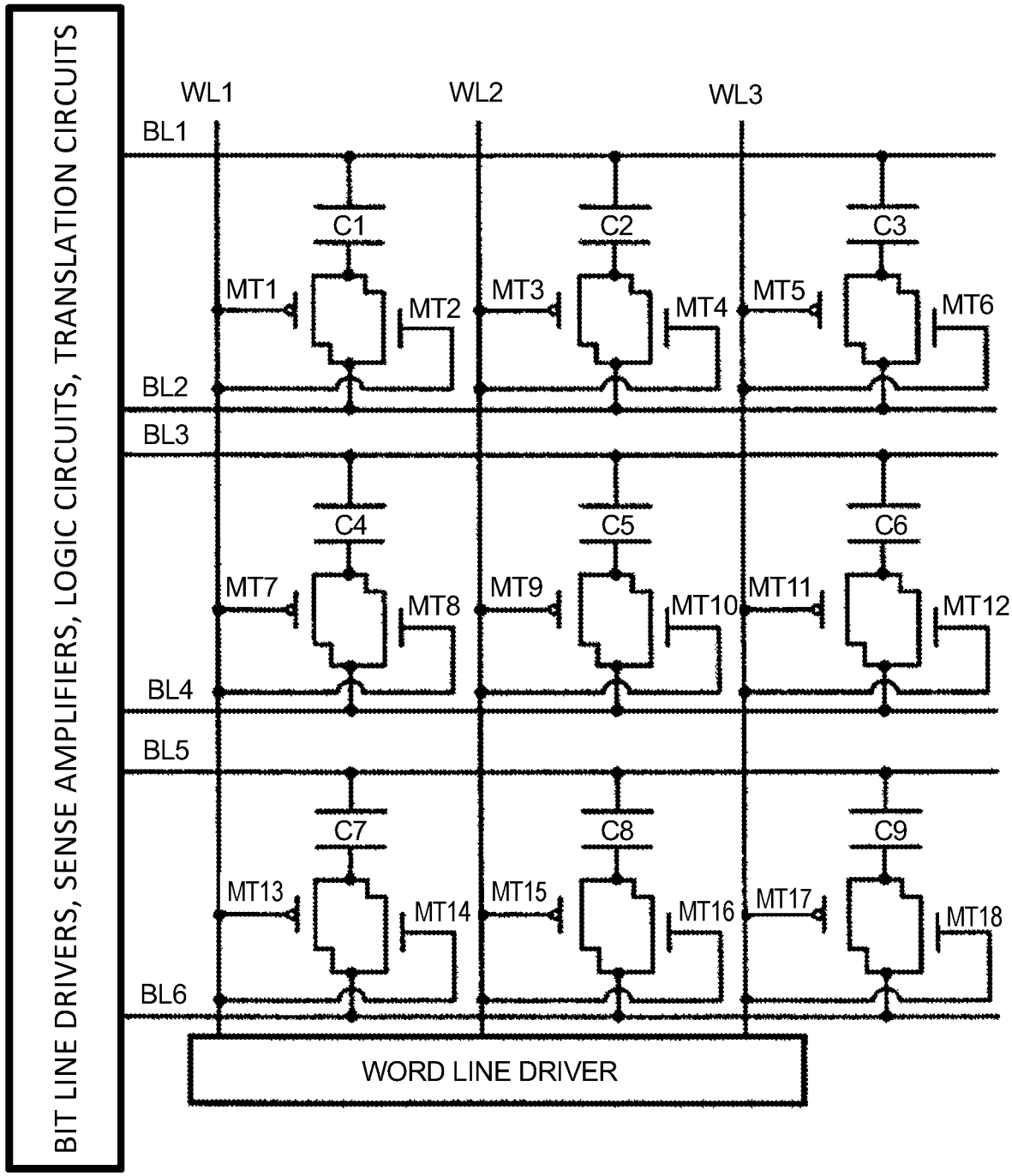
FIG. 8 is a diagram an embodiment of the device utilizing separate bit lines for bidirectional memory cells.

FIG. 8 is an embodiment of the device utilizing separate bit lines for bidirectional memory cells and is designed utilizing two transistors and one capacitor per memory cell, and additional separate bit lines. Separate bit lines may be very beneficial in certain embodiments where parasitic capacitances may interfere with the operation of multiple bidirectional memory cells operating in parallel or sequentially wherein the use of separate bit lines between cells allows independence of the memory array's individual cells. Where for instance multiple processors are accessing memory cell information simultaneously, In this embodiment the use of two transistors per memory cell MT1, MT2, MT3, MT4, MT5, MT6, MT7, MTB, MT9, MT10, MT11, MT12, MT13, MT14, MT15, MT16, MT17, MT18, or plurality, is to allow a more complex charging (WRITE) operation of multiple bidirectional memory cells, capacitors C1, C2, C3, C4, C5, C6, C7, C8, C9, or plurality. This circuit design by utilizing transistors MT2, MT4, MT6, MT8, MT10, MT12, MT14, MT16, MT18, or a plurality of transistors as pull up transistors, and transistors MT1, MT3, MT5, MT7, MT9, MT11, MT13, MT15, MT17, or a plurality or plurality of transistors as pull down transistors, though said sets of transistors may be alternated or dual directional in additional embodiments, where they may be utilized to allow cross charging of capacitors in both series and parallel combinations by controlling specific current paths and limiting conduction across any specific or plurality of said capacitors, or plurality. This is accomplished by defining the voltage potentials of bit lines BL1, BL2, BL3, BL4, BL5, BL6, or plurality, and selecting cells by charging word lines WL1, WL2, WL3 or plurality. As discussed in FIG. 5 this may be greatly beneficial to accomplish multiple WRITE operations in a single action, as well as allowing a faster transfer of information by providing memory write instructions where the process of writing information to memory requires less sequential operations.

One method for a READ operation includes pre-charging both bit lines to a specific and or equal voltage, then by turning on different arrangements of transistors MT1, MT2, MT3, MT4, MT5, MT6, MT7, MT8, MT9, MT10, MT11, MT12, MT13, MT14, MT15, MT16, MT17, MT18, which may include single or multiple of said transistors simultaneously, and may require an inverse voltage polarity applied to the word line WL1, WL2, WL3, you can determine the charge state of a capacitor C1, C2, C3, C4, C5, C6, C7, C8, C9, if there is an increased or decreased voltage on a set of the bit lines BL1, BL2, BL3, BL4, BL5, BL6. Additionally, this may be accomplished by activating any individual transistor MT1, MT2, MT3, MT4, MT5, MT6, MT7, MT8, MT9, which may require an inverse charge applied to word lines WL1, WL2, WL3, and comparing the charge READ from a capacitor C1, C2, C3, C4, C5, C6, C7, C8, C9, against a reference voltage, wherein this individual reading operations could be preformed sequentially with all or some of the transistors MT1, MT2, MT3, MT4, MT5, MT6, MT7, MT8, MT9, MT10, MT11, MT12, MT13, MT14, MT15, MT16, MT17, MT18, to determine charge state and polarity.

The design of the bidirectional memory described in this preferred embodiment is also beneficial in that when designing larger arrays (discussed in greater detail in subsequent figures), the circuit design allows for simple straight forward design architecture. This allows, through activating a single word line WL1, WL2, WL3, and set of bit lines BL1, BL2, BL3, BL4, BL5, BL6 the WRITE operation of the capacitor(s) C1, C2, C3, C4, C5, C6, C7, C8, C9, in either a forward positive polarity, or reverse negative polarity. This allows a very straight forward operation that is very similar to a traditional SRAM WRITE operation, with the main changes being the required additional word line (not shown) in vertical plain operations, as well as address designations taking into consideration the additional reverse charging ability of each capacitor C1, C2, C3, C4, C5, C6, C7, C8, C9. By ensuring that address designations take into account the secondary charge state as well as word line address designation, the memory array can be operated to exploit the benefits of bidirectional memory which will be discussed further in subsequent figures.

Figure 9:
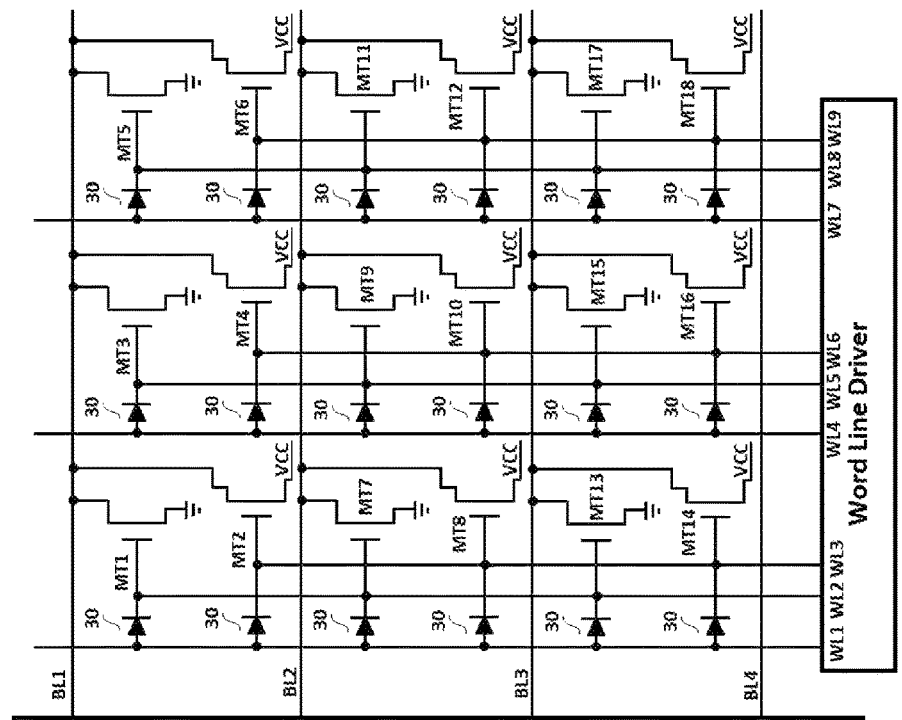
FIG. 9 is a diagram configured as an exemplary embodiment for the device for EEPROM "read only memory" applications

FIG. 9 is a diagram showing multiple bidirectional interconnected memory cells which may be considered a functional block diagram, where the circuits and components may be considered blocks of a system, for their general function, or for a device that may be used to confer the action of their specific block, as such blocks may be omitted, combined, or substituted within an operable configuration of the device to facilitate the operation within the intended scope of the disclosure, where diagram 9 is configured as an exemplary embodiment for the device for EEPROM "read only memory" applications. In this embodiment the use of multiple bidirectional interconnected memory cells allows operation by means of transistors MT1, MT2, MT3, MT4, MT5, MT6, MT7, MT8, MT9, MT10, MT11, MT12, MT13, MT14, MT15, MT16, MT17, MT18, creating an interconnected matrix, additionally operable with word lines WL1, WL2, WL3, WL4, WL5, WL6, WL7, WL8, WL9, and bit lines BL1, BL2, BL3, BL4.

It should be noted the operation of the device may operate and or be constructed as either a rewritable ROM or non-rewritable ROM and may include a number of typical ROM types including Mask ROM, Programmable ROMs (PROMS), Erasable Programmable ROMs (EPROM), Electrically Erasable Programmable ROMs (EEPROM), Electrically Alterable Programmable ROMs (EAPROM), Flash Electrically Erasable Programmable ROM's memory (EEPROM), as a few non-limiting examples and are referenced herein as possible embodiments.

In this layout design the initial charge process may be accomplished a number of ways, in this non-limiting example a bit line BL1, BL2, BL3, BL4, is activated with a specific voltage and a word line WL1, WL2, WL3, WL4, WL5, WL6, WL7, WL8, WL9, is activated with specific voltage. The charging word lines WL2, WL3, WL5, WL6, WL8, WL9, generally have a higher voltage to permanently, or non-permanently encode the device to a fixed on of off state. This allows the operation of determining the information stored within a bidirectional memory cell, which in this non-limiting example is comprised of two transistors.

Each transistor is connected to one-bit line, and two-word lines, and either a ground connection and lower potential, or voltage source and higher potential. In this design by turning on transistor MT1 by means of word line 1 WL1 and bit line BL1 you can use the ground connection of the transistor to pull down the voltage of a bit line BL1 during READ operations allowing a clearly definable $1^{st}$ state. As well in this design you can utilize transistor MT2 by means of word line 1 WL1 and bit line BL1 connected to a higher voltage potential or source to pull up or increase the voltage potential of the bit line 1 BL1 during READ operations allowing a clearly definable $2^{nd}$ state. Finally, you can allow for a third clearly identifiable state during READ operations by not utilizing transistor MT1 or MT2, by not initializing or encoding them, and maintaining the voltage of the bit line 1 BL1 during read operations by means of word line 1 WL1 and bit line BL1, where in the preferred embodiment the voltage potential state on a bit line 1 BL1 during READ operations is fifty percent of the voltage potential of transistor MT2's input source.

The operation of this exemplified embodiment of a bidirectional memory cell requires encoding the transistor to store information, this is accomplished by utilizing a high voltage to encode (WRITE) the specific transistor either MT1 or MT2 or plurality, depending on intended polarization or current flow bias. Using WRITE word lines WL2 or WL3 will encode transistor MT1 or MT2 depending on intended polarization or current flow bias, where the rectifying diode(s) 30 block the higher voltage from encoding other transistors along word line 1 WL1 (MT1, MT2, MT7, MT8, MT13, MT14). The READ operation is for this specific bidirectional memory cell is accomplished utilizing word line 1 WL1 to provide transistors MT1 and MT2 with a current to their gate electrode, and where bit line 1 BL1 is charged to a nominal voltage between the low voltage potential of transistor MT1 and higher voltage potential of transistor MT2, and will cause the bit line BL1 to assume one of three states during the READ operation. The first state where bit line 1 BL1 voltages is pulled up representing a positive bias or polarity, the second state providing no change to the voltage of the bit line BL1 representing a neutral polarity or no charge, and finally a third state where the voltage is pulled down on the bit line BL1, representing a negative bias or polarization.

The operation of the preferred embodiment allows for a similar framework to existing ROM memory systems, though with a differentiated circuit topology. Specifically, operational and circuit layout similarities include, as a general non-limiting comparison to circuits and their operation, organizational address layouts, bit line driver(s) general operational principles and capabilities, word line driver(s) general operational principles and capabilities, sense amplifier(s) general operation, the general interconnection with subsequent systems and buffer, cache, register, processors, for example the central processing unit CPU. This includes similarities to individual cell address identification layout styles, with the addition of an additional word line to encode said transistors charge state with charging word lines WL2, WL3, WL5, WL6, WL8, WL9, where in this non-limiting example rectifying diode(s) 30 are used to control the current while encoding (WRITING) a specific transistor MT1, MT2, MT3, MT4, MT5, MT6, MT7, MT8, MT9, MT10, MT11, MT12, MT13, MT14, MT15, MT16, MT17, MT18.

There are multiple different methods, and separate embodiments, for reading the information stored on a bidirectional memory cell, some non-limiting examples will be discussed, and in greater detail in further figure descriptions.

The design of the bidirectional memory in this embodiment is also beneficial in that when designing larger arrays (discussed in greater detail in subsequent figures), the circuit design allows for simple straight forward design architecture.

This allows a very straight forward operation with the main change to typical ROM being the required additional initializing word lines WL2, WL3, WL5, WL6, WL8, WL9, and diode(s) 30, for encoding, WRITE operations. As well as each memory address designation taking into consideration the additional required bit spaces in the buffer which may also need to be taken into account for the cache and register, when a memory cell is READ as being in a negative polarization that has been encoded to represent multiple bits of information, and therefore requires additional address designations or allocated spaces in a buffer. By ensuring that address designations take into account the secondary charge state, a memory array (not shown) can be operated to exploit the benefits of a ROM bidirectional memory, which will be discussed in greater depth and detail in subsequent figures.

Additionally, bidirectional memory cells may be driven directly from a drive directory, ledger, virtual memory system, or central processing unit, memory management unit, and or additional drive system.

Depending on the particular application the operation can be controlled by the management system (not shown) to control charging the storage device(s), bidirectional memory cell(s) in the circuit for predictable, or specific actions, and or to specific charge states/voltage(s). This may include multiple combinations of said bidirectional memory cells simultaneously, or sequentially in real time. This may include user interactions in live time, and or predetermined states.

In some embodiments as referenced herein a consistent continuous operation controlled directly from the management system (not shown) could provide the instruction for READ and or WRITE operations for the bidirectional memory cells, to precisely meet the operational requirements and information states designated and may included a predetermined arrangement of specifically initialized transistors MT1, MT2, MT3, MT4, MT5, MT6, MT7, MT8, MT9, MT10, MT11, MT12, MT13, MT14, MT15, MT16, MT17, MT18, or additional plurality, to form a logical readable code or script, program, instruction or the like. It should be noted that the operation of reading the ROM bidirectional memory cells is non-destructive during a READ operation.

Additionally, this operation and configuration may be used in some embodiments to operate pluralities of bidirectional memory cells, and or bidirectional memory array(s). Wherein for instance one embodiment could utilize the management system (not shown) in an electronic device such as a smart phone, computer, tablet, wearables, servers, converters, inverters, computers, processors, electronic devices, that may consist of billions of individuals or arranged bidirectional memory cells. In this non-limiting preferred example, the layout of the circuit is designed as a memory ROM address schematic, operated as a plurality of interconnected memory cells, though operated independently, in an interconnected framework. This allows the operational characteristics to be precisely tailored to meet the requirements specific to each independent system.

The application and operation of many independently operating, interconnected bidirectional memory systems, and circuits, within a device(s) referenced as an exemplified 3-dimensional construction configuration, and or planar stacked construction which is the preferred embodiment of this disclosure.

This method of integration and operation allows bidirectional memory technology to be utilized by many of the systems and operating circuits electronic devices contain. The ability to offer improved information storage to a device and by not negatively impacting the devices operation, is practically implementable, and very beneficial.

Additionally, connected to word lines WL1, WL2, WL3, WL4, WL5, WL6, WL7, WL8, WL9, is a word line driver and/or driver circuit including line and column selectors, block selectors that may be used to control and or initialize transistor MT1, MT2, MT3, MT4, MT5, MT6, MT7, MT8, MT9, MT10, MT11, MT12, MT13, MT14, MT15, MT16, MT17, MT18, and therefor bidirectional memory cells.

And connected to bit lines BL1, BL2, BL3, BL4, includes different circuits including bit line driver's, sense amplifiers, differentiators, logic circuits, translation circuits, definable translation circuits, constrained translation circuits, subsequent combinational definable translation circuits, and general processor and computer circuitry including line and column selectors, block selectors, buffers, memory cash, and central processing unit "CPU", where an embodiment of bidirectional memory includes an array of bidirectional memory cells that may be WRITE accessed to store data and READ accessed to retrieve the stored data.

For operation of a bidirectional memory array a bidirectional cell is selected during either a READ operation, or a WRITE operation, by selecting its bank, row, and column. The bank, row, and column that are chosen are determined by a binary code. For an non-limiting example, an address may comprise a 16-bit binary code for controlling the WRITE and READ operations. More particularly, the 16-bit binary may comprise two separate 8-bit binary codes one for selecting the row and the other for the column, which may further be coupled to a row decoder and a column decoder and host bus. In response to each 8-bit code, the row decoder may generate 2 outputs, which allows up to 256 different address patterns. As well, the column decoder may generate another 2 outputs, which allows a combined matrix of selectable memory cells from 256 rows and 256 columns, with may also utilize additional address designations for WRITE applications and or when READ operations where bidirectional memory cells are each encoded with multiple bits of information.

Bidirectional memory cell addresses may be defined or assigned through a number of possible schemes, one possible nonlimiting example, that maintains the structure and consistency existing ROM memory structures, is by sequentially identifying the memory cells both for the positive and negative charge state's as adjacent, and or individual addresses, and/or a sequential memory cell address identification scheme and configuration. Another nonlimiting example may include designating the memory cells within their traditional address framework, where identifying the negative charge on a bidirectional memory cell is designated as an inverse or negative address (-), therefore allowing exact address specification with existing addressed designation frameworks, and referencing the cell polarity by means of a polarity symbol which is the preferred embodiment of address designation as this may allow a simple straight forward operation to utilize a row and column decoder, while maintaining existing code addressable architectures, with the additional of assignment of the additional information bits into the buffer, by accounting for each specific additional bit sequence, each additional bit, held as a negative charge. Though many possible address schemes are possible and do not depart from the scope and intention of the disclosed method are referenced and therefore claimed as possible characters and or features of embodiments herein.

This circuit lays out the basic design of a memory system and or array consisting of nine interconnected cells, which may additionally be constructed 3-dimensionally or in some embodiments a planar construction with each interconnected array comprising one or part of a plane, and additionally interconnected arrays being stacked, or layered sequentially, and with each array comprising any number of interconnected cells with any plurality of layers or stacks or arrays. And may additionally comprise additional word lines (not shown) and or bit lines (not shown) for both READ and WRITE operations of bidirectional memory cells, and may additionally comprise additional transistors (not shown) for each bidirectional memory cell for controlling each cell and or for storing information within each cell, without departing for the scope and intended results of the disclosed system and method while still maintain a narrowed equivalent design and operation process, and are herein referenced as possible additional embodiments.

Figure 10:
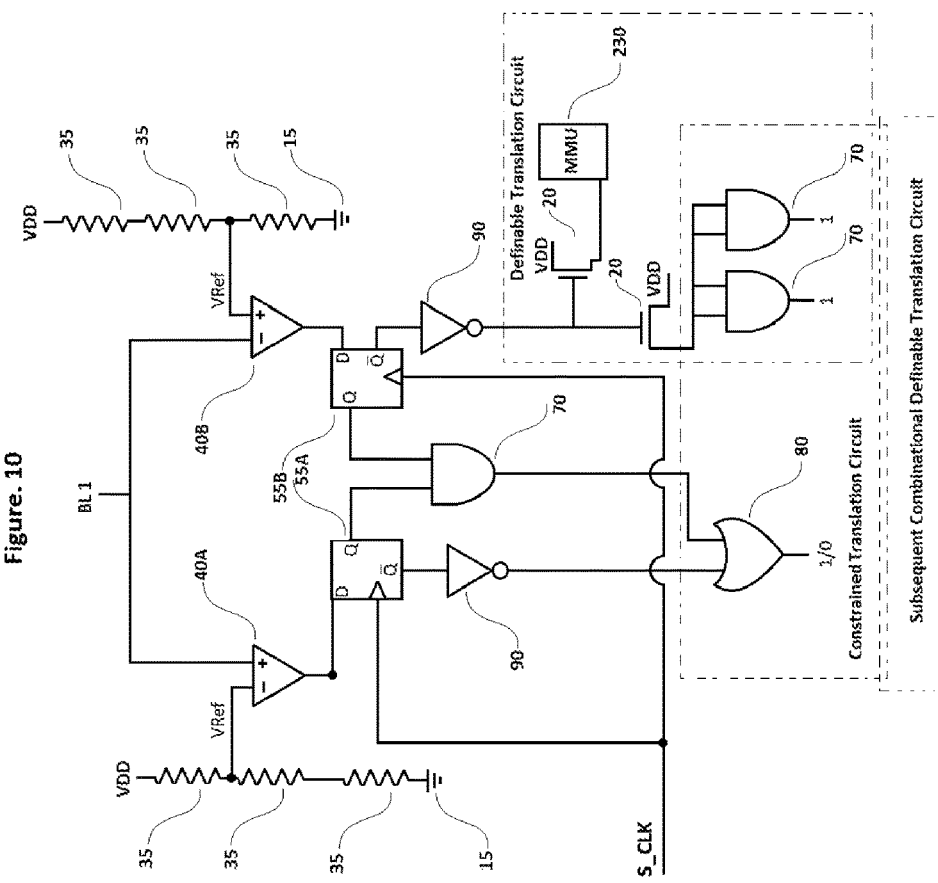
FIG. 10 is a diagram of an exemplary embodiment of the logic circuitry required for the READ operation of bidirectional memory.

FIG. 10 is a diagram of an exemplary embodiment of the logic circuitry required for the READ operation of bidirectional memory, which may be considered a functional block diagram, where the circuits and components may be considered blocks of a system, for their general function, or for a device that may be used to confer the action of their specific block, as such blocks may be omitted, combined, or substituted within an operable configuration of the device to facilitate the operation within the intended scope of the disclosure, including the circuitry required to retrieve and interpret the three different states (tri-state) of bidirectional memory referenced as forward bias (positive), reverse bias (negative), and no charge, states. In this embodiment the charge stored in a negative bias is READ by the logic circuitry as holding multiple bits of information, in this embodiment the negative charge is READ and interpreted as representing "011", though in additional embodiments any combination of 0('s) and or 1('s) representing binary logic may be stored and or READ and or interpreted by the logic circuitry, buffer, cache, register, and used by a CPU (not shown), processor (not shown), computer (not shown), or other electronic system or device.

Traditional memory systems utilized in a binary framework, and operation have not been fully exploited to utilize a bidirectional memory system for the purpose of storing multiple bits of information. In binary systems each memory cell stores either a 1 or 0, a single bit of information of a binary digit, and by utilizing the disclosed system and method a single memory cell can represent, and therefore store more than a single bit of information. This is greatly beneficial and should not be confused with a ternary language or operating system.

The benefit of storing multiple pieces of information, such as an information sequence allows another layer of abstraction within a binary framework. The ability to store more than a single bit of information allows the development of new innovative processing systems, it also allows the reduction in size of physical memory systems, for instance as reference in FIG. 9 ROM memory. This allows a binary code compression, that may be in conjunction to additional compression techniques greatly reducing the required amount of physical memory cells required for a specific code, sequence, program, and or mathematical sequence.

This operation for specifically designing the logic circuitry may be accomplished in some embodiments by man-made design, or computer analysis based on the most beneficial design, or logical design based on specific code sequences, and or simulation or modeling based design, without departing from the scope and subsequent embodiments of the disclosure and referenced herein. Where the use of a specific circuit design, or switch(s), or transistor(s), for instance a plurality of specific logic gate sequence(s) may be use for all or part or utilize an additional plurality, of an information sequence, code, mathematical sequence, program or communication.

The benefit of utilizing different information sequences that can be stored on or translated as the negative polarization in a bidirectional memory framework provides many benefits. A major benefit being the compression of information, this compression benefit may be further exploited in additional embodiments by analyzing specific sections of code to determine the most beneficial sequence to be stored and translated, then designing the logic circuitry for that specific section of code. This would allow multiple sections of code to store different information sequences and therefor required different logic circuitry to decode the stored and or translated code section, thereby maximizing the disclosed system and method, which may then utilize a field programmable gate array and or CPU. Further these separate information sequences and the subsequent logic circuitry, could be stored on a ledger or legend, allowing a clear communication and interpretation of information by reading and decoding the translated or stored code with the appropriate logic circuitry for each information or code sequence or section.

Even ternary systems are not designed to utilize memory for the purpose of allowing individual memory cells to hold more than a single bit of information. The beneficial design of ternary systems being the natural mathematical operation of balanced ternary systems, or the reduction of required bits for information processing due to the ternary language encoding system and legend. Therefore, another embodiment is utilizing the disclosed system and method to store more than a single bit of information for each memory cell utilized in a ternary operation and or framework.

Even quantum computers are not designed to utilize memory for the purpose of allowing individual memory cells (qubits) to hold more than a single bit of information. The beneficial design of quantum computer systems being the quantum features exploited for operation including; states of superposition, entanglement, interference, as a few examples. Therefore, another embodiment is utilizing the disclosed system and method to store more than a single bit of information for each memory cell utilized in a quantum operation and or quantum computer framework.

In one embodiment of the disclosed system and method, that may utilize a variety of designs, for a specific logic circuitry design, used to decode the representation of information stored on a bidirectional ROM memory cell follows: The operation of one nonlimiting example of the READ circuitry required to differentiate and attain the charge state of a bidirectional memory cell is as follows; During a READ operation a bit line, in this case bit line 1 BL1, may be pre-charged, and in this nonlimiting example is pre-charged to 50% of the source voltage, though may additionally be at or sub VDD levels. A sense amplifier 40A which is non-inverting READS the voltage from bit line 1 BL1 and compares it against a set reference voltage (threshold), wherein the reference voltage VRef trip point, threshold, is a high state trip point. This allows an output of 1, or ON state, if the voltage READ from bit line 1 BL1 transverses and saturates the VThresh–VRef point, initiating a state change from 0, to 1. The ON output of the sense amplifier 40A is then directed to a D-type flip-flop 55A, where the sense clock may initiate a state change allowing a latch to occur, reinforcing the charge state, the flip-flop's 55A inverting compliment output Q which therefore outputs an OFF, or 0 state which is routed to a NOT Gate (inverter) 90 that reinverts the state back to an ON state and is then sent to an OR Gate 80 for output communication of the voltage state from sense amplifier 40A, and where the flip-flops 55A non-inverting output Q is routed to AND Gate 70.

Additionally, a sense amplifier 40B is connected to READ the voltage from bit line 1 BL1 and is configured to be inverting, where if bit line 1 BL1 has a voltage state present that crosses below its VThresh its voltage reference VRef, or low point reference, will initiate an ON state, or 1, signifying a negative charge state on the bidirectional memory cell. This ON state is sent to a D type flip-flop 55B, which outputs the non-inverting output Q in an ON state to AND Gate 70 and inverting compliment output q signal to a NOT Gate 90 (inverter) that inverts the inverted state back to an ON state that sends the signal to the memory management unit 230, and a control transistor 20 or plurality, that controls a singular or plurality of logic gates 80, 70, 70, or control components, within a definable translation circuit, to control and or interpret the output information state of a negatively charged bidirectional memory cell.

The control transistor 20 outputs a signal to the memory management unit 230, allowing the memory management unit 230 to interpret the negative voltage charge READ from the bidirectional memory cell.

In certain embodiments will allow for additional sequential information slots within the buffer or register to be assigned. Additionally, other embodiments, specifically those utilizing virtual memory, may have already accounted for the additional required memory slots based on addressed designation, from the defined number of spots required from the definable translation circuit. Additionally, the ON state from the sense amplifier 40B and flip-flop 55B travels to the control transistor 20 in the definable translation circuit, to initiate the output states of additional control components, and or logic gates, in this non-limiting example two AND Gates 70, 70, into the buffer and register, in conjunction with the constrained translation circuit, in this non-limiting example OR Gate 80.

If the sense amplifier 40B READS that the voltage on the bidirectional memory cell, is above its reference voltage VRef it will initiate an OFF, or 0 state. Wherein the D type flip-flop 55B will output a 0, or OFF to AND Gate 70, and it inverting compliment output signal to a NOT Gate 90 (inverter) that inverts the inverted state back to an OFF state that sends the signal to the memory management unit 230, and a control transistor 20 or plurality, that controls a singular or plurality of logic gates 80, 70, 70, or control components, within a definable translation circuit, to control and or interpret the output information state of a bidirectional memory cell. This is accomplished with a sense clock S_CLK signal that may initiate a state change allowing a latch to occur, reinforcing the charge.

The AND Gate 70 receiving therefore a 1, or ON state from flip-flop 55A, and a 0, or OFF state from flip-flop 55B maintains its output of zero, which in this non-limiting example are D-type flip flops, though various type of flip flops may be substituted, and or substituting different circuitry to accomplish the said result are reference herein.

If no charge is present on the bidirectional memory cell both sense amplifiers 40A and 40B do not transition above or below their reference voltage VRef's respectively, high state reference 40A and low state reference 40B, therefore they both output a 0, or OFF state, to D type flip-flop 55A and 55B. Flip-flops 55A and 55B, which may be controlled and or synchronized with a sense clock S_CLK, therefore output 0's, or OFF states, to the AND Gate 70. The AND Gate 70 receiving two 0's, or OFF, signals will output 0, or OFF, to the OR Gate 80, where the logic of the AND Gate 70 would require two ON states to output to a 1, or ON state and due to the fact this would require both flip flops 55A and 55B to both output a 1's, or ON, states and is logically impossible due to the fact that this would require both sense amplifiers 40A and 408 to pass their individual high and low point thresholds VThresh, signifying that the bidirectional memory cell was in both a positive and negative bias simultaneously. The AND Gate 70 will output its state which is OFF or 0, to the OR Gate 80, where due to the NOT GATE 90 inverting the inverted signal from inverting compliment output Q̄ signal, the OR Gate 80 will output a 0, or OFF, into the buffer and or register. The design of specific components within the read logic circuit may be changed or modified without departing from the scope and intent of the disclosed system and method, alternations, changes and/or modifications wherein the operation and outcome attain the intended results and are within the scope of the disclosed system and method are therefore referenced herein.

The operation of the disclosed READ logic circuitry is to allow the READING of the bidirectional memory cell whether it is in a positive charge state, negative charge state or does not contain a charge. The charge states in this nonlimiting embodiment are designed to trigger above a high threshold for a positive bias, and below a low threshold for a negative bias therefore allowing a read of the bidirectional memory cell in any of its tri-states. The benefit of the disclosed system and method is that by utilizing the system and method, which may include similar circuit operational designs, allows the control of the information translated to and READ from the bidirectional memory cell. Specifically, the interpretation and subsequent translation through a definable translation circuit to additional systems, including the processor, the information, sequence of bits, the negative charge state of the bidirectional memory cell is designed to represent. This allows the interpretation of the information stored on the bidirectional memory cell to encompass a variety of possible information states and therefore number sequences, wherein in certain embodiments a plurality of interchangeable control circuitry and logic gates FPGA (not shown), and or circuitry may be used to allow a fixed and or controllable output for interpreted information stored as the negative polarity on a bidirectional memory cell and or array.

This is greatly advantageous in that traditionally physical memory cells could only store one of two possible states of a binary digit, or specifically a single bit of information. With the use of a definable translation circuit any possible number sequence may be stored as a negative charge on a single bidirectional memory cell and or plurality, and if the correct output circuit design is implemented, the information stored as the negative polarity charge can be communicated discreetly, wherein the information therefore is not known, meaning information is therefore communicated and when READ from memory may be decoded for interpretation, and/or command allocation.

Wherein in some embodiments it may be advantageous to have multiple different translation circuit designs, either interchangeable, consecutive, controllable, parallel, or defined, allowing another layer of abstraction for the operation of READING and interpreting the state and polarization on a bidirectional memory cell and or plurality. For instance, additional embodiments may utilize different definable translation circuits in a parallel design frame for a specific block sequence, thus allowing each subsequent negative charge state READ from subsequent bidirectional memory cells to be interpreted as different number sequences, creating a more sophisticated and thus difficult encoding scheme, resulting in a more secure method of communicating number sequences and information.

It should be noted that in this design the output states are broken into two translation circuits, where the OR Gate 80 is assumed to be in the constrained translation state, and the negative voltage state is interpreted through a definable translation circuit, though in operation polarizations, and therefore circuit design, may be inverted without departing from the scope and context of the disclosed system and method, and are referenced to provide context and not meant to limit the scope of the device. Additionally, some embodiments may utilize an additional subsequent combinational definable translation circuit wherein the constrained translation circuit and definable translation circuit may therefore be controlled and redefined for an output number sequence, and information state, this may be advantageous wherein controlling a specific number sequence is desired and limited by the constrained translation circuit.

Figure 11:
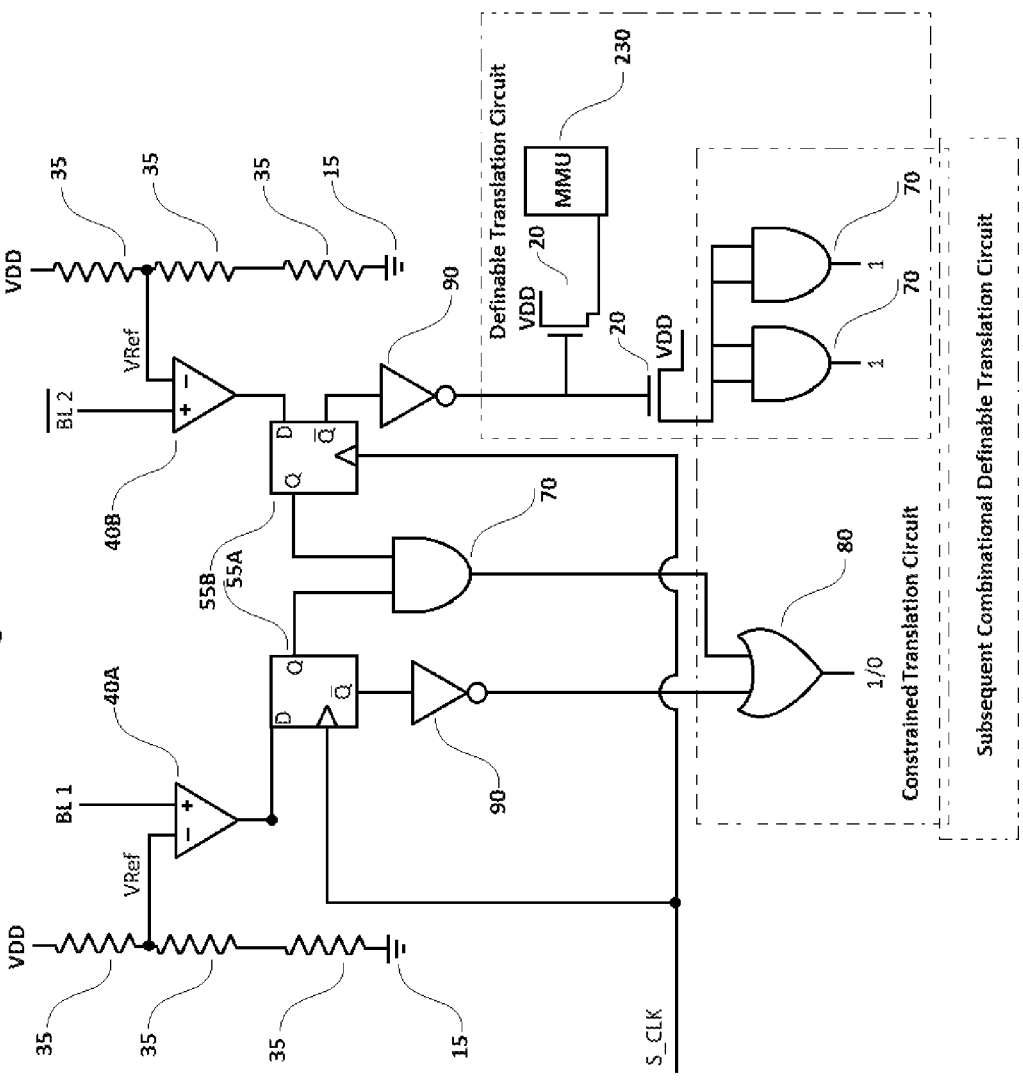
FIG. 11 is a diagram of a preferred embodiment of the logic circuitry required for the READ operation of bidirectional memory.

FIG. 11 is a diagram of a preferred embodiment of the logic circuitry required for the READ operation of bidirectional memory, which may be considered a functional block diagram, where the circuits and components may be considered blocks of a system, for their general function, or may represent a device that may be used to confer the action of their specific block, as such blocks may be omitted, combined, or substituted within an operable configuration of the device to facilitate the operation within the intended scope of the disclosure, including the circuitry required to retrieve and interpret the three different states (tri-state) of bidirectional memory referenced as forward bias (positive), reverse bias (negative), and no charge, states. In this embodiment the charge stored in a negative bias is read by the logic circuitry as holding multiple bits of information, in this embodiment the negative charge is READ and interpreted as representing "011", though in additional embodiments any combination of 0('s) and or 1('s) representing binary logic may be stored and or READ and or interpreted by the logic circuitry and used by a CPU (not shown), processor (not shown), computer (not shown), or other electronic system or device.

Traditional memory systems utilized in a binary framework, and operation have not been fully exploited to utilize a bidirectional memory system for the purpose of storing multiple bits of information. In binary systems each memory cell stores either a 1 or 0, a single bit of information of a binary digit (Shannon), and by utilizing the disclosed system and method a single memory cell can represent, and therefore store more than a single bit of information. This is greatly beneficial and should not be confused with a ternary language or operating system.

The benefit of storing multiple pieces of information, such as an information sequence allows another layer of abstraction within a binary framework. The ability to store more than a single bit of information allows the development of new innovative processing systems, it also allows the development of new security systems and methodologies. For instance, there already exists architecture to compress information, an example would be pointer-based compression that identifies duplicated character strings in a block of code, then by utilizing a pointer and hop system you can reference a previous character string, substantially reducing the code length. This operation is based on a word level of abstraction, and where the disclosed system and method operates within the initial electrical signal representation, communicated within the base binary structure abstraction. This allows a binary code compression, that may be in conjunction to additional compression techniques greatly reducing the required amount of physical memory cells required for a specific code, sequence, program, and or mathematical sequence.

The disclosed system and method can also be used to further increase the security of communication. For instance, RSA encryption utilizes a mathematical system, and is based on the practical difficulty of the factorization of the product of two large prime numbers. Though it is practically difficult to solve or break this type of method of encryption it is possible. With the advent of more powerful supercomputers, quantum computers, and artificial intelligence the ability to consistently break this type of encryption is possible in the near future.

In one embodiment of the disclosed system and method, that may utilize a variety of designs, for a specific logic circuitry design, used to decode the representation of information stored on a bidirectional memory cell. A specific configuration of logic circuitry, for instance a singular and or plurality combination of gates as non-limiting examples (not shown) and or switch(s), transistor(s), designed to output a specific binary sequence, could be used to store from an encrypted message a specific character sequence if a negative polarization is READ. And if the specific logic and or gate design was privately communicated to the recipient of the encrypted message, a dissemination of first the compressed code, and then the encrypted message would be possible and beneficial.

This embodiment allows for a heightened level of security for encryption and makes the solving of mathematical based encryption virtually impossible. This is due to the fact that in the example of RSA encryption, a mathematical solution is possible with brute force mathematical computation, to solve for the overall prime number factorials of specific word-based binary number sequence(s). Where if after encryption, the code translated into, or stored into, a bidirectional based information structure with a specific read logic circuit design in this case non-limiting example OR Gate 80, AND Gate 70, AND Gate 70, which is then kept secret and communicated to the recipient of the encrypted message, this to allow the configuration of their logic circuitry for reading first the translated binary sequence, then decoding the encryption results in a more secure communication. This is due to the fact that the encrypted code is effectively missing number sequence groups, this makes the encrypted code mathematically unsolvable without first knowing the specific information sequence translated into the bidirectional framework. In order to break the encryption, you would first have to break the bidirectional translation, which is based on a factorized and unreadable original code, making logical deconstruction and reconstruction of either the translated code sequence or encrypted code message, virtually impossible.

This operation of specifically designing the logic circuitry may be accomplished in some embodiments by manmade design, or computer analysis based on the most beneficial design, or logical design based on specific code sequences, and or simulation or modeling based design, without departing from the scope and subsequent embodiments of the disclosure and referenced herein. Where the use of a specific circuit design, or switch(s), or transistor(s), for instance a plurality of specific logic gate sequence(s), may be use for all or part, or utilize an additional plurality, of an information sequence, code, mathematical sequence, program or communication.

The benefit of utilizing different information sequences that can be stored on or translated as the negative polarization in a bidirectional memory framework provides many benefits. A major benefit being the compression of information, this compression benefit may be further exploited in additional embodiments by analyzing specific sections of code to determine the most beneficial sequence to be stored and translated, then designing the logic circuitry for that specific section of code that may utilize a FPGA (not shown). This would allow multiple sections of code to store different information sequences and therefor required different logic circuitry to decode the stored and or translated code section, thereby maximizing the disclosed system and method. Further these separate information sequences and the subsequent logic circuitry, could be stored on a ledger or legend, allowing a clear communication and interpretation of information by reading and decoding the translated or stored code with the appropriate logic circuitry for each information or code sequence or section.

Even ternary systems are not designed to utilize memory for the purpose of allowing individual memory cells to hold more than a single bit of information. The beneficial design of ternary systems being the natural mathematical operation of balanced ternary systems, or the reduction of required bits for information processing due to the ternary language encoding system and legend. Therefore, another embodiment is utilizing the disclosed system and method to store more than a single bit of information for each memory cell utilized in a ternary operation and or framework.

Even quantum computers are not designed to utilize memory for the purpose of allowing individual memory cells (qubits) to hold more than a single bit of information. The beneficial design of quantum computer systems being the quantum features exploited for operation including; states of superposition, entanglement, interference, as a few examples. Therefore, another embodiment is utilizing the disclosed system and method to store more than a single bit of information for each memory cell utilized in a quantum operation and or quantum computer framework.

The operation of one nonlimiting example of the READ circuitry required to differentiate and attain the charge state of a bidirectional memory cell is as follows; During a READ operation bit lines 1 & 2 BL1, and BL2, may be pre-charged, and in this nonlimiting example are pre-charged to 50% of the source voltage, or bit lines BL1 And BL2 charging voltage for a bidirectional memory cell(s), though they may additionally be at or sub VDD levels. A sense amplifier 40A READS the voltage from bit line 1 BL1 and compares it against a set reference voltage (threshold), wherein the reference voltage VRef trip point, threshold, is a high state trip point. This allows an output of 1, or ON state, if the voltage READ from bit line 1 BL1 transverses and saturates the VThresh–VRef point, initiating a state change from 0, to 1. The ON output of the sense amplifier 40A is then directed to a D-type flip-flop 55A, where the sense clock may initiates a state change allowing a latch to occur, reinforcing the charge state, the flip-flop's 55A inverting compliment output Q which therefore outputs an OFF, or 0 state which is routed to a NOT Gate (inverter) 90 that reinverts the state back to an ON state and is then sent to an OR Gate 80 for output communication of the voltage state from sense amplifier 40A, and where the flip-flops 55A non-inverting output Q is routed to AND Gate 70.

Additionally, a sense amplifier 40B is connected to READ the voltage from bit line 2 BL2, where if bit line 2 BL2 has a voltage state present that crosses above VThresh its voltage reference VRef, or high point reference, will initiate an ON state, or 1, signifying a negative charge state on the bidirectional memory cell. This ON state is sent to a D type flip-flop 55B, which outputs the non-inverting output Q in an ON state to AND Gate 70 and inverting compliment output Q signal to a NOT Gate 90 (inverter) that inverts the inverted state back to an ON state that sends the signal to the memory management unit 230, and a control transistor 20 or plurality, that controls a singular or plurality of logic gates 80, 70, 70, or control components, within a definable translation circuit, to control and or interpret the output information state of a negatively charged bidirectional memory cell.

If the sense amplifier 40B READS that the voltage on the bidirectional memory cell, is below its reference voltage VRef it will initiate an OFF, or 0 state. Wherein the D type flip-flop 55B will output a 0, or OFF to AND Gate 70, and it inverting compliment output Q signal to a NOT Gate 90 (inverter) that inverts the inverted state back to an OFF state that sends the signal to the memory management unit 230, and a control transistor 20 or plurality, that controls a singular or plurality of interchangeable logic gates 80, 70, 70, or control components, within a definable translation circuit, to control and or interpret the output information state of a bidirectional memory cell. This is accomplished with a sense clock signal that may initiate a state change allowing a latch to occur, reinforcing the charge.

The AND Gate 70 receiving therefore a 1, or ON state from flip-flop 55A, and a 0, or OFF state from flip-flop 55B maintains its output of zero, which in this non-limiting example are D-type flip flops, though various type of flip flops may be substituted, and or substituting different circuitry to accomplish the said result are reference herein. The control transistor 20 outputs a signal to the memory management unit 230, allowing the memory management unit 230 to interpret the negative voltage charge READ from the bidirectional memory cell. Where in certain embodiments will allow for additional sequential information slots within the buffer or register to be assigned. Additionally, other embodiments, specifically those utilizing virtual memory, may have already accounted for the additional required memory slots based on addressed designation, from the defined number of spots required from the definable translation circuit. Additionally, the ON state from the sense amplifier 40B and flip-flop 55B travels to the control transistor 20 in the definable translation circuit, to initiate the output states of additional control components, and or interchangeable logic gates, in this non-limiting example two AND Gates 70, 70, into the buffer and or register, in conjunction with the constrained translation circuit, in this non-limiting example OR Gate 80.

If no charge is present on the bidirectional memory cell both sense amplifiers 40A and 40B do not transition above their reference voltage VRef, high state reference, therefore they both output a 0, or OFF state, to D type flip-flop 55A and 55B. Flip-flops 55A and 55B, which may be controlled and or synchronized with a sense clock S_CLK, therefore output 0's, or OFF states, to the AND Gate 70. The AND Gate 70 receiving two 0's, or OFF, signals will output 0, or OFF, to the OR Gate 80, where the logic of the AND Gate 70 would require two ON states to output to a 1, or ON state and due to the fact this would require both flip flops 55A and 55B to both output a 1's, or ON, states and is logically impossible due to the fact that this would require both sense amplifiers 40A and 40B to pass their individual high point thresholds VThresh, signifying that the capacitor (not shown) was charged in both a positive and negative bias simultaneously. The AND Gate 70 will output its state which is OFF or 0, to the OR Gate 80, where due to the NOT GATE 90 inverting the inverted signal from inverting compliment output q signal, the OR Gate 80 will output a 0, or OFF, into the buffer, cache, and or register. The design of specific components within the read logic circuit may be changed or modified without departing from the scope and intent of the disclosed system and method, alternations, changes and/or modifications wherein the operation and outcome attain the intended results and are within the scope of the disclosed system and method are therefore referenced herein.

The operation of the disclosed READ logic circuitry is to allow the READING of the bidirectional memory cell whether it is in a positive charge state, negative charge state or not contain a charge. The charge state in this nonlimiting embodiment is designed to trigger above a high threshold therefore allowing a read of the bidirectional memory cell in any of its tri-states. The benefit of the disclosed system and method is that by utilizing the system and method which may include similar circuit operational designs allows the control of the information translated to and READ from the bidirectional memory cell, specifically the interpretation and subsequent translation through a definable translation circuit to additional systems, including the processor, the information, sequence of bits, the negative charge state of the bidirectional memory cell is designed to represent. This allows the interpretation of the information stored on the bidirectional memory cell to encompass a variety of possible information states and therefore number sequences, wherein in certain embodiments a plurality of interchangeable control circuitry and logic gates 80, 70, 70, and or circuitry may be used to allow a fixed and or controllable output for interpreted information stored as the negative polarity on a bidirectional memory cell and or array.

This is greatly advantageous in that traditionally physical memory cells could only store one of two possible states of a binary digit, or specifically a single bit (Shannon) of information. With the use of a definable translation circuit any possible number sequence may be stored as a negative charge on a single bidirectional memory cell and or plurality, and if the correct output circuit design is implemented, the information stored as the negative polarity charge can be communicated discreetly, wherein the information therefore is not known, meaning information is therefore communicated and when READ from memory may be decoded for interpretation, and/or command allocation.

Wherein in some embodiments it may be advantageous to have multiple different translation circuit designs, either interchangeable, consecutive, controllable (FPGA), parallel, or defined, allowing another layer of abstraction for the operation of READING and interpreting the state of negative polarization on a bidirectional memory cell and or plurality. For instance, additional embodiments may utilize different definable translation circuits in a parallel design frame for a specific block sequence, thus allowing each subsequent negative charge state READ from subsequent bidirectional memory cells to be interpreted as different number sequences, creating a more sophisticated and thus difficult encoding scheme, resulting in a more secure method of communicating number sequences and information.

It should be noted that in this design the output states are broken into two translation circuits, where the OR Gate 80 is assumed to be in the constrained translation state, and the negative voltage state is interpreted through a definable translation circuit, though in operation polarizations and therefore circuit design, may be inverted without departing from the scope and context of the disclosed system and method. Additionally, some embodiments may utilize an additional subsequent combinational definable translation circuit wherein the constrained translation circuit and definable translation circuit may therefore be controlled and redefined for an output number sequence, and information state, this may be advantageous wherein controlling a specific number sequence is desired and may have been limited by the constrained translation circuit.

Figure 12:
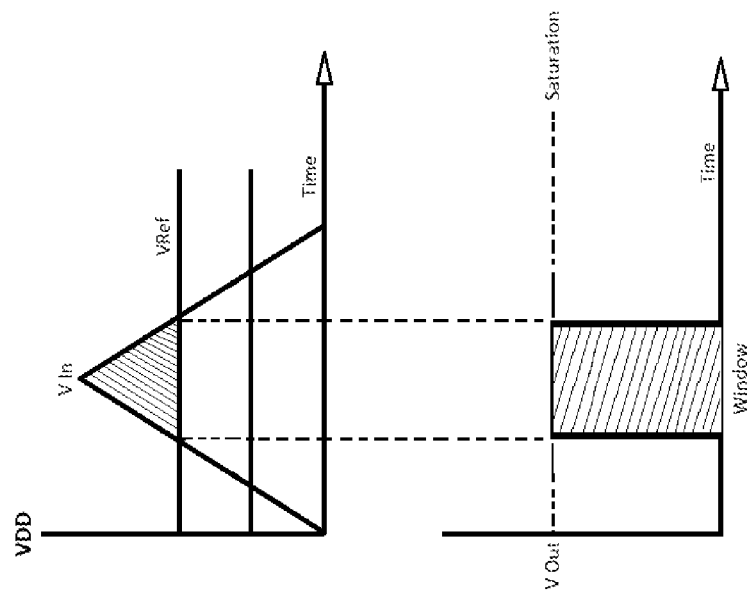
FIG. 12 is a diagram of a voltage schematic showing the voltage reference of dual sense amplifiers.

FIG. 12 is a voltage schematic showing the voltage reference of both sense amplifiers (not shown) wherein one said sense amplifiers READS the charge stored on the bidirectional memory cell as ON if the voltage passes above high state reference VRef outputting a 1, or ON state, and additionally the second sense amplifier READS a negative charge in this manner as a positive charge stored on the bidirectional memory cell. Wherein if this charge similarly crosses above a high point voltage reference VRef will initiate an ON state, or 1 output, in the said second sense amplifier and therefore an OFF state, or 0 in the said first sense amplifier. This design is to ensure that only when a capacitor is charged either in a positive polarity, or negative polarity will either sense amplifier activate its output ON position, therefore allowing logic circuitry to determine the charge state, as well as the polarity, of a specific bidirectional memory cell. This design in additional embodiments could be inverted to allow a low point trigger referencing VREF from the bit lines (not shown), to the sense amplifiers (not shown) inverting the operation.

Figure 13:
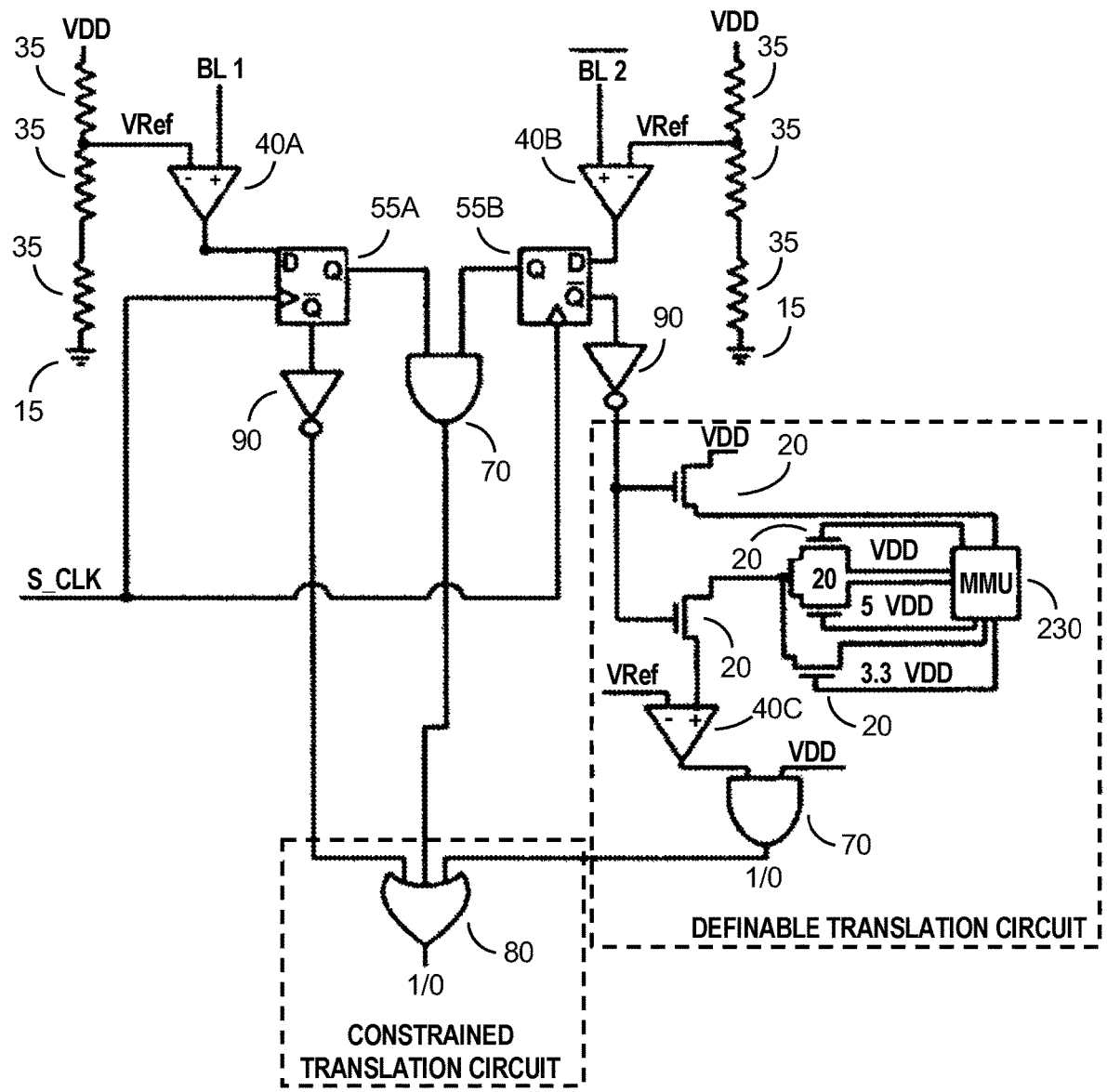
FIG. 13 is a diagram showing a circuit of the device in which the information can be stored on or translated from a negative reverse bias voltage.

FIG. 13 is a diagram showing the operation of the device in which in this embodiment information can be stored on or translated from a negative reverse bias voltage on a bidirectional memory cell, to represent the information stored on the memory cell as being in a 0 and 1 state simultaneously, also referred to as superposition.

The use of superposition in computing is very advantageous in that it allows quantum-based computer algorithms to operate more efficiently than in traditional computations based on a rigid binary single bit state of memory cells during computation. There are specific algorithms designed for quantum computers that allow what is referred to as Quantum Speed up, wherein the ability to run for example a factorial computation, in a traditional computer would require extended and, in some cases, unreasonable time durations. With quantum speed up based on quantum algorithms the same factorial problems may be solved in dramatically reduced time periods.

In this diagram and exemplified embodiment of utilizing a superposition state of bidirectional memory is referenced herein. Where in the operation of this circuit and device, the resultant answer, from a determination of the probability of the current state of the superimposed memory cell (not show), can be utilized to control, and factor in, the probability of said resultant answer. This is done by making a determination of the likely superposition state, and then controlling the circuit to favor said likely result, which may additionally be used for error correction.

This can be accomplished by utilizing as one variation of the embodiment a sense amplifier 40C that is connected to multiple output voltages, and or logic levels, with switches 20 from a memory management unit 230. In this embodiment the memory management unit 230 receives a signal that the state of a bidirectional memory cell is in a negative charge state, or bias from the sense amplifier 40B. At this point the memory management unit 230 may have user intervention, an algorithm, artificial intelligence, or a computational based influence, coupled to additional bidirectional memory cells, that determines what output voltage level or logic level is retransmitted to said sense amplifier 40C, which then influences the results for a READ operation from a superimposed bidirectional memory cell. When the sense amplifier 40C receives the voltage level from the memory management unit 230 the determined reference voltage VRef for the sense amplifier 40C determines the output state of a 0 or 1, based on the incoming voltage from the memory management unit 230. Meaning you can control the likelihood of your output being either a 0 or 1 by controlling either a voltage level, logic level, or the reference voltage of your sense amplifier 40C, that is connected to OR Gate 80 used for subsequent READ operation.

This design is greatly beneficial in that you can use these physical systems to build large networks (pluralities) of bidirectional memory cells (not shown) all capable of this superposition state, which may be coupled to additional bidirectional memory cells able to utilize the influence of these coupled memory cell to influence/interfere their own final measured state of 0 or 1. This is greatly advantageous versus quantum computers that are limited due to a number of factors including signal noise from their operation, as additional quantum bits are added. With the disclose system and method a stable exponentially expandable number of bidirectional memory cells (not shown) in the state of superposition is possible and practically implementable, which is another benefit of the disclosed system and method. This allows a low-cost scalable quantum computational based computer architecture to be possible for the general public, and mass adoption. This versus large expensive energy consuming alternate technologies currently available for alternate quantum computation. Additional embodiments may also greatly benefit by the conversion from existing DRAM memory, circuits, and or systems, into bidirectionally enabled systems. For instance, utilizing the ground line that exists on traditional DRAM for a second bit line (not shown), wherein the incorporation of features, aspects, circuits, and or system would allow the operation and benefit of the disclosed system and method, and are referenced herein as possible embodiments.

The benefit of being able to control the probability of an output state is very beneficial for quantum computations, by controlling the state output likelihood you can utilize this system and method to create programs and algorithms to facilitate and allows a computer that can exploit quantum speed-up. Though in this embodiment an additional sense amplifier 40C determines the output state, based on the voltage received from the memory management unit 230 and then transmitted to an AND Gate 70, this in some embodiments may not be necessary. The memory management unit 230 itself could determine the output state of a superimposed bidirectional memory cell (not shown). In additional embodiments additional control systems and circuits could be used to control the output state of a superimposed bidirectional memory cell, (not shown) without departing from the general premise and scope of the disclose system and method.

In FIG. 13 the operation of bidirectional memory cells (not shown) is READ, or interpreted from memory utilizing two sense amplifiers 40A, 40B, that have a reference voltage that is a high point trigger and connection to the bidirectional memory cell(s) (not shown). Though in additional embodiments a variety of different trigger points, voltage references VRef, and or connection schemes, may be used, without departing from the scope of the disclosure. The reference voltage for the two sense amplifiers 40A, 40B, may be adjusted by utilizing resistors 35 to change the positional trigger point VThresh, and or reference voltage VRef, wherein a power supply connection Vdd, and ground 15 connection can be used for a specific reference, with for instance a Zener diode, to tie down the reference for a non-floating point, though in additional embodiments a floating point reference may be beneficial and is referenced herein as possible embodiments.

The sense amplifier 40A sends a signal to the flip-flop 55A. Based on the current state of the sense amplifier 40A determines which of the outputs of the flip-flop 55A output a ON or OFF, 0 or 1. If the sense amplifier 40A determines that the voltage of bit line 1 BL1 does not cross over it's reference voltage VRef it outputs as 0 state, and the flip-flop 55A outputs a 0, or OFF state through it's non-inverting output Q to AND Gate 70, and an ON state or 1, to NOT Gate 90 by means of its inverting compliment output Q that inverts the inverted state back to an OFF state that sends the signal to the OR Gate 80.

The sense amplifier 40B is used to determine the state of a bidirectional memory cell (not shown) and sends a signal to the flip-flop 55B. Based on the current state of the bidirectional memory cell (not shown) the sense amplifier 40B determines if the bidirectional memory cell is charged or not, and also determines the flip-flop 55B output designations of each output ON or OFF, 0 or 1. If the sense amplifier 40B determines that the voltage of bit line 2 BL2 does not cross over the threshold VThresh reference voltage VRef the sense amplifier 40B outputs as 0, or OFF state, meaning that flip-flop 55B outputs an OFF, or 0 to AND Gate 70, and its inverting compliment output Q signal to a NOT Gate 90 (inverter) that inverts the inverted state back to an OFF state.

The AND Gate 70 receiving two 0's, or OFF, signals will output 0, or OFF, to the OR Gate 80, where the logic of the AND Gate 70 would require two ON states to output to a 1, or ON state and due to the fact this would require both flip flops 55A and 55B to both output a 1, or ON state is logically impossible due to the fact that this would require both sense amplifiers 40A and 40B to pass their individual threshold VThresh, signifying that the capacitor (not shown) was charged in both a positive and negative bias simultaneously. When the OR gate 80 receives two 0 voltages, or false statements, it outputs a zero. If it has received a true statement from NOT Gate 90 and the false statement from AND Gate 70 it will output a 1, or ON state, which may be influenced by the definable translation circuit, wherein in a ON statement or 1 is sent to the OR Gate 80 from the AND Gate 70, even if it has received two OFF states or 0's from NOT Gate 90 and AND Gate 70 it will change its state to ON or 1.

If sense amplifier 40A determines bit line 1 BL1 voltage is above the reference voltage it outputs a 1, or true statement, to flip-flop 55A. That sends out an OFF state, or 0 through its inverting compliment output Q signal to a NOT Gate 90 (inverter) that inverts the inverted state back to an ON state that sends the signal to the OR gate 80 that outputs a 1, or ON state.

Sense amplifier 40B determines the state of charge on a bidirectional memory cell (not shown) by measuring the voltage of the bidirectional memory cell (not shown), where a negative voltage, a negative bias voltage charge state, would be interpreted as a positive voltage, by the sense amplifier 40B. This is accomplished by rotating the orientation of the connection points of the specific capacitor (not shown), by inversing the lead(s), and or connection, of bit line 2 BL2 to sense amplifier 40B, wherein a negative voltage is READ as a positive, and a positive voltage is READ as negative. By changing the orientation of the leads of a capacitor, when READING a charged capacitor, will change the resultant charge polarity statement. In this embodiment this operational method is utilized to ensure the correct interpretation of information stored on a bidirectional memory cell (not shown), interpreted by means of sense amplifier 40A sense amplifier 40B.

The challenge with READING the state of the capacitor in a bidirectional memory cell (not shown) is that the charge stored in either polarization, is the exact inverse of the other. This causes challenges when attempting to determine not only the charge state but the polarization.

For instance, if you were to try and determine the polarization of a charged memory cell (not shown), where sense amplifier A (not shown) was configured as noninverting. Where if the voltage crossed above the reference voltage VRef trigger point VThresh would turn the state to on. And an additional sense amplifier B (not shown) configured in an inverting configuration to initiate a state change, when the voltage crossed below the reference voltage trigger point, would not operate to effectively determine the polarization with the circuit layout as described in FIG. 13. This is because if the capacitor (not shown) was charged in a positive polarization sense amplifier A (not shown) would consider this to have passed the reference voltage and initiated on state because it would be connected to bit line 1 (not shown), and sense amplifier B (not shown) would also consider this had crossed the negative voltage and initiate on state change, as it would be connected to bit line 2 (not shown) this is because they are reading the same charge inversely.

The same challenge would occur if the bidirectional memory cell (not shown) was charged with the negative polarization. This operation of one inverting one noninverting sense amplifier (not shown) or comparator (not shown) would operate effectively in additional embodiments if the positive lead of the capacitor (not shown) was connected to both bit lines (not shown), or sense amplifier A and B (not shown) individually or in connection, where the polarization could be determined if the voltage crossed above the reference in sense amplifier A (not shown), or below the reference sense amplifier B (not shown), where if the voltage did not cross above the upper reference or below the lower reference the state could be determined as OFF, or NO charge present, or false similar to a window comparator design. Where if in additional embodiments the voltage swing from READING a single bit line could be used in conjunction with a window comparator to determine if the bidirectional memory cell capacitor was in a positively charged, or negatively charged, or no charge present state.

If sense amplifier 40B determines bit line 2 BL2 voltage is above the reference voltage VRef, signifying a negative charge on the cell, it outputs an ON state, or 1, to flip-flop 55B through its inverting compliment an output Q signal is sent to a NOT Gate 90 (inverter) that inverts the inverted state back to an ON state that sends the signal to the memory management unit 230. The memory management unit 230 may be used to directly send a variety of voltage levels, and or logic levels, or directly drive transistors 20, 20, 20, that control power supplies at different voltage levels directly to a sense amplifier 40C, or through a transistor 20, or transistors 20, to allow a change in the outcome of a superimposed bidirectional memory cell (not shown) based on a number of factors including the likely probability of it being in one of the 0 or 1 position states. This is accomplished in this embodiment by changing the voltage state sent to the sense amplifier 40C wherein the control of the voltage state determines if a voltage can pass the reference voltage VRef of the sense amplifier 40C thereby outputting a 1, or ON statement, or if the voltage falls below the reference voltage and outputs a 0 or, OFF statement.

In additional embodiments the memory management unit 230 may also be used to control and determine which circuit, system, gate, component, deposits its stored information into the buffer, then register (not shown) that being individually, combined, separately, and/or any additional or pleural circuits. Wherein in this embodiment a single output from a superimposed bidirectional memory cell, influenced by the definable translation circuit is deposited and/or available for reference.

The benefit of the disclosed system and method is that by utilizing a bidirectional memory cell, that may comprise any plurality, and or comprise an array(s), where this specific implementation allows the ability to scale the amount of bidirectional memory cells that operate in a state of superposition to vast amounts of cells with a relatively simple straightforward construction and operation. This is greatly advantageous over "typical" quantum computing technologies in that scaling qubits in quantum computers is extremely challenging, costly and time-consuming, and where theoretical limits to the quantity of qubits have been proposed. It is therefore another object of the present invention to operate pluralities of bidirectional memory cells in the state of superposition, wherein pluralities could encompass vast quantities including nonlimiting examples of billions and or trillions of connected, independent bidirectional memory cells and/or arrays, and are referenced herein as possible embodiments.

Additionally, separate embodiments may also utilize cross coupling between bidirectional memory cell logic circuits, wherein logic circuits may influence, and or be influenced, by a singular or plurality of subsequent bidirectional memory cell logic circuits, and or bidirectional memory cells, where operation could be controlled in some embodiments by utilizing a clock cycle to initiate a state change between logic circuits within a tristate bidirectional memory cell system. For instance the coupling of bidirectional memory cells could be accomplished by connecting to adjacent bidirectional memory cells logic circuits for instance nonlimiting examples may include, adder and subtractor logic circuits, including half adder, full adder, half subtractor, full subtractor, carry lookahead adder, ripple carry adder, binary multiplier, binary divider, carry save adders, adder-subtractor, compressors, tank circuit(s), where the state of a bidirectional memory cell can be determined to be at a certain amplitude, and by using the above listed analog logic circuits you can change the amplitudes of bidirectional memory cells and influence and or interfere with the adjacent bidirectional memory cells through a logical operation and coupling, where the individual steps are broken into specific operations controlled by a nonlimiting example of clock cycle step. Then by utilizing the amplitudes of individual bidirectional memory cells to influence the definable translation circuits, by changing either the trigger points VRef/VThresh and or voltage amplitude, you can change the probability of a superimposed bidirectional memory cell to reflect the most probable final READ state of 0 or 1. And therefore determine the final outcome of the computational operation based on the most probable states of all of the interconnected and coupled bidirectional memory cells. Where different constructions and operations to facilitate the above described computation are reference herein as possible embodiments. As well the logic circuits, including definable translation circuits and components, may be initialized (pre-set and are pre-designed) to allow arbitrary probabilities of a likely state of bidirectional memory cell(s), meaning the likelihood of a bidirectional memory cell, in a superposition, can be assumed to be initialized at an arbitrary value, or likely probability of being in either a 1 or 0 state, and is reference herein as possible embodiments.

Additionally, separate embodiments may utilize the operation of the disclosed system and method for bidirectional memory in an ultra low temperature environment (cryogenic) device or vessel. These ultra low temperatures for operation may operate in the range typical to quantum computers that being a few millikelvin to a few kelvin, this low temperature in many instances is to allow for superconductivity of the operational elements and circuitry. Though this reference to a specific temperature range has been used to describe a possible embodiment it should be noted that realistic embodiments can operate at virtually any temperature range normal to computer processing and circuit operation, and this reference is to describe specific additional embodiments for the disclosed system and method.

Additionally, it may be beneficial to utilize the disclose system and method in conjunction to a singular or plurality of inductors in different embodiments. The use of inductors in these embodiments could be used a variety of ways, a few specific non-limiting references may include; the use of inductors while operating the device with bidirectional memory cells in a state of superposition. For instance, utilizing an inductor paired with a bidirectional memory cell wherein this forms a commonly used tank circuit, and or resonance circuit. These types of circuits are well known and utilized throughout a vast amount of systems and devices therefore only a brief mention of their operation will be included, specifically their ability to create an alternating current flow charging and discharging the capacitor through the inductor, which in some embodiments may utilize multiple transistors to control the bidirectional memory cell and or a Josephson junction. It should be noted this bidirectional memory cell utilizing an inductor may be coupled to a plurality of additional bidirectional memory cells and or inductors, which may be accomplish a number of ways, including non-limiting examples of ferromagnetic core coupled I joint, U joint, C joint, H joint, H joint enclosed, where inductors may be interconnected, intertwined, proximity connected, induction based connection, and or through a switch or switches such as transistors, or logic gates, and or a direct circuit connection. It should be noted this bidirectional memory cell utilizing an inductor may be operated at virtually any temperature common to operable circuit temperatures including ultra low temperatures as described above. Which may be additionally used to influence or interfere with a singular or plurality of subsequent bidirectional memory cells meant to affect their output state likely probability.

Figure 14:
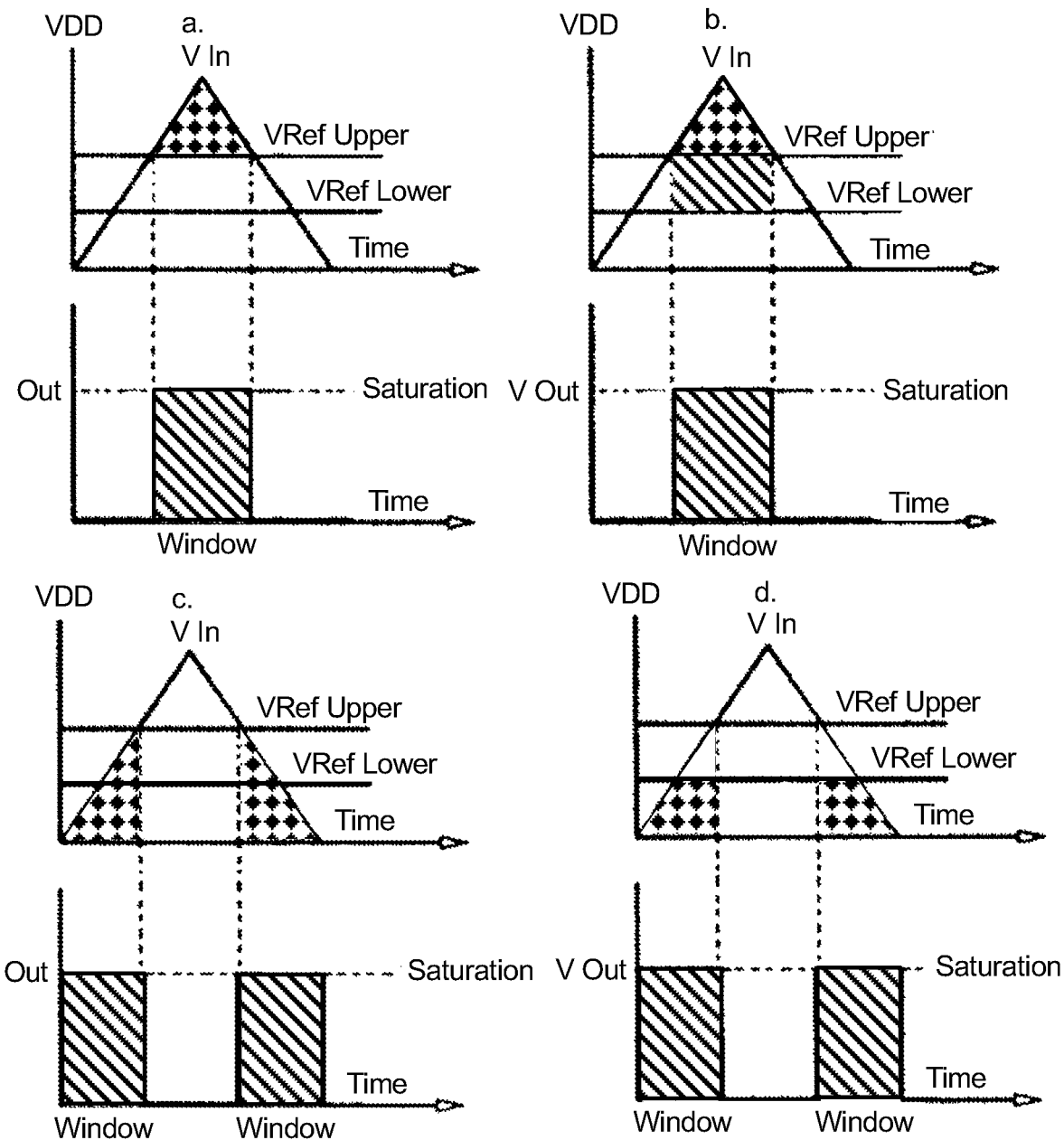
FIG. 14 is a diagram representing four possible configurations of the definable translation circuits ability to affect the READ state of bidirectional memory cell(s).

FIG. 14 is a diagram representing four possible configurations of the definable translation circuits ability to affect the READ state of a or plurality of bidirectional memory cell(s) in a state of superposition. By utilizing different upper and lower voltage reference points VRef Upper, VRef Lower, and or different voltages, including logic levels you can affect the probability of a superimposed bidirectional memory cell(s) final state during READ operations. For instance, if the state of the constrained translation circuit was maintained at output 0, or OFF by creating a lower voltage reference VRef Lower and utilizing a higher voltage state output, from a non-limiting example of the memory management unit, you can cause a non-limiting example of a sense amplifier to change its state and output of 1, or ON state, which could be the result of an operation that determined specific bidirectional memory cells individual amplitudes. Which in this non-limiting example is sent to an AND Gate to the OR Gate causing a change its output state to an ON, or 1 state, thereby influencing the output state of the superimposed memory cell.

Wherein the inverse of this operation could occur, if instead of having a lower reference voltage VRef Lower, you set the voltage reference at a higher trigger point VRef Upper with a lower voltage output from the memory management unit, would cause the sense amplifier to remain below its trigger point VRef Upper therefore insuring a continuous OFF, or 0 output state, sent to the AND Gate, which will then maintain its 0, or OFF output state, sent to the OR Gate which maintains its 0, or OFF output state.

These are just a few non-limiting examples, where utilizing the disclosed system and method to design circuits and or systems to influence output the states of bidirectional memory cells and or READ logic circuits may be derived including by, but not limited to; adjusting the probability of a different state based on the amount of time since a capacitor, a bidirectional memory cell was last refreshed, thereby causing a drop in the capacitors voltage state and the change in the probability of the output state of said bidirectional memory cell, the ability to influence the output state of a bidirectional memory cell by utilizing various influencing techniques such as; utilizing voltages, comparators, sense amplifiers, window comparators, voltage thresholds, trigger points, capacitor voltage states, determined amplitude, amplitude, and any combination or plurality to accomplish the intent of influencing the output state of a bidirectional memory cell, either in a state of superposition or not, and any possible embodiment utilized for the influence of said bidirectional memory cell, in a state of super position, or not in a state of superposition, are referenced herein as possible embodiments.

Figure 15:
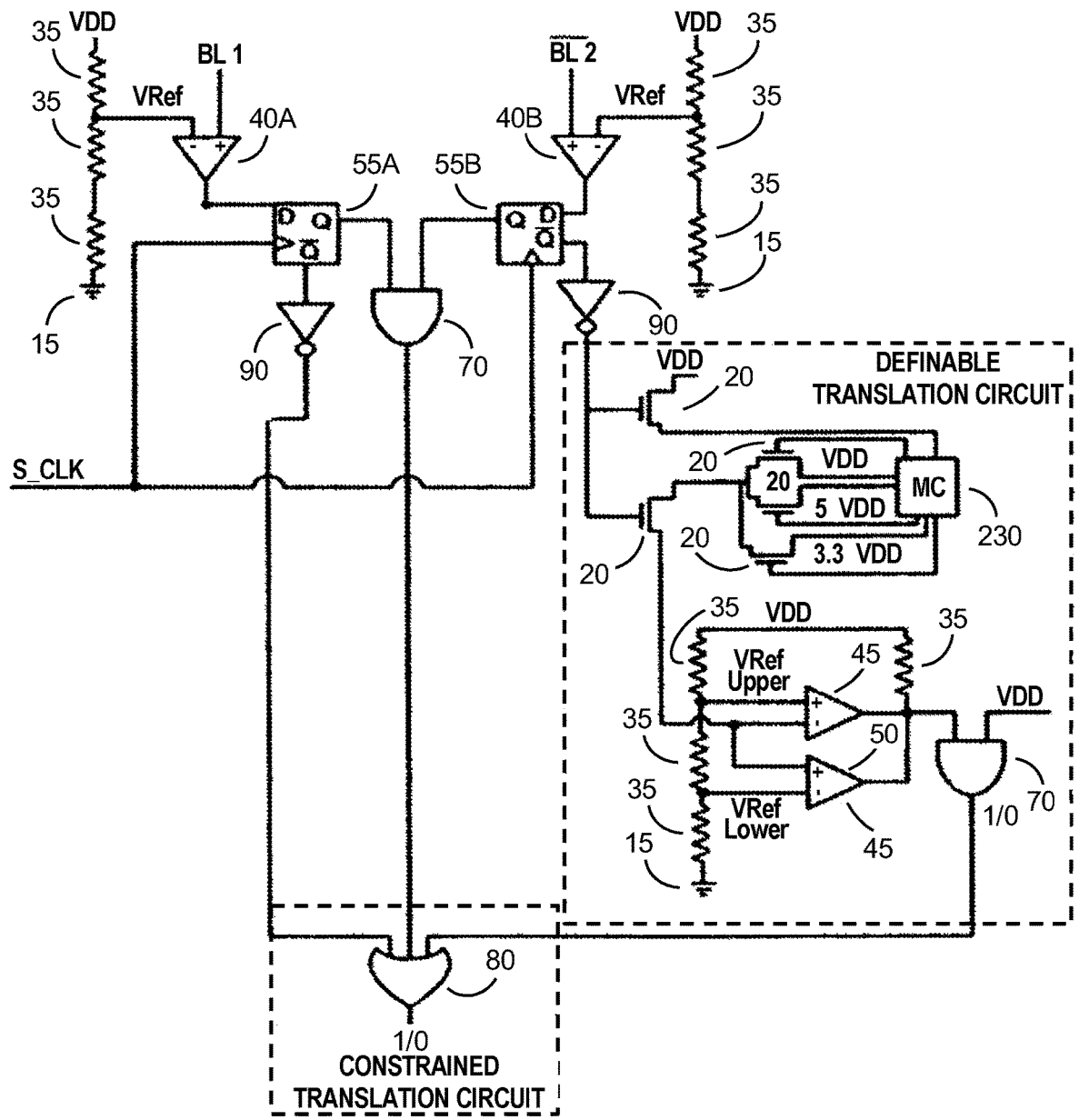
FIG. 15 is a diagram where the negative reverse bias voltage stored on a bidirectional memory cell, represents the information as being in a 0 and 1 state simultaneously, also referred to as superposition.

FIG. 15 is a diagram showing the operation of the device in which in this embodiment information can be stored on or translated from a negative reverse bias voltage on a bidirectional memory cell, to represent the information stored on the memory cell as being in a 0 and 1 State simultaneously, also referred to as superposition.

In this diagram an exemplified embodiment of utilizing a superposition state of bidirectional memory is referenced herein. Where in the operation of this circuit and device, the resultant answer, from a determination of the probability of the current state of the superimposed memory cell (not show), can be utilized to control, and factor in, the probability of said resultant answer. This is done by making a determination of the likely superposition state, which may utilize influence and or interference from a plurality of bidirectional memory cells, and then controlling the circuit to favor said likely result, and or may additionally be used for error correction.

This can be accomplished by utilizing as one variation of the embodiment a window comparator comprised of two sense amplifiers 45, 50, that may additionally connect to multiple output voltages, and or logic levels, with switches 20 from a memory management unit 230. In this embodiment the memory management unit 230 receives a signal that the state of a bidirectional memory cell is in a negative charge state, or bias from the sense amplifier 40B, flip flop 55B and NOT Gate 90. At this point the memory management unit 230 may have user intervention, an algorithm, artificial intelligence, or a computational based influence (interference), and or coupled to additional bidirectional memory cells, that determines what output voltage level, or logic level, is retransmitted to said window comparator comprised of sense amplifiers 45, 50, which then influences (generally called quantum interference) the results for a READ operation from a superimposed bidirectional memory cell. When the sense amplifiers 45, 50, receive the voltage level state from the memory management unit 230 the determined reference voltages VRef Upper, VRef Lower, determine the output state of a 0 or 1, based on the incoming voltage from the memory management unit 230, and the chosen window of operation by controlling resistors 35. Meaning you can control the likelihood of your output being either a 0 or 1 by controlling either a voltage level, logic level, or the reference voltages of your sense amplifiers 45, 50, that is connected to an OR Gate 80 used for subsequent READ operation. It should be noted that the sense amplifiers 45, 50, in this embodiment comprise an inverting and a non-inverting sense amplifier, and the window of operation, output state, or ON state, may be designed to operate between the two reference voltages VRef Upper and VRef Lower, and or operate outside of the two reference voltages VRef Upper and VRef Lower.

This design is greatly beneficial in that you can use these physical systems to build large networks (pluralities) of bidirectional memory cells (not shown) all capable of this superposition state, which may be coupled to additional and or subsequent bidirectional memory cells able to utilize the influence/interference of these coupled memory cell to influence their own final measured state of 0 or 1. This is greatly advantageous versus quantum computers that are limited due to a number of factors including signal noise from their operation, as additional quantum bits (qubits) are added. With the disclose system and method a stable exponentially expandable number of bidirectional memory cells (not shown) in, or not, the state of superposition is possible and practically implementable, which is another benefit of the disclosed system and method.

This allows a low-cost scalable quantum computational based computer architecture to be possible for the general public, and mass adoption. This versus large expensive energy consuming alternate technologies currently available for the similar quantum computation. Additional embodiments may also greatly benefit by the conversion from existing DRAM memory, circuits, and or systems, into bidirectionally enabled systems. For instance, utilizing the ground line that exists within traditional DRAM circuit for a second bit line (not shown), wherein the incorporation of the disclosed system and methods; features, aspects, circuits, and or systems, would allow the operation and benefit of the disclosed system and method, and are referenced herein as possible embodiments.

Additionally, some embodiments may utilize the operation of SRAM (static random-access memory) (not shown) for a similar operation to bidirectional DRAM, in that by incorporating additional transistors into the typical 6 transistor SRAM design, for instance mirroring the original 6 transistors in a reverse current flow configuration. Additionally, a similar operation may be accomplished by simply reversing the voltage potentials of the bit lines used during an SRAM WRITE operation, as well as utilizing bidirectional transistors to cause the current to flow into an SRAM cell in an inverse orientation to traditional SRAM memory cell current flow, and by doing so you can exploit and benefit from the disclosed system and method. Further by utilizing the disclosed system and method to determine an opposite polarization (reverse current flow), in conjunction with the additional non-limiting examples of; sense amplifiers, READ logic circuitry, translation circuits, couplings, influence/interference, you can operate SRAM memory cells to utilize the benefits described herein, and possible embodiments are therefore referenced herein. This operation of SRAM may prove to be greatly beneficial in that the latency of SRAM memory cells is greatly reduced versus traditional DRAM, where due to the speed of operation SRAM memory cells typically operate in circuit systems that require high-speed operation, for instance the cache memory of the CPU. And by utilizing the disclosed system and method and referenced SRAM embodiments quantum-based computations, including mathematical computations can occur within critical systems of a computer, at expedited speed, and may in some embodiments operate in conjunction with the disclosed bidirectional DRAM memory. Where this type of integration may prove additionally beneficial in direct communications, that due to the operation of the improved SRAM memory can directly receive information, perceive its polarization, specific current flow, and compute information in real time based on a tri-state of current flow, and subsequent bidirectional memory cells.

The benefit of being able to control the probability of an output state is very beneficial for quantum-based computations, by controlling the state output likelihood you can utilize this system and method to create programs and algorithms to facilitate and allow a computer that can exploit quantum speed-up. Though in this embodiment additional sense amplifiers 45, 50 determines the output state, based on the voltage received from the memory management unit 230 and then transmitted to an AND Gate 70, this in some embodiments may not be necessary. The memory management unit 230 itself could be used to determine the output state of a superimposed bidirectional memory cell (not shown). In additional embodiments additional control systems and circuits could be used to control the output state of a superimposed bidirectional memory cell (not shown) without departing from the general premise and scope of the disclose system and method, including a non-limiting example of memory cell coupling, which may be planar or 3-dimensionally, and exploit influence and interference to affect a result probability and or amplitude.

In FIG. 15 the operation of bidirectional memory cells (not shown) is READ, or interpreted from memory utilizing two sense amplifiers 40A, 40B, that have a reference voltage that is a high point trigger and connection to the bidirectional memory cell(s) (not shown). Though in additional embodiments a variety of different trigger points, voltage references VRef, and or connection schemes, may be used, without departing from the scope of the disclosure. The reference voltage for the two sense amplifiers 40A, 408, may be adjusted by utilizing resistors 35, and or digital resistance and or current control, for instance a non-limiting example of a the digital potentiometer(s), to change the positional trigger point, and or reference voltage VRef, wherein a power supply connection VDD, and ground 15 connection can be used for a specific reference to tie down the reference for a non-floating point with a non-limiting example of a Zener diode, though in additional embodiments a floating point reference may be beneficial and is referenced herein as a possible embodiment.

The sense amplifier 40A sends a signal to the flip-flop 55A, ware based on the current state of the sense amplifier 40A determines the output state of the flip-flop 55A outputs. If the sense amplifier 40A determines that the voltage of bit line 1 BL1 does not cross over it's reference voltage VRef it outputs as 0 state, meaning the flip-flop 55A outputs a 0, an OFF, to the AND gate 70, and its inverting compliment output Q sends an ON signal to a NOT Gate 90 (inverter) that inverts the inverted state back to an OFF state that sends the signal to the OR Gate 80.

The sense amplifier 40B is used to determine the state of a bidirectional memory cell (not shown) and sends a signal to the flip-flop 55B. Based on the current state of the bidirectional memory cell (not shown) the sense amplifier 40B determines the output state of the flip-flop 55B outputs. If the sense amplifier 40B determines that the voltage of bit line 2 BL2 does not cross over the reference voltage VRef the sense amplifier 40B it outputs as 0 state, meaning that flip-flop outputs is a 0 or OFF from it non-inverting Q output, to the AND gate 70, and its inverting compliment output Q sends an ON signal to a NOT Gate 90 (inverter) that inverts the inverted state back to an OFF state that sends the signal to the OR Gate 80.

The AND Gate 70 receiving two 0's, or OFF signals will output 0, or OFF, to the OR Gate 80, where the logic of the AND Gate 70 would require two ON states to output to a 1, or ON state. Due to the fact this would require both flip flops 55A and 55B to both output a 1, or ON state, is logically impossible due to the fact that this would require both sense amplifiers 40A and 40B to pass their individual threshold VRef, signifying that the capacitor (not shown) was charged in both a positive and negative bias simultaneously. When the OR gate 80 receives two 0 voltages, or false statements, it outputs a zero. If it has received a true or ON statement from NOT Gate 90 and the false or OFF statement from AND Gate 70 it will output a 1 or ON, which may be influenced by the definable translation circuit, wherein in a ON statement or 1 is sent to the OR Gate 80 from the AND Gate 70, even if it has received two OFF states, or 0's, from Not Gate 90 and AND Gate 70, it will change its state to ON or 1.

If sense amplifier 40A determines bit line 1 BL1 voltage is above the reference voltage it outputs a 1, to flip-flop 55A that sends a 1, or ON state, to AND Gate 70 through its non-inverting output Q, and its inverting compliment output q sends an OFF signal to a NOT Gate 90 (inverter) that inverts the inverted state back to an ON state that sends the signal to the OR Gate 80.

Sense amplifier 40B determines the state of charge on a bidirectional memory cell (not shown) by measuring its voltage, of the bidirectional memory cell (not shown), where a negative voltage, a negative bias voltage charge state, would be interpreted as a positive voltage, by the sense amplifier 40B. This is accomplished by defining the orientation of the connection points of the specific capacitor (not shown), by inversing the lead(s), and or connection, of bit line 2 BL2 to sense amplifier 40B, wherein a negative voltage is READ as a positive, and a positive voltage is READ as negative. By changing the orientation of the leads of a capacitor (not shown), when READING a charged capacitor, will change the resultant charge polarity statement. In this embodiment this operational method is utilized to ensure the correct interpretation of information stored on a bidirectional memory cell (not shown), interpreted by means of sense amplifier 40A sense amplifier 40B.

The challenge with READING the state of the capacitor (not shown) in a bidirectional memory cell (not shown) is that the charge stored in either polarization, is the exact inverse of the other. This causes challenges when attempting to determine not only the charge state but the polarization.

For instance, if you were to try and determine the polarization of a charged memory cell (not shown), where sense amplifier A (not shown) was configured as noninverting. Where if the voltage crossed above the reference voltage trigger point (Vthresh) would turn the state to ON. And an additional sense amplifier B (not shown) configured in an inverting configuration to initiate a state change, when the voltage crossed below the reference voltage trigger point (Vthresh), would not operate to effectively determine the polarization with the circuit layout as described in FIG. 15. This is because if the capacitor (not shown) was charged in a positive polarization sense amplifier A (not shown) would consider this to have passed the reference voltage and initiated a ON state because it would be connected to bit line 1 (not shown), and sense amplifier B (not shown) would also consider this had crossed the negative voltage and initiate an ON state change, as it would be connected to bit line 2 (not shown) this is because they are reading the same charge inversely.

The same challenge would occur if the bidirectional memory cell (not shown) was charged with the negative polarization. This operation of one inverting one noninverting sense amplifier (not shown) or comparator (not shown) would operate effectively in additional embodiments if the positive lead of the capacitor (not shown) was connected to both bit lines (not shown) for a READ operation, or sense amplifier A and B (not shown) individually or in connection, where the polarization could be determined if the voltage crossed above the reference in sense amplifier A (not shown), or below the reference sense amplifier B (not shown), where if the voltage did not cross above the upper reference or below the lower reference the state could be determined as OFF, or 0 with no charge present, or false. Where if in additional embodiments the voltage swing from READING a single bit line could be used in conjunction with a window comparator to determine if the bidirectional memory cell capacitor was in a positively charged, or negatively charged, or no charge present state, where a exaggerated higher voltage swing would show a negative polarization if read from subsequent bit line(s), where currently certain methods utilize a lower voltage swing to determine a charge is present or not with traditional DRAM memory.

If sense amplifier 40B determines bit line 2 BL2 voltage is above the voltage threshold VThresh, signifying a negative charge on the cell, it outputs an ON state, or 1, sent to flip-flop 55B that if a signal is received from a sense clock of clock signal will initiate a latch, and or state change or not.

The flip-flop 55B with output a 1, or ON state to AND Gate 70 through its non-inverting output Q, its inverting compliment output $\overline{Q}$ sends an OFF signal to a NOT Gate 90 (inverter) that inverts the inverted state back to an ON state that sends a signal to the memory management unit 230. The memory management unit 230 may be used to directly send a variety of voltage levels, and or logic levels, or directly drive transistors 20, 20, 20, that control power supplies at different voltage levels directly to a sense amplifiers 45, 50, or through a transistor 20, or transistors 20, to allow a change in the outcome of a superimposed bidirectional memory cell (not shown) based on a number of factors including the likely probability of it being in one of the 0 or 1 position states. This is accomplished in this embodiment by changing the voltage state sent to the sense amplifiers 45, 50 wherein the control of the voltage state determines if a voltage is between or outside the voltage thresholds of the sense amplifiers 45, 50, thereby outputting a 1, or ON statement if within the upper and lower thresholds, or if the voltage falls below or above the voltage thresholds it outputs a 0 or, OFF statement. In additional designs operate to invert the amplifiers 45,50, thresholds outputting a 1, or ON statement if the voltage is outside the upper and lower thresholds, or if the voltage falls within the voltage thresholds it outputs a 0 or, OFF statement.

In additional embodiments the memory management unit 230 may also be used to control and determine which circuit, system, gate, component, deposits its stored information into the buffer (not shown), cache (not shown), register (not shown) that being individually, combined, separately, and/or any additional or pleural circuits. Wherein in this embodiment a single output, and or plurality, from a superimposed bidirectional memory cell (s), influenced by the definable translation circuit is deposited and/or available for reference.

The benefit of the disclosed system and method is that by utilizing a bidirectional memory cell, that may comprise any plurality, and or comprise an array(s) plurality, where this specific implementation allows the ability to scale the amount of bidirectional memory cells that operate in a state of superposition to vast amounts of cells with a relatively simple straightforward construction and operation. This is greatly advantageous over "typical" quantum computing technologies in that scaling qubits in quantum computers is extremely challenging, costly and time-consuming, and where theoretical limits to the quantity of qubits have been proposed. It is therefore another object of the present invention to operate pluralities of bidirectional memory cells in the state of superposition, wherein pluralities could encompass vast quantities including nonlimiting examples of tens, hundreds, thousands, millions, billions, trillions, of connected, independent bidirectional memory cells and/or arrays, and are referenced herein as possible embodiments.

Additionally, separate embodiments may also utilize cross coupling between bidirectional memory cell logic circuits, wherein logic circuits may influence, and or be influenced, by a singular or plurality of subsequent bidirectional memory cell logic circuits, and or bidirectional memory cells, and are reference herein as possible embodiments.

Figure 16:
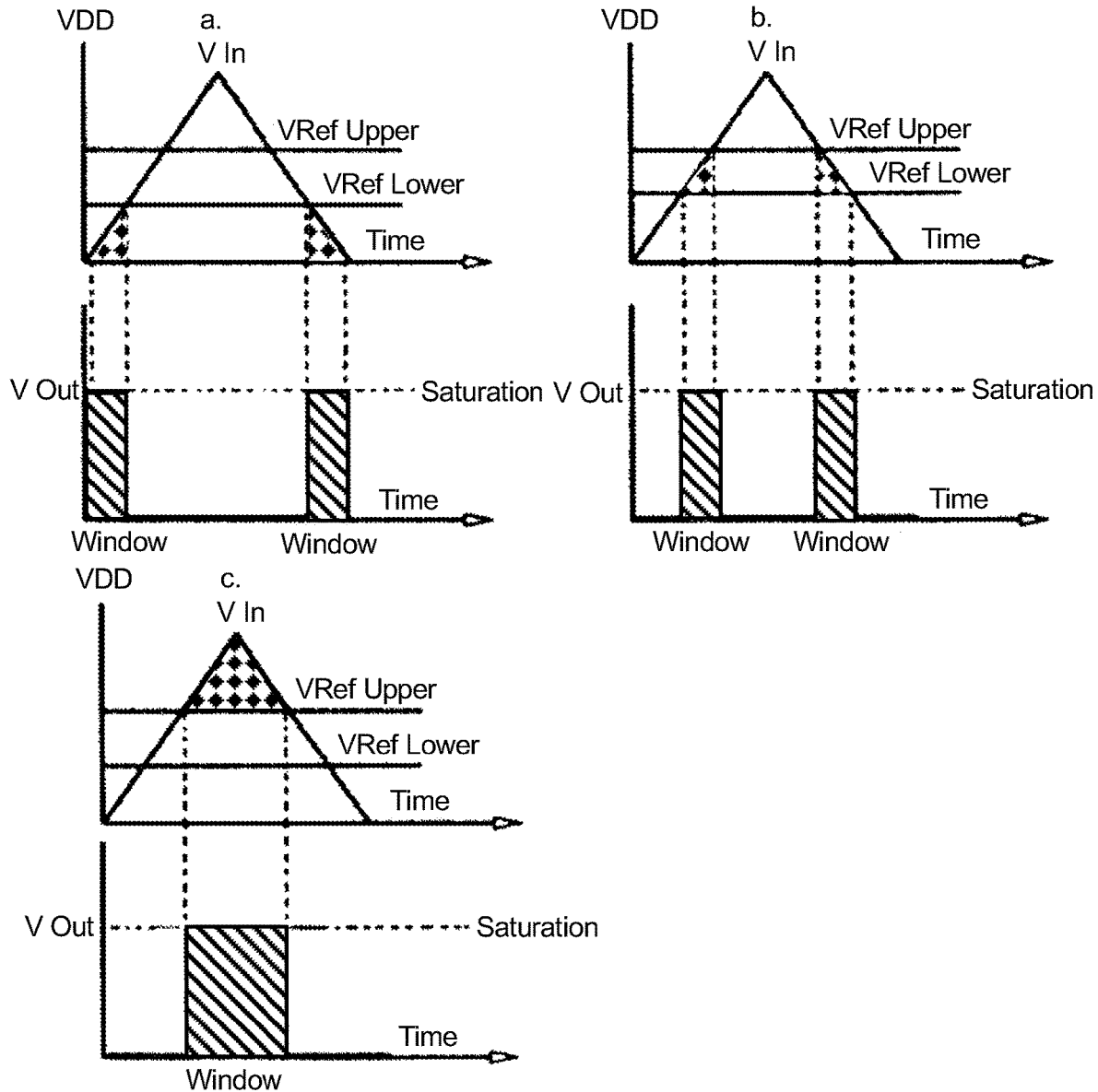
FIG. 16 is a diagram representing possible configurations of the definable translation circuits ability to affect the state bidirectional memory cell(s) in a state of superposition.

FIG. 16 is a diagram demonstrating possible configurations demonstrating the definable translation circuits ability to affect the state of a singular, or plurality, of bidirectional memory cell(s) in a state of superposition. By utilizing different upper and lower voltage reference points or thresholds, VRef Upper, VRef Lower, and or different voltages, including logic levels you can affect the probability of a superimposed bidirectional memory cell(s) final state during READ operations. For instance, if the state of the constrained translation circuit was maintained at output 0, or OFF by creating a lower voltage threshold Vthresh Lower and utilizing a higher voltage state output, from a non-limiting example of the memory management unit, you can cause a non-limiting example of a sense amplifier to change its state and output of 1, or ON state. Which in this non-limiting example is sent to an AND Gate to the OR Gate causing a change its output state to an ON, or 1 state, thereby influencing the output state of the superimposed memory cell. Wherein the inverse of this operation could occur, if instead of having a lower reference voltage VRef Lower, you set the voltage reference at a higher trigger point VRef Upper with a lower voltage output from the memory management unit, would cause the sense amplifier to remain below its trigger point VThresh therefore insuring a continuous OFF, or 0 output state, sent to the AND Gate, which will then maintain its 0, or OFF output state, sent to the OR Gate which maintains its 0, or OFF output state.

This reference diagram demonstrates how the probability of a bidirectional memory cell (not shown) being in any one state of superposition can be altered so that the most likely probability, or inversely the most unlikely probability, can be conveyed as the information stored on said bidirectional memory cell. By altering the likelihood that the information stored on a bidirectional memory cell (not shown) is one result or another, you can exploit the concept state of superposition to more accurately reflect the likelihood of a result. This ability to more accurately reflect the likely outcome of a computation can be used to improve accuracy as well as lower the randomization of classical quantum computer computation. This allows quantum algorithms to process information as if each memory cell was in both states of 0 and 1 simultaneously, while at the same time being able to control, through physical systems, the likelihood of a single memory cells (not shown) information state, and therefore allow for more accurate result from a computational process.

These are just a few non-limiting examples, where utilizing the disclosed system and method to design circuits and or systems to influence the output state of bidirectional memory cells and or READ logic circuits may be derived by utilizing various influencing techniques such as, but not limited to; adjusting the probability of a different logic state based on the amount of time since a capacitor, a bidirectional memory cell was last refreshed, thereby causing a drop in the capacitors voltage state and the change in the probability of the output state of said bidirectional memory cell, utilizing voltages, comparators, sense amplifiers, window comparators, voltage thresholds, trigger points, capacitor voltage states, defined amplitude, amplitude, coupling, influence, interference and any combination or plurality to accomplish the intent of influencing the output state of a bidirectional memory cell, either in a state of superposition or not. This desired state and therefore likely outcome, output information, can be based on probability, likelihood, improbability, unlikelihood, a specific state, an inverse specific state, which may be controlled through manual interaction, algorithm, computer code, artificial intelligence, mathematical statement and/or automatic interaction, where though the information is almost certainly based on controlling the voltage references and voltage inputs, the final information state is not known or certain until conveyed to the buffer (not shown), cache (not shown), register (not shown), processor (not shown), or CPU (not shown). Wherein, within the actual meaning and scope of the disclosure any possible embodiment utilized for the influence of said bidirectional memory cell, in a state of super position, or not in a state of superposition, are referenced herein as possible embodiments.

Additionally, integrated circuits or "IC" are arrangements of electronic components integrated into generally a single package or grouping, the design and function of which can vary significantly and lists into the hundreds of thousands of designs. In the disclosed system and method an IC(s) may be used to accomplish the action of controlling a bidirectional memory cell, or (capacitor(s)), and their operation including; charging, and or discharging, and or connection, and or disconnection, and electric power control by means of the switches, and may control various systems, circuits and their operations including power systems, feedback, looping circuits, current control, voltage control, load and or simulated or virtual loads including electronic loads and or dummy loads and resistance, chokes, snubbers, signals, current flow and measurement. The wide combinational arrangements and component mixes of IC's and their continuous development and repackaging defeat the specific inclusion and reference to specific IC's, their use and application in the disclosed system and method other than example systems and operation, and as such any reference to a specific IC or device is made with the assertion that the function or variation of the function the IC's preforms and or is intended to preform may be accomplished in a multitude of combinational arrangements and designs, the resultant function of which is in fact the invention and disclosure, and that the specific IC that preforms or is intended to perform the function, or variation of the function is arbitrary, and any variation and or combination of components, and or IC's, that facilitate the action and or operation and or produce the intended result of the disclosed system and method are heretofore incorporated as part of this disclosure and are referenced herein as possible embodiments.

Due to the fact that the apparatus implementing the system and method of the present disclosure is composed of, to a great extent, electronic components and circuits that are known to those skilled in the art, circuit construction and operation will not be elaborated to a further extent then considered necessary for the understanding and appreciation of the fundamental concepts of the disclosure in order not to obfuscate and or distract from the teachings of this disclosure.

The management system uses a system for managing energy, accumulation, storage, switch, feedback, power conversion and control, and discharge system hereinafter referred to as "management system" defined as; to handle, direct, govern, or control in action or in use, the device and it's functions, processes, actions, tasks, activities, systems, and given or directed instructions, the input and output characteristics of charging and discharging circuits, feedback, looped circuits, circuits, energy sources and or electricity supply, driving actions, motors, magnetic fields, oscillation cycles, memory, controls, and components.

The device may be connected and controlled by any number of management systems and operational techniques and possible embodiments and functions of possible embodiments may include one or more of the following non-limiting examples including; a system controller or microcontroller, embedded microprocessor, integral controller, derivative controller, system-on-a-chip, digital signal processor, transistor oscillation circuit, semiconductor oscillation circuit, comparator, differential sense amplifiers, sense amplifier, op amp, decade counter, silicone controlled rectifier, triac, field programmable gate array, or paired with an existing CPU, in a non-limiting example of a master and slave configuration. The controller may be controlled by a computer code or script, program, system, manual control, embedded system, or artificial intelligence, controlling commands of the controller connected to the circuit and may use a plurality and multitude of different switching devices and current and polarity control devices and may comprise different switching device and or capacitor/electrostatic storage device arrangements.

The input and output of each capacitor and or bidirectional electrical storage device may be connected permanently and or not permanently to the device, circuit(s), separate output switches, or a single switch or relay or not, and may include relay poles, which could be any number of different types or styles of relay's or transistors, thyristor, or layered semi-conductive material designed for electronically controlled switching, relays, controlled by a CPU, or microcontroller, embedded microprocessor, integral controller, derivative controller, system-on-a-chip, digital signal processor, transistor oscillation circuit, semiconductor oscillation circuit, silicone controlled rectifier, triac, field programmable gate array, or paired with an existing CPU, in a non-limiting example of a master and slave configuration. The CPU may be controlled by a computer code or script, program, manual interface, embedded system, or artificial intelligence, that tells the system controller, to send a signal to relay's and or switches for controlling charging operations, which may be connected to a charge booster or multiplier circuit and or power converter and may feedback into the circuit, which may discharge through a current limiting device(s), system, circuit, load, and or another storage device, and or a separate electric circuit to create usable work.

Additionally some embodiments may utilize a management system as a component of the device which may control various functions some or all of which may consist of, the operation of all electronically operated components; the charging and discharging and combinational arrangements of bidirectional memory cells; power regulation means for regulating power; a memory section, a bidirectional memory section; a search starting means for starting a search; measurement data acquiring means for acquiring measurement data and magnetic field data and electric power data, the magnetic field data being measured values of energy sources and or memory systems. The electric power data representing information associated with and required for operation, and used by the management system for charging operations, including but not limited to bidirectional memory cell charging and discharging. Functions may also include deriving means for deriving a relational equation that holds between the magnetic field data and electric power data to maintain target values including voltage and current states.

Monitoring functions for abnormal state determining and may include means for determining whether or not the energy source, a collection device, a bidirectional memory cell, or any energy switching, energy transforming, feedback systems, or managed circuits are in an abnormal state. Searching functions and a search procedure, selecting means for selecting, and in accordance with a result of determination of the abnormal state determining means, a procedure for managing abnormal energy sources, magnetic fields, accumulation devises, capacitors/electrical potential storage devices, bidirectional memory cells, energy switching devises, transforming devices, feedback and or looped circuits, management circuits.

In some embodiments, the management system is needed to facilitate managing the electric current, then storing the collected charges on for instance a bidirectional memory cell, and or switching collection devices (bidirectional memory cell) in circuit orientation, and or discharging collected charges, and or converting output voltage, and or looping current back into the circuit, then switching accumulators and or electrical storage devices; at a controllable rate, that may be replicated and controlled to an extremely high number of pluralities and or charging circuits within one or more devices, charging one or more electrostatic storage devices (bidirectional memory cells) simultaneously, alternately, congruently, or not. To maximize energy from an energy source and or accumulators and or electrical storage devices, can be accomplished with current and voltage measuring devises, switches, accumulators and or electrical storage devices and or including capacitors, dc-dc charge booster or multiplier, transformers and or sequential and or parallel and or series arrangements of bidirectional memory cells. And in some embodiments a simplified management system may be beneficial utilizing some and or different arrangement of listed or other functions, and in some embodiments utilizing no management system instead using current oscillators, comparators, op amps, decade counter, where this simplified system may be advantageous.

Each circuit and module is an electrically connected system of components, and may be managed by a management system, which may include additional devises and systems such as; a steady DC current and or alternating current, circuit, a display, a direct current power conditioner, current power output interface, power converter, virtual load, feedback circuit, magnetic field sensor, magnetic field sensor interface, voltmeter, voltmeter interface, an ammeter, an ammeter interface, a measuring devise, a measuring devise interface, an inverter, an inverter interface, a system controller, a system controller interface, power control means, power system interface, a target value setting capable device, a target value capable setting device interface, an input device, a target value interface, a transformer(s), a central processing unit "CPU", a processor, estimating means, computing means, network interface, load, search control means, relative relational expression equations, abnormal measurement memory, time series data memory, measurement data memory, accuracy data memory, operating estimations data, target value memory, a rated value database, a bidirectional DRAM database, a bidirectional SRAM database and or cache, a bidirectional ROM database, code or script.

The control section serves to control the overall control and operation of various components of the management system, circuits, modules, and the memory section serves to store information. The control section is configured to include a measurement data acquiring section (measurement data acquiring means), the amount of current/voltage (current/voltage acquiring means), a computing section (computing means), a target value setting section (target value setting means), a search control section (search starting means), power system section (power system controlling means), and in estimating section (estimating means). Further the memory section is configured to include a target value memory section, a memory section, and a relative relational expression equation section, a rated value database, including a bidirectional DRAM and or ROM database, and may include bidirectional SRAM database and or cache.

The bidirectional memory section serves to store, as electrical charge state, information as an electrical charge state, and information data, and mathematical data, obtained from, and while, the management system is operating and is then stored into memory utilizing a positive polarity, negative polarity, or no charge present bidirectionally enabled memory storage system.

The search control section, can compute measurement characteristics if measurements have been measured and stored even once and can compare characteristics with the target value setting section, which may also incorporate a learning effect, or artificial intelligence, interpretations can be interpreted by the central processing unit CPU, which can send instructions to the system controller, which can then send command signals to active switching and control systems, and components, to control predetermined, or instructed operational target values and functions.

The measurement data acquiring section, also serves to determine faults, by acquiring and comparing measured values from the measurement data memory storage section, and by interpreting abnormal operating system measurements. Abnormal measurements, are stored in the memory storage section, and additionally may be sent to the display, to indicate to users of the management system, abnormal measurements, or sent to the control section and the target value memory section, to perform tasks such as bypassing abnormally operating circuits, modules, systems, or component's, storage devices, feedback circuits, and or by compartmentalizing systems containing faults and maintaining predetermined target operating conditions, operating characteristics, and operation, and functions.

It should be noted that measurements may be computed by performing measurements by measuring each instrument once, or more than once, at a time of introduction of the management system, or may be computed as a search performed manually by the user's operating the management system, or maybe performed automatically, e.g. regularly. In particular measurements may be performed at predetermined intervals, or from time to time. The exacting control of the electromagnetic, electrostatic and electrochemical fields, power circuit states, conversion and or feedback systems and circuits under the devices management is a main primary concern of the disclosed invention, switching consumption is of concern in order to not reach an inefficient level, though a certain trade-off of energy consumption occurs.

Storage Devices

This system and method takes advantage of the natural electrical tendencies and physical interactions of electricity and or capacitors (electrostatic storage devices) and this type of electrical component, therefor a broad range of possible alternatives may be used to accomplish this system and methods novelty and usefulness, referenced as possible embodiments of the disclosed invention of the following non-limiting examples include; accumulators, electrostatic accumulators and or storage devices, capacitors, batteries and or electrochemical storage devices, including hybrids, magnetic field storage devices such as inductors, coils, or electrical storage devices may be substituted or used in conjunction with the disclosed invention and are hereby claimed in this disclosure.

The bidirectional circuit may use a plurality and multitude of different storage devices and or switches (transistors) for storing a charge (information) and or for switching the stored charge as described in this system and method referenced as possible embodiments of the disclosed invention of the following; capacitors, accumulators and may comprise different storage device arrangements, the circuit operating best with non-polarized capacitors/condensers for safety and reducing resistance though operation can still be accomplished with polarized capacitors/electrostatic storage devices, and may include capacitor balancing or balancing IC's, non-limiting examples of possible embodiments include; multilayer or multi cell configuration, multiple storage devices and or pluralities, magnetic field storage device, condensers, and or capacitors non limiting examples include ceramic, paraelectric, ferroelectric, mixed oxides, class 1, class 2, dual layer, multilayer, power film and or foil, nano-structured crystalline thin film, composite ink/paste, crosslinked gel electrolytes, electrolytes, metalized, plastic, polypropylene, polyester, polyphenylene sulfide, polyethylene naphthalate, polytetrafluoroethylene, RFI, EMI, electrolytic, aluminum, tantalum, niobium, non-solid, solid manganese oxide, solid conductive polymer, bipolar, axial, SMD, chip, radial, hybrid capacitors, double layer, pseudocapacitors, hybrid capacitors, electrochemical capacitors, double layer lithium-ion, class X, class Y, carbon capacitors, graphene capacitors, graphite capacitors, integrated capacitors, nano-scale capacitors, glass capacitors, printed circuit board capacitor(s), conductive wire capacitor, mica capacitors, air gap capacitors, variable capacitors, trimmer capacitor, single substrate capacitors, multi substrate capacitors, super dielectric material capacitor, high energy density capacitors.

DRAM Types and Characteristics

Though disclosure embodiment utilize similar designs of a DRAM dynamic random access memory cell, many different variations and embodiments are possible based on current manufacturing and operational methodologies and as such variations or combinations of different construction styles and designs are possible and are reference herein with a few non limiting examples including; SDRAM, DDRAM, DDR2 RAM, RDRAM, FPM DRAM, EDO DRAM, BEDO DRAM, AMBUS RDRAM Hidden refresh DRAM, Page mode DRAM, Direct Rambus DRAM (DRDRAM), Reduced Latency DRAM (RLDRAM), Video DRAM (VRAM), Window DRAM (WRAM, Multibank DRAM (MDRAM), Synchronous graphics RAM (SGRAM)[, Graphics double data rate SDRAM (GDDR SDRAM), Pseudostatic RAM (PSRAM, Resistive RAM, 1T DRAM a "capacitorless" bit cell design, two-transistor one capacitor DRAM, three-transistor one-capacitor DRAM, four-transistor one capacitor DRAM. Including different package design including Dual-in-line, DIL package, SMT surface mount. Asynchronous DRAM, synchronous DRAM, RAS only Refresh ROR, CAS before RAS refresh, and may be an integrated circuit, independent memory module, constructed on a single substrate or multiple substrates. May utilize current operational techniques including high speed techniques wherein utilizing both the leading and falling edges for READ and WRITE operations. And additionally, have different module formats, chip types, clock speeds, cycles per clock, bus speeds, bus widths, and transfer rates.

Switching Devices

Many types of transistors and or switches may be utilized in the disclosed system and method a few notable non-limiting examples and are referenced herein include; CMOS, n-type metal oxide semiconductor (NMOS) transistor, p-type metal oxide semiconductor (PMOS) transistor, PFET transistor, NFET transistor, IGBT insulated gate bipolar junction transistor, NPN transistors, PNP transistors, FET transistors "field effect transistor", JFET transistors "junction field effect transistor", N Channel JFET transistors, P Channel JFET transistors, MOSFET, N channel MOSFET, P Channel MOSFET, silicon on insulator (SOI) transistors, Function based transistors, small signal transistors, small switching transistors.

The present invention is not limited to the description of the embodiments provided but may be altered by skilled person within the scope of the claims. An embodiment based on the proper combination of technical means disclose in different embodiments is encompassed in the technical scope of the present invention.

Different embodiments, as needed or applicable, may be constructed, operated, implemented, by using a variety of different processing systems and or devices. For instance, FIGS. 1-18 and the explanation thereof describes exemplary embodiments of the device, though these exemplary descriptions are provided merely for useful references for discussing different aspects of the disclosure. The description of the device's architecture has been simplified for the purposes of this disclosure, for explanation and discussion, and is one of many possible different types of architectures that may be appropriate in accordance with this disclosure. Those skilled in the art may realize that logic blocks and or boundaries of said logic blocks are illustrative and that alternative embodiments may combine, or use comparably similar, logic blocks or circuit components or elements, and or implement an alternative decomposition of the device's functionalities upon various logic blocks, components and or circuit elements. Thus, it is to be made clear that depictions and architectures herein are merely exemplary, and that the fact remains many alternate architectures may be implemented which in turn will achieve the same or comparably similar functionality.

The blocks or, in particular, the control section of each of the logic circuits and or the management system may be achieved through hardware logic or through software by using a CPU as described.

That is each management system and circuit, may include one or more of the following blocks and the addition or omission of one or more block may not affect the operation and effective use of the system and therefore are contained as possible individual embodiments, a CPU central processing unit, which executes instructions from a program for achieving the corresponding function; a ROM read-only memory (bidirectional or not), in which the program is stored; a bidirectional random access memory (improved DRAM memory cell), to which a program is loaded; a memory device recording medium such as memory, which the program various types of data are stored; and the like.

Moreover, the operation of the present invention can be attained by mounting, to each of the circuits or modules or device, a recording medium computer readably containing a program code to execute form program, intermediate code program, source program of software for achieving the before mentioned function, in order for the computer CPU or MPU memory processing unit to retrieve and execute the bidirectional charging operation, that may originate from program code, that may be recorded in the recording medium, through a non-limiting example of a system controller.

Examples of the recording medium encompass: tapes, such as magnetic tapes and cassette tapes; discs include magnetic disk, such as floppy disks, and hard disks, and optional desks, such as a CD-ROM's, MO's, MDs, BBs, DVDs, and CD-Rs; cards, such as icy cards including memory cards and optical cards; and semiconductor memories, such as masks ROM's, EEPROM's, EEPROM's, and flash ROM's, DRAM, SRAM, transistors as memory.

Further the device can be made connectable to a communications network, so a program code can be supplied via the communications network. Examples of the communications network can include, but are not limited particularly to, the Internet, and intranet, and extranet, a LAN, ISDN, a VAN, a CATV communication network is not particularly limited. For example it is possible to use, as a transmission medium, a cable such as a IEEE1394, a USB, a power line, a cable TV line, a telephone line, an ADSL line, etc. Alternatively, it is possible to use, as a transmission medium, a wireless system such as infrared rays as inIrDA and a remote controller, Bluetooth, 802.11 wireless, HDR, cellular phone network, satellite line, a terrestrial digital network, etc. It should be noted that receiving the program code can be achieved in the form of a computer data signal realized by electronic transmission of the program code and embedded in a carrier wave.

With an abstract, but remaining in a definite sense, various arrangements of components achieving the same functionality are effectively "associated in such a manner to each other achieve the desired functionality". Thus, any two components designed and or combine to achieve some particular function may be seen as "achieving the desired functionality by being associated with each other irrespective of architectures or intermediate components". Additionally, any two associated components can be viewed as being "operationally connected" or "operationally coupled to each other for the purpose of achieving the desired functionality".

Further, the present invention can be expressed as follows: a circuit according to the present invention is for improving the operational capabilities of an electrical processing device, a managing system for managing the operational voltages and current of the devise utilizing a novel electronic circuit and method allowing bidirectionally enabled memory storage for improved processing and information storage, the managing system being configured to include: A control means to control the overall control and operation of various components of the system, a circuit, a steady electrical current and or energy source that may or may not be intermittent, switching means for switching potentials biases, charge orientations of memory cells and or electrical storage devices such as capacitors, a memory storage means to store information into memory bidirectionally definable in three unique states; current/voltage acquiring means for acquiring an electric current value and/or voltage value, a computing section computing means to compute information and instructions, a target value setting means to set target values, search starting means to control searching, power system controlling means to control power system functions, estimating means to preform estimations, searching means for searching memory deriving means for deriving relational expression equations.

Further, the method according to the present invention for managing the operation of a bidirectional memory system is a control method for the management of, and for controlling the operational voltages and current from and into a circuit and or electrical storage devices and or bidirectional memory system(s) from an electric current(s), utilizing an electronic circuit(s) to control the operation of electrical devices and or capacitors and or bidirectional memory cells, their charge state and polarization and input and output characteristics, their orientations in the circuit(s) and combinational arrangement, their charging characteristics, their discharging characteristics, information characteristics, bidirectional memory cell interpretation, bidirectional memory cell output information designation, processor operation, and the device feedback system(s) and circuit(s), the method including, a bidirectional memory cell address designation step, a step of assigning a numerical representation to the positive and negative polarity charge states as well as the uncharged state of a bidirectional memory cell, a step of designing the READ logic circuitry of a bidirectional memory cell to directly correlate to the numerical representation assigned to a bidirectional memory cell, a step of incorporating the designed READ logic circuitry into the construct of a typical processor and or computer, or conversely and or additionally a step of incorporating a definable translation circuit into the construct of a typical processor and or computer, a step of defining information to be recorded into memory, a step of selecting address designation(s) for bidirectional memory WRITING, a step of WRITING information into memory bidirectionally into selected addresses, a step of regularly REFRESHING the bidirectional memory cell(s), or alternatively/subsequently a step of paging bidirectional memory cells from selected addresses, a step of READING bidirectional memory with polarization differentiator Logic circuit(s), a step of determining charge state and polarization, a step of influencing or not the state of information READ from memory, a step of translating retrieved information as the assigned numerical representation of positive or negative polarity or uncharged state of a bidirectional memory cell, a step of depositing retrieved information into a buffer and or register either being influenced or not, a step of processing retrieved information, a step of repeating the described operation.

The foregoing was intended as a broad summary only and only of some of the aspects of the invention. It was not intended to define the limits or requirements of the invention. Other aspects of the invention will be appreciated to one skilled in the art by reference to the detailed description of the preferred embodiment and to the claims. It is intended that all such additional systems, methods, aspects, and advantages be included with this description, and within the scope of the present disclosure, and be protected by the accompanying claims.

Additionally, in one embodiment the elements to illustrate the system including circuitry is located on a single integrated circuit within a device. Whereas an alternate embodiment the system may be comprised of any number of separate integrated circuits and or separate devices interconnected to each other. An example being the bidirectional memory located on the same integrated circuit and or on a separate integrated circuit that may be located on any subsystem or device and or slave unit that is discreetly separate from other elements of the disclosed system. Additionally, circuits and or modules may be located on a separate device and/or integrated circuit.

Also, the system described herein and or portions thereof may be logical representations converted into physical systems and/or circuits. The functions of a single operation may be separated into multiple operations, or vice versa where the functions of multiple operations may be combined into a single operation. Additional embodiments may include multiple demonstrations of specific operations where the order of specific disclosed operations may have been altered. The described advantages and benefits to the state-of-the-art described herein with regard to specific operations or embodiments are not intended to be considered critical, mandatory, or essential features or elements of any and/or all of the claims.

The terms used in this disclosure are not for limiting the inventive concept but for explaining the embodiments. The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components. The reference numerals presented according to a sequence of explanations are not limited to the sequence.

Further the terms "top" "bottom" "front" "back" "over" "under" "upper" "lower" "trigger point" and the like in this disclosure including the description and/or the claims, if any, are used as descriptive phrases and are not necessarily for describing permanent relative positions. It is clear and understood that terms used are interchangeable for appropriate circumstances in that the embodiments of the disclosure described herein are for the example of, capable of operation in orientations other than those described or otherwise illustrated herein.

In addition, some embodiments of the present disclosure may include patents or public disclosures already issued relating to this art, when used in conjunction with this system or method these prior schemes may be able to utilize substantial amounts of the disclosure for their advantage. By using the described system and method many of these schemes and inventions may be able to operate in a more effective commercially viable way, and when referring to these said inventions or schemes when combined with this disclosed system or method these devices should be considered new devices or improvements thereof and confer the protection of this disclosure, or patent, this does not limit the scope of the present disclosure instead giving reference to where some embodiments of this discovery may fit into the art.

The invention claimed is:

1. A tristate bidirectional memory apparatus comprising a plurality of tristate bidirectional memory cells for storing information bidirectionally during write operations, and for reading the information from the tristate bidirectional memory cells during read operations, the apparatus comprising:
   a device selected from a group consisting of a first device, a second device, and a third device;
   wherein the first device comprises:
      in each tristate bidirectional memory cell:
         at least one first transistor, each first transistor having a gate electrode operable to receive a signal, and two terminals whose conduction path is controlled by the gate electrode; and
         an electrostatic storage device or capacitor comprised of two electrodes, one of each first transistor's terminals being connected to one of said electrodes of said electrostatic storage device or capacitor, the other electrode of said electrostatic storage device or capacitor being connected to one of two first bit lines of the tristate bidirectional memory cell, each first transistor's gate electrode being connected to a first word line, the other first bit line connected to the other terminal of each first transistor; and
      a first circuit for writing the information to the plurality of tristate bidirectional memory cells bidirectionally by applying a specific positive or negative first signal to said first word line of each tristate bidirectional memory cell, and a specific interchangeable voltage differential between said two first bit lines of each tristate bidirectional memory cell, the first circuit configured to:
         charge each tristate bidirectional memory cell through each first transistor in a first specific bias and polarity, to cause each tristate bidirectional memory cell to assume a first information-representing state, when charged with positive polarity or forward bias, and
         maintain no charge on each tristate bidirectional memory cell to cause each tristate bidirectional memory cell to assume a second information-representing state, and
         cause, when each tristate bidirectional memory cell is charged with negative polarity or inverse bias, each tristate bidirectional memory cell to assume a third information-representing state;
   the second device comprises:
      in each tristate bidirectional memory cell, a configuration of second transistors able to store the information using one of three states: a first current flow state of forward bias or positive polarity, a second current flow state of no bias or neutral polarity, a third current flow state of reverse bias or negative polarity;
      a second bit line and a bit line driver;
      a second word line and a word line driver;
      an encoding line and an encoding line driver;
      a second circuit for writing the information to the plurality of tristate bidirectional memory cells bidirectionally, by applying a specific second signal to said encoding line to encode one or more of the second transistors of each tristate bidirectional memory cell, the second circuit configured to:
         encode one or more of the second transistors in a second specific bias and polarity by allowing a current signal to cause each tristate bidirectional memory cell to assume the first information-representing state, with positive polarity or forward bias, and
         maintain no charge on each tristate bidirectional memory cell to cause each tristate bidirectional memory cell to assume the second information-representing state, and
         charge one or more of the second transistors by reversing said current signal to cause each tristate bidirectional memory cell to assume the third information-representing state, with negative polarity or reverse bias;
      a circuit for reading and interpreting charge state and polarity of the plurality of tristate bidirectional memory cells by utilizing at least one of a voltage comparison, a resistance comparison, a polarity comparison, and a logic circuit; and
      a circuit for reading the information stored on the plurality of tristate bidirectional memory cells by applying a read signal to said second word line and by interpreting a voltage state or a voltage state change on said second bit line;
   and the third device comprises:
      an electromagnetic storage device or medium, comprised of electromagnetic material forming the plurality of tristate bidirectional memory cells;
      an information writing and reading circuit connected to said electromagnetic storage device or medium;
      a third circuit for writing the information to said electromagnetic storage device or medium bidirectionally, by applying a specific positive or negative third signal, relative to a reference voltage, to said electromagnetic storage device or medium, by applying another specific interchangeable voltage differential between an upper surface and a lower surface of the electromagnetic material, the third circuit configured to:
         charge each tristate bidirectional memory cell through said electromagnetic material in a third specific bias and polarity, by allowing another current signal to cause each tristate bidirectional memory cell to assume the first information-representing state, when charged with positive polarity or forward bias, and maintain no charge on each tristate bidirectional memory cell to cause each tristate bidirectional memory cell to assume the second information-representing state, and reverse said other current signal to allow the other current signal to charge each tristate bidirectional memory cell through said electromagnetic material in an alternate bias and polarity, to cause each tristate bidirectional memory cell to assume the third-information representing state, when charged with negative polarity or reverse bias;

another circuit, for reading the information stored on the plurality of tristate bidirectional memory cells by measuring electrical resistance or electrical current; and a further circuit, for interpreting charge state and polarity of said tristate bidirectional memory cell by utilizing at least one of a further voltage comparison, a further resistance comparison, a further polarity comparison, and a further logic circuit;

the apparatus further comprising a definable translation circuit connected to one or more sense amplifiers to receive a negative output signal from each tristate bidirectional memory cell, wherein the definable translation circuit is configured to modify or control the negative output signal of each tristate bidirectional memory cell only when the corresponding tristate bidirectional memory cell provides the negative output signal to the definable translation circuit, the definable translation circuit configured to translate the negative output signal into a predetermined signal comprising one or more binary bits.

2. The apparatus of claim 1 wherein the first device is such that the specific interchangeable voltage differential between the two first bit lines is ineffective to change the information, which is represented by a charge state on each electrostatic storage device or capacitor, in an absence of said specific positive or negative first signal applied to said first word line, which is required to render each first transistor conductive; and wherein the first device further comprises:

a further circuit for reading information stored on each bidirectional tristate memory cell by applying a fourth signal to said first word line, discharging the electrostatic storage device or capacitor by said first transistor(s) to said two first bit lines; and another circuit for interpreting charge state and polarity of the plurality of tristate bidirectional memory cells utilizing one or both of said first bit lines, through at least one of a third voltage comparison, a third polarity comparison, and third logic circuit(s).

3. The tristate bidirectional memory apparatus of claim 1 wherein the device is selected as the second device.

4. The tristate bidirectional memory apparatus of claim 3 wherein a voltage signal from said second bit line and said second word line is ineffective to change the information, which is represented by a charge state on the corresponding tristate bidirectional memory cell, in an absence of said specific second signal applied to said encoding line, which is required to render the corresponding second or transistors conductive, and wherein the apparatus further comprises:

a comparison circuit(s) configured to interpret charge state and polarity of each tristate bidirectional memory cell utilizing said second bit line, through at least one of a third voltage comparison, a current comparison, and a third polarity comparison; and circuitry for said logic circuit to interpret the charge state on each tristate bidirectional memory cell for making available for processing a single bit of the information or multiple bits of the information.

5. The apparatus of claim 3 wherein each tristate bidirectional memory cell is ROM (read only memory), and is a rewritable ROM or non-rewritable ROM selected from ROM types including Mask ROM, Programmable ROM (PROM), Erasable Programmable ROM (EPROM), Electrically Erasable Programmable ROM (EEPROM), Electrically Alterable Programmable ROM (EAPROM), and Flash Electrically Erasable Programmable ROM (FEEPROM).

6. The apparatus of claim 3 wherein the tristate bidirectional memory storage cells are operated as a base 3 mathematical operation framework, and wherein information processing and operation is a variant of one or more ternary system(s), and ternary operating language(s).

7. The apparatus of claim 1 wherein the device is selected as the first device, the first device further comprising another word line driver configured to activate said first word line by decoding an address.

8. The apparatus of claim 1 wherein the device is selected as the first device, the first device further comprising a driver for said first bit lines configured to activate one or more said first bit lines and assign one or more respective voltage states by decoding an address.

9. The apparatus of claim 1 wherein the device is selected as the first device, the first device comprising another circuit for controlling reading out of the information from the plurality of tristate bidirectional memory cells by receiving an address; decoding said address; and activating the first word line or another first word line by another word line driver based upon said decoded address, and activating two corresponding first bit lines by another bit line driver based upon the decoded address, which includes voltage assignment for each first bit line's specific voltage state, and where the apparatus is operable to read and decode the information from the plurality of tristate bidirectional memory cells; if the information is written in a forward bias the information is referred to as positive, or if the information is written with no charge the information is referred to as zero, or if the information is written in a reverse bias the information is referred to as negative.

10. The apparatus of claim 1 wherein the device is selected as the first device, and wherein said electrostatic storage device is at least one of another transistor exhibiting capacitance and a storage element exhibiting capacitance.

11. The apparatus of claim 1 wherein the device is selected as the first device, and wherein a singular tristate bidirectional memory cell, of the plurality of tristate bidirectional memory cells, that is written with some of the information, which is or has been written with at least one of a reverse bias current and negative polarity, is representative of a singular bit of information, or multiple bits of information, or a state of superposition.

12. The apparatus of claim 1 wherein the device is selected as the first device, and wherein each tristate bidirectional memory cells is at least one of being coupled and being interconnected, wherein the plurality of said tristate bidirectional memory cells are at least one of being constructed as a planar design, constructed in a 3-dimensional lattice structure, and a variant thereof.

13. The apparatus of claim 1 wherein the device is selected as the first device, and wherein the plurality of tristate bidirectional memory storage cells are operated as a base 3 mathematical operation framework, and wherein information processing and operation is a variant of one or more ternary system(s), and ternary operating language(s).

14. The apparatus of claim 1 wherein the device is selected as the first device, the first device comprising at least one of a plurality of interchangeable logic gates and output logic circuits, to allow operation and modification of an interpretation of a negative charge stored on each tristate bidirectional memory cell.

15. The apparatus of claim 1 wherein the device is selected as the first device, and wherein each of said tristate bidirectional memory cells includes exactly one first transistor and exactly one capacitor and each of said tristate bidirectional memory cells is connected to exactly one first word line and exactly two first bit lines in said tristate bidirectional memory cells.

16. The apparatus of claim 1 wherein the device is selected as the first device, and wherein each of said tristate bidirectional memory cells includes two first transistors and said capacitor and each of said tristate bidirectional memory cells is connected to exactly one word line and exactly two bit lines in said tristate bidirectional memory cells.

17. The apparatus of claim 1 wherein the device is selected as the first device, and wherein each of said tristate bidirectional memory cells includes four first transistors and said capacitor and each of said tristate bidirectional memory cells is connected to multiple first word lines and one or two first bit lines in said tristate bidirectional memory cells.

18. The apparatus of claim 1 wherein the device is selected as the first device, and wherein each of said tristate bidirectional memory cells is connected to two first bit lines and the plurality of tristate bidirectional memory cells is divided into columns, each column having an independent first bit line.

19. The apparatus of claim 1 wherein the device is selected as the first device, and wherein each of said tristate bidirectional memory cells is connected to two first bit lines and the plurality of tristate bidirectional memory cells is divided into columns, wherein two adjacent columns connect to a mutually shared first bit line.

20. The apparatus of claim 1 wherein the device is selected as the first device, and wherein a tristate bidirectional memory encoder, which receives a singular bit or multiple bits of the information during one of said said write operations, is coupled to one or multiple of the plurality of tristate bidirectional memory cells, and encodes said singular bit or multiple bits of the information in said one or multiple tristate bidirectional memory cells, where therefore said one or multiple tristate bidirectional memory cells are representative of and therefore contain the singular bit or the multiple bits of the information.

21. The apparatus of claim 1 wherein the device is selected as the first device, and wherein a tristate bidirectional memory decoder, which receives a singular bit or multiple bits of the information during one of said read operations from a one or multiple of the plurality of bidirectional memory cells, is coupled to at least one of the sense amplifiers and a singular or plurality of gates, and then decodes said singular bit or multiple bits of the information from said one or multiple tristate bidirectional memory cells, where therefore said one or multiple tristate bidirectional memory cells contain and communicate the singular bit or the multiple bits of the information.

22. The apparatus of claim 1 wherein the device is selected as the first device, and wherein each tristate bidirectional memory cell comprises at least one of a dynamic random-access memory, a quantum random-access memory, and a variant thereof.

23. The apparatus of claim 1 wherein the device is selected as the first device, and wherein each tristate bidirectional memory cell is operable to be encoded with the information with negative polarity or bias, such that the information is representative as both a 0 and 1 simultaneously, wherein an interpretation is that said information is at least one of being superimposed and being in a superposition state.

24. The apparatus of claim 1 wherein the device is selected as the first device, and wherein the definable translation circuit is operable to at least one of modify and control the negative output signal of at least one of the tristate bidirectional memory cells, a probability of said one superimposed tristate bidirectional memory cell being either a 1 or 0 state when being read.

25. The apparatus of claim 24 wherein the definable translation circuit is comprised of the one or more sense amplifiers and a comparator or plurality thereof, wherein at least one of a voltage reference and a threshold trigger is operable to be at least one of controlled and modified, and the definable translation circuit is operable to additionally contain a switch or switches that control or modify a voltage state or amplitude of a signal sent from a read logic circuit, where control and modification(s) reflect at least one of an instruction, a control, a command, and a natural progression of a probability of a singular or plurality or system, singularly or conjunctively, of tristate bidirectional memory cell(s) being in either a 1 or ON state or 0 or OFF state, received from one or multiple of the plurality of tristate bidirectional memory cells each being charged in a negative polarization or bias, and interpreted to be in a superposition state.

26. The apparatus of claim 1 wherein the device is selected as the first device, and wherein the apparatus is comprised of a singular constrained translation circuit or a plurality of constrained translation circuits, wherein the constrained translation circuit or plurality thereof contain logic gates operable to at least one of modify and control a state of at least one tristate bidirectional memory cell, being either a 1 or 0 state when being read.

27. The apparatus of claim 1 wherein the device is selected as the first device, the first device comprising at least one of a singular or plurality of interchangeable classical logic gates, a singular or plurality of interchangeable quantum logic gates, read circuits, further logic circuits, further definable translation circuits, constrained translation circuits, flip-flops, and operably similar components to allow at least one of operation, modification and interpretation of the information stored on one or more of the tristate bidirectional memory cells.

28. The apparatus of claim 1 wherein the device is selected as the first device, and wherein the information is suitable to be communicated by a modulator-demodulator, which is operable to utilize various schemes for at least one of frequency modulation, frequency demodulation, amplitude modulation, and amplitude demodulation, wherein the information is representative of tristate analog data associated with a singular bit or multiple bits of the information, received from or stored into one or more of the tristate bidirectional memory cells.

29. The tristate bidirectional memory apparatus of claim 1 wherein the device is selected as the third device.

30. The apparatus of claim 29 wherein each of said tristate bidirectional memory cells is comprised of an area of a magnetizable material, disk, or unit.

31. The apparatus of claim 29 comprising a further circuit, for controlling reading and writing of the information to and from said tristate bidirectional memory cells by receiving an address; decoding said address; and activating a track line by a track line decoder based upon said decoded address, said decoded address being of a specific one or more of the tristate bidirectional memory cells, and activating another track line by a track line encoder based upon a specific decoded address which includes a specific polarity assignment for each of the one or more tristate bidirectional memory cell's specific information-representing state, and where the information is suitable to be read and decoded from said one or more tristate bidirectional memory cells; if the information is written in a forward bias the information is referred to as positive polarity, or if the information is written with no charge the information is referred to as zero, or if the information is written in a reverse bias the information is referred to as negative polarity.

32. The apparatus of claim 29 wherein a tristate bidirectional memory encoder, which receives a singular bit or multiple bits of the information during one of said write operations is coupled to a singular or multiple of the tristate bidirectional memory cells, and encodes said singular bit or multiple bits of the information in said singular or multiple tristate bidirectional memory cells, where therefore the single, or multiple, of the tristate bidirectional memory cells are representative of and therefore contain the singular bit or the multiple bits of the information.

33. The apparatus of claim 29 wherein a tristate bidirectional memory decoder which receives a singular bit or multiple bits of the information during one of said read operations from a singular or multiple of the plurality of the bidirectional memory cells is coupled to at least one of a singular or plurality of the sense amplifiers and a singular or plurality of gates, and then decodes said singular bit or multiple bits of the information from said singular or multiple tristate bidirectional memory cells, where therefore said single or multiple tristate bidirectional memory cells contain and communicate the singular bit or the multiple bits of the information.

34. The apparatus of claim 29 wherein a singular of the tristate bidirectional memory cells that is written with some of the information, which is or has been written in at least one of a reverse bias and a negative polarity, is representative of a singular bit of the information, or multiple bits of the information, or is in a state of superposition.

35. The apparatus of claim 29 wherein the tristate bidirectional memory cells are operable to be encoded with the information in a negative polarity or bias, such that the information is representative as both a 0 and 1 simultaneously, wherein an interpretation by the tristate bidirectional memory apparatus is that said information is at least one of being superimposed and being in a superposition state.

36. The apparatus of claim 29 wherein the apparatus is comprised of the definable translation circuit or a plurality thereof, wherein the definable translation circuit or plurality thereof are configured to at least one of modify and control at least one of the negative output signal of a corresponding tristate bidirectional memory cell and a probability of a superimposed tristate bidirectional memory cell being either a 1 or 0 state when being read.

37. The apparatus of claim 36 wherein one of the definable translation circuits is comprised of the one or more sense amplifiers and a comparator or plurality thereof, wherein at least one of a voltage reference and a threshold trigger is operable to be at least one of being controlled and modified, and the definable translation circuit or plurality thereof is operable to additionally contain a switch or switches that control or modify a voltage state or amplitude of a signal sent from a read logic circuit, where control and modification(s) reflect at least one of an instruction, a control, a command, and a natural progression of a probability of a singular or plurality or system, singularly or conjunctively, of the tristate bidirectional memory cell(s) being in either a 1 or ON state or 0 or OFF state, received from one or more of the tristate bidirectional memory cells each being charged in a negative polarization or bias, and interpreted to be in a superposition state.

38. The apparatus of claim 29 wherein the apparatus is comprised of a singular or a plurality of constrained translation circuits, wherein the constrained translation circuit or plurality thereof contain logic gates operable to at least one of modify and control a state of one of the tristate bidirectional memory cells being either a 1 or 0 state when being read.

39. The apparatus of claim 29 comprising a singular or plurality of at least one of interchangeable classical logic gates, interchangeable quantum logic gates, read circuits, further logic circuits, further definable translation circuits, constrained translation circuits, flip-flops, and operably similar components to allow at least one of operation, modification, and interpretation of the information stored on one or more of the tristate bidirectional memory cells.

40. The apparatus of claim 29 wherein each tristate bidirectional memory cell is at least one of RAM, DRAM, ROM (read only memory), a rewritable ROM, non-rewritable ROM, Mask ROM, Programmable ROM (PROM), Erasable Programmable ROM (EPROM), Electrically Erasable Programmable ROM (EEPROM), Electrically Alterable Programmable ROM (EAPROM), and Flash Electrically Erasable Programmable ROM memory (FEEPROM).

41. The apparatus of claim 29 wherein the information is suitable to be communicated by a modulator-demodulator, which is operable to utilize various schemes for at least one of frequency modulation, frequency demodulation, amplitude modulation, and amplitude demodulation, wherein the information is representative of tristate analog data associated with a singular bit or multiple bits of the information, received from or stored into, one or more of the tristate bidirectional memory cells.

42. The apparatus of claim 29 wherein the tristate bidirectional memory storage cells are operated as a base 3 mathematical operation framework, and wherein information processing and operation is a variant of one or more ternary system(s), and ternary operating language(s).

43. The tristate bidirectional memory apparatus of claim 1 wherein the device is selected as the first device.

44. The apparatus of claim 43 wherein:
the specific interchangeable voltage differential between said two first bit lines is ineffective to change the information, which is represented by a charge state on said electrostatic storage device or capacitor, in an absence of said specific positive or negative first signal applied to said first word line required to render the corresponding at least one first transistor conductive;
the apparatus further comprising:
another circuit for reading the information stored on each tristate bidirectional memory cell by applying another signal to said first word line discharging said corresponding electrostatic storage device or capacitor via said first transistor(s) to said two first bit lines; and
third logic circuit(s) and circuitry for interpreting charge state and polarity of each tristate bidirectional memory cell utilizing one or both of said first bit lines, through at least one of a third voltage comparison and a third polarity comparison using said third logic circuit(s).

45. The apparatus of claim 43 further comprising another bit line driver configured to activate the first bit lines and assign voltage states to them by decoding an address.

46. The apparatus of claim 43 comprising another circuit, for controlling reading out of the information from said tristate bidirectional memory cells by receiving an address; decoding said address; and activating one of the first word lines by another word line driver based upon said decoded address, and activating two of the first bit lines by another bit line driver based upon a decoded address that includes voltage state assignment for each first bit line's specific voltage state, and where the information is suitable to be read and decoded from one or more of the tristate bidirectional memory cell; if the information is written in a forward bias the information is referred to as positive, or the information is written with no charge the information is referred to as zero, or the information is written in a reverse bias the information is referred to as negative.

47. The apparatus of claim 43 wherein the tristate bidirectional memory cells are operable to be at least one of being coupled and being interconnected, wherein said tristate bidirectional memory cells are operable to be at least one of being constructed as a planar design, being constructed in a 3-dimensional lattice structure, and being a variant thereof.

48. The apparatus of claim 43 comprising at least one of a plurality of interchangeable logic gates and a plurality of output logic circuits, to allow operation and modification of an interpretation of a negative charge stored on one or more of the tristate bidirectional memory cells.

49. The apparatus of claim 43 wherein each of said tristate bidirectional memory cells includes exactly one said first transistor and exactly one said capacitor and each of said tristate bidirectional memory cells is connected to only one first word line and two first bit lines.

50. The apparatus of claim 43 wherein each of said tristate bidirectional memory cells includes two first transistors and said capacitor and each of said tristate bidirectional memory cells is connected to exactly one first word line and two first bit lines.

51. The apparatus of claim 43 wherein each of said tristate bidirectional memory cells includes four transistors and said capacitor and each of said tristate bidirectional memory cells is connected to multiple first word lines and one or two first bit lines.

52. The apparatus of claim 43 wherein each of said tristate bidirectional memory cells is connected to two first bit lines and each column, into which the tristate bidirectional memory cells are divided, has independent first bit lines.

53. The apparatus of claim 43 wherein each of said tristate bidirectional memory cells is connected to two first bit lines and adjacent columns, into which the tristate bidirectional memory cells are divided, connect to a mutually shared first bit line.

54. The apparatus of claim 43 wherein each tristate bidirectional memory cell operable to be encoded with information in a negative polarity or bias, such that the information is representative as both a 0 and 1 simultaneously, wherein an interpretation by the tristate bidirectional memory apparatus is that each tristate bidirectional memory cell has information that is at least one of being superimposed and being in a superposition state.

55. The apparatus of claim 43 wherein the definable translation circuit or plurality thereof is configured to at least one of modify and control at least one of the negative output signal of one of the tristate bidirectional memory cells and a probability of a superimposed tristate bidirectional memory cell being either a 1 or 0 state when being read.

56. The apparatus system of claim 55 wherein each definable translation circuit is comprised of at least one of the sense amplifier or plurality thereof and a comparator or plurality thereof, wherein at least one of a voltage reference and a threshold trigger is operable to be at least one of being controlled and being modified, and each definable translation circuit is operable to additionally contain a switch or switches that can control or modify a voltage state or amplitude of a signal sent from a read logic circuit, where control and modification(s) reflect at least one of an instruction, a control, a command, and a natural progression of a probability of a singular or plurality or system, singularly or conjunctively, of the tristate bidirectional memory cell(s) being in either a 1 or ON state or 0 or OFF state, received from one or more of the tristate bidirectional memory cells being charged in a negative polarization or bias, and interpreted to be in a superposition state.

57. The apparatus of claim 43 comprising a singular or a plurality of at least one of interchangeable classical logic gates, interchangeable quantum logic gates, read circuits, further logic circuits, further definable translation circuits, constrained translation circuits, flip-flops, and operably similar components to allow at least one of operation, modification, and interpretation of the information stored on one or more of the tristate bidirectional memory cells.

58. The tristate bidirectional memory apparatus of claim 1 wherein the device is selected as the second device, wherein a voltage signal from said second bit line and said second word line is ineffective to change the information represented by a charge state on the corresponding tristate bidirectional memory cell in an absence of said specific second signal applied to said encoding line, which is required to render the corresponding second transistors conductive; wherein said logic circuit comprises circuitry for interpreting the charge state and polarity of the corresponding tristate bidirectional memory cell utilizing said second bit line, through at least one of a voltage comparison and a polarity comparison; and wherein said logic circuit comprises circuitry to interpret said charge state on the corresponding tristate bidirectional memory cell for making available for processing a single bit of the information or multiple bits of the information.

59. A system for storing data bidirectionally and in three different states, comprising;
(a) a plurality of tristate bidirectional memory cells ("cells"), each cell comprising one or more word lines and two bit lines;
(b) a first circuit connected to the cells and configured to control the cells;
(c) one or more components in each cell for storing information electrically therein, the one or more components comprising:
a first transistor and either an electrostatic storage device or a capacitor;
multiple second transistors; or
an electromagnetic storage device or medium;
(d) a second circuit configured to write information to each cell bidirectionally by applying a signal to the one or more word lines and applying a voltage differential between the two bit lines of so as to cause the cell to assume:
a first information-representing state when charged with a positive polarity,
a second information-representing state when maintaining no charge, and a third information-representing state when charged with a negative polarity;

(e) a third circuit connected to the cells and configured to read the information stored in the cells;

(f) a fourth circuit connected to the cells and configured to interpret a charge state and a polarity of each cell; and (g) a fifth circuit connected to the cells and configured to communicate the information stored in each cell.

60. The system of claim 59 wherein the one or more components comprise the electromagnetic storage device or medium.

61. The system of claim 60 wherein each of said cells is comprised of an area of a magnetizable material, disk, or unit.

62. The system of claim 30 comprising a sixth circuit for controlling reading and writing of the information to and from said cells by receiving an address; decoding said address; and activating a track line by a track line decoder based upon said decoded address, said decoded address being of a specific one or more of the cells, and activating another track line by a track line encoder based upon a specific decoded address which includes a specific polarity assignment for each of the one or more cell's specific information-representing state, and where the information is suitable to be read and decoded from said one or more of the cells; if the information is written in a forward bias the information is referred to as positive polarity, or if the information is written with no charge the information is referred to as zero, or the information is written in a reverse bias the information is referred to as negative polarity.

63. The system of claim 60 wherein a tristate bidirectional memory encoder, which receives a singular bit or multiple bits of the information during a write operation, is coupled to a singular or plurality of the cells, and encodes said singular bit or multiple bits of the information in said singular or plurality of the cells, where therefore the single, or plurality, of the cells each are representative of and contain the singular bit or the multiple bits of the information.

64. The system of claim 60 wherein a tristate bidirectional memory decoder which receives a singular bit or multiple bits of the information during a read operation from a singular or plurality of the cells is coupled to a singular or plurality of at least one of sense amplifiers and gates, and then decodes said singular bit or multiple bits of the information from said singular or plurality of the cells, where therefore said singular or plurality of the cells contain and communicate the singular bit or the multiple bits of the information.

65. The system of claim 60 wherein a singular one of the cells that is written with some of the information, which is or has been written in at least one of a reverse bias and a negative polarity, is representative of a singular bit of the information, or multiple bits of the information, or in a state of superposition.

66. The system of claim 60 wherein one or more of the cells is operable to be encoded with the information in a negative polarity or bias, such that the information is representative as both a 0 and 1 simultaneously, wherein the interpretation by the system is that said information is at least one of being superimposed and being in a superposition state.

67. The system of claim 60 further comprised of a singular or plurality of definable translation circuits, wherein the definable translation circuit or plurality thereof is configured to at least one of modify and control at least one of the information output from the cells and a probability of a superimposed cell being either a 1 or 0 state when being.

68. The system of claim 67 wherein one of the definable translation circuits is comprised of at least one of a sense amplifier or plurality thereof and a comparator or plurality thereof, wherein at least one of a voltage reference and a threshold trigger is operable to be at least one of being controlled and being modified, and is operable to additionally contain a switch or switches that control or modify a voltage state or amplitude of a signal sent from a read logic circuit, where control and modification(s) reflect at least one of an instruction, a control, a command, and a natural progression of a probability of a singular or plurality or system, singularly or conjunctively, of the cells being in either a 1 or ON state or 0 or OFF state, received from one or more of the cells, each being charged in a negative polarization or bias, and interpreted to be in a superposition state.

69. The system of claim 60 further comprised of a singular or plurality of constrained translation circuits, wherein the constrained translation circuit or plurality thereof contain logic gates operable to at least one of modify and control a state of one of the cells, being either a 1 or 0 state when being read.

70. The system of claim 60 comprising a singular or plurality of at least one of interchangeable classical logic gates, interchangeable quantum logic gates, read circuits, logic circuits, definable translation circuits, constrained translation circuits, flip-flops, and operably similar components to allow at least one of operation, modification, and the interpretation of the information stored on a one or more of the cells.

71. The system of claim 60 wherein each cell is ROM (read only memory), and is a rewritable ROM or non-rewritable ROM selected from ROM types including Mask ROM, Programmable ROM (PROM), Erasable Programmable ROM (EPROM), Electrically Erasable Programmable ROM (EEPROM), Electrically Alterable Programmable ROM (EAPROM), and Flash Electrically Erasable Programmable ROM (FEEPROM).

72. The system of claim 60 wherein the information is suitable to be communicated by a modulator-demodulator, which is operable to utilize various schemes for at least one of frequency modulation, frequency demodulation, amplitude modulation, and amplitude demodulation, wherein the information is representative of tristate analog data associated with a singular bit or multiple bits of the information, received from or stored into, one or more of the cells.

73. The system of claim 60 wherein the cells are operated as a base 3 mathematical operation framework, and wherein information processing and operation is a variant of one or more ternary system(s), and ternary operating language(s).

* * * * *

UNITED STATES PATENT AND TRADEMARK OFFICE
CERTIFICATE OF CORRECTION

PATENT NO. : 11,954,355 B2
APPLICATION NO. : 17/424737
DATED : April 9, 2024
INVENTOR(S) : Mitchell Miller It is certified that error appears in the above-identified patent and that said Letters Patent is hereby corrected as shown below:

In the Claims

Column 65, Claim 4, Line 7, cancelation of the word "or"
Column 67, Claim 21, Line 5, cancelation of the word "a"
Column 69, Claim 32, Line 4, "operations" should read "operations,"
Column 71, Claim 54, Line 2, between "cell" and "operable" insert --is--
Column 72, Claim 56, Line 1, cancelation of the word "system"
Column 72, Claim 56, Line 8, cancelation of the word "can"
Column 72, Claim 59, Line 4 of part (d), cancelation of the word "of"
Column 73, Claim 62, Line 1, "30" should read --60--
Column 74, Claim 70, Line 6, cancelation of the word "the"

Signed and Sealed this
Twenty-fifth Day of June, 2024

Katherine Kelly Vidal
*Director of the United States Patent and Trademark Office*